United States Patent
Bakr et al.

(10) Patent No.: US 11,001,939 B2
(45) Date of Patent: May 11, 2021

(54) METHODS OF PREPARATION OF ORGANOMETALLIC HALIDE STRUCTURES

(71) Applicant: King Abdullah University of Science and Technology, Thuwal (SA)

(72) Inventors: Osman Bakr, Thuwal (SA); Makhsud I. Saidaminov, Thuwal (SA); Ahmed L. Abdelhady, Thuwal (SA); Kristian Rahbek Knudsen, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/701,492

(22) Filed: Dec. 3, 2019

(65) Prior Publication Data

US 2020/0102666 A1 Apr. 2, 2020

Related U.S. Application Data

(63) Continuation of application No. 15/560,412, filed as application No. PCT/IB2016/051697 on Mar. 24, 2016, now Pat. No. 10,557,214.

(60) Provisional application No. 62/137,506, filed on Mar. 24, 2015.

(51) Int. Cl.
| | |
|---|---|
| *C30B 29/36* | (2006.01) |
| *C30B 29/12* | (2006.01) |
| *C30B 7/00* | (2006.01) |
| *C01G 1/06* | (2006.01) |
| *C30B 7/14* | (2006.01) |
| *C30B 31/12* | (2006.01) |
| *C30B 35/00* | (2006.01) |
| *H01L 51/42* | (2006.01) |

(52) U.S. Cl.
CPC ............. *C30B 29/12* (2013.01); *C01G 1/06* (2013.01); *C30B 7/00* (2013.01); *C30B 7/14* (2013.01); *C30B 31/12* (2013.01); *C30B 35/007* (2013.01); *C01P 2002/34* (2013.01); *H01L 51/42* (2013.01)

(58) Field of Classification Search
CPC .. C30B 7/00; C30B 7/005; C30B 7/14; C30B 29/36
See application file for complete search history.

(56) References Cited

U.S. PATENT DOCUMENTS

| | | |
|---|---|---|
| 4,247,358 A | 1/1981 | AuCoin et al. |
| 2017/0365416 A1 | 12/2017 | Padture |
| 2018/0010039 A1 | 1/2018 | Dong |

OTHER PUBLICATIONS

Notification of Transmittal of the International Search Report and the Written Opinion of the International Searching Authority, or the Declaration, dated Jul. 5, 2016 for PCT/IB2016/051697.
Baikie, et al., "A Combined Single Crystal Neutron/X-ray Diffraction and Solid-State Nuclear Magnetic Resonance Study of the Hybrid Perovskites CH3NH3PbX3(X=I, Br and Cl)", Journal of Materials Chemistry A, 3(17), 2015, 9298-9307.
Dang, "Bulk crystal growth of hybrid perovskite material CH3NH3PbI3", CrystEngComm, 17, 2015, 665-670.

(Continued)

*Primary Examiner* — Robert M Kunemund
(74) *Attorney, Agent, or Firm* — Billion & Armitage

(57) ABSTRACT

Embodiments of the present disclosure provide methods of growing organometallic halide structures such as single crystal organometallic halide perovskites, methods of use, devices incorporating organometallic halide structures, and the like.

20 Claims, 46 Drawing Sheets

(56) References Cited

OTHER PUBLICATIONS

De Wolf, et al., "Organometallic Halide Perovskites: Sharp Optical Absorption Edge and Its Relation to Photovoltaic Performance", J. Phys. Chem. Lett. 5, 2014, 1035-1039.

Docampo, et al., "Efficient organometal trihalide perovskite planar-heterojunction solar cells on flexible polymer substrates", Nature Communications, www.nature.com/naturecommunications, Nov. 12, 2013, 6 pages.

Dong, et al., "Electron-hole diffusion lengths >175 μm in solution-grown CH3NH3PbI3 single crystals", Mechanical & Materials Engineering Faculty Publications. 194. http://digitalcommons.unl.edu/mechengfacpub/194, Jan. 29, 2015, 10 pages.

Dou, et al., "Solution-processed hybrid perovskite photodetectors with high detectivity", Nature Communications, Nov. 20, 2014, 6 pages.

Guo, et al., "Photoelectric effects of ultraviolet fast response and high sensitivity in LiNbO3 single crystal", Journal of Applied Physics 106, Jul. 29, 2009, 4 pages.

Guo, et al., "Ultraviolet fast-response photoelectric effects in LiTaO3 single crystal", J. Phys. D: Appl. Phys. 43, 015402, Dec. 7, 2009, 4pp.

Huang, et al., "Electronic band structure, phonons, and exciton binding energies of halide perovskites CsSnCl3, CsSnBr3, and CsSnI3", Physical Review B 88, Oct. 17, 2013, 165203-1-165203-12.

Jaramillo-Quintero, et al., "Bright Visible-Infrared Light Emitting Diodes Based on Hybrid Halide Perovskite with Spiro-OMeTAD as a Hole-Injecting Layer", J. Phys. Chem. Lett. 6, 2015, 1883-1890.

Jin, et al., "Favorable ultraviolet photoelectric effects in TbMnO3/Nb—SrTiO3 heterostructures", Solid State Communications 199, Sep. 16, 2014, 39-42.

Kim, et al., "Lead Iodide Perovskite Sensitized All-Solid-State Submicron Thin Film Mesoscopic Solar Cell with Efficiency Exceeding 9%", Scientific Reports, Aug. 21, 2012, 7 pages.

Kojima, et al., "Organometal Halide Perovskites as Visible-Light Sensitizers for Photovoltaic Cells", J. Am. Chem. Soc., Apr. 14, 2009, 3 pages.

Luo, et al., "Suppression of photovoltaic effect by magnetic field in", Applied Physics Letters 103, 212401, 2013, 6 pages.

Noh, et al., "Chemical Management for Colorful, Efficient, and Stable Inorganic-Organic Hybrid Nanostructured Solar Cells", American Chemical Society, Nano Letters, 6 pages.

Park, "Organometal Perovskite Light Absorbers Toward a 20% Efficiency Low-Cost Solid-State Mesoscopic Solar Cell", J. Phys. Chem. Lett. 4,, Jul. 11, 2013, 2423-2429.

Saidaminov, et al., "High-quality bulk hybrid perovskite single crystals within minutes by inverse temperature crystallization", Nature Communications, Jul. 6, 2015, 6 pages.

Sheikh, et al., "Atmospheric effects on the photovoltaic performance of hybrid perovskite solar cells", Solar Energy Materials & Solar Cells137, Feb. 6, 2015, 6-14.

Wang,, "Facile Synthesis and High performance of a New Carbazole-Based Hole Transporting Material for Hybrid Perovskite Solar Cells", ACS Paragon Plus Environment, Jun. 26, 2015, 25 pages.

Wehrenfennig, et al., "Homogeneous Emission Line Broadening in the Organo Lead Halide Perovskite CH3NH3PbI3-xClx", J. Phys. Chem. Lett. 5, Mar. 24, 2014, 1300-1306.

Wu, et al., "Trap States in Lead Iodide Perovskites", J. Am. Chem. Soc. 137, Jan. 20, 2015, 2089-2096.

Xiao, et al., "Giant Switchable Photovoltaic Effect in Organometal Trihalide Perovskite Devices", 22 pages.

Xing, et al., "Long-range balanced electron- and hole-transport lengths in organic-inorganic CH3NH3PbI3", Science, 342(6156),, 2013, 344-347.

Xing, et al., "Low-temperature solution-processed wavelength-tunable perovskites for lasing", Nature Materials, 2014.

Xu, et al., "Molecular Motions and Phase Transitions in Solid CH3NH3PbX3 (X=Cl, Br, I) as Studied by NMR and NQR", Z. Naturforsch. 46a, 1991, 240-246.

Xue, et al., "TiO2 based metal-semiconductor-metal ultraviolet photodetectors", Applied Physics Letters 90, May 18, 2007, 201118-1-201118-3.

You, et al., "Low-Temperature Solution-Processed Perovskite Solar Cells with High Efficiency and Flexibility", ACS Nano, Jan. 2014, 8 pages.

Zhi-Kuang, et al., "Bright light-emitting diodes based on organmetal halide perovskite", Nature Nanotechnology, vol. 9, No. 9, (Aug. 3, 2014), pp. 687-692.

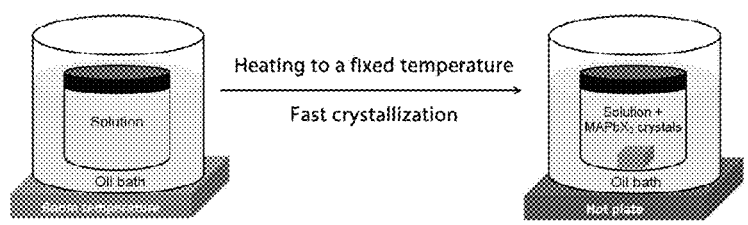
Fig. 1.1A
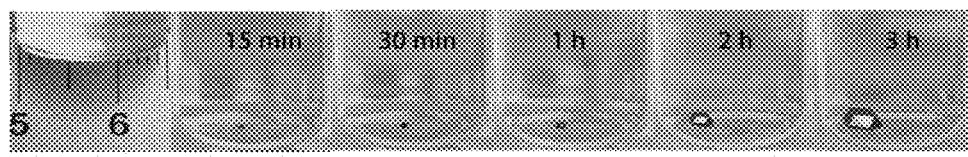
Fig. 1.1B
Fig. 1.1C

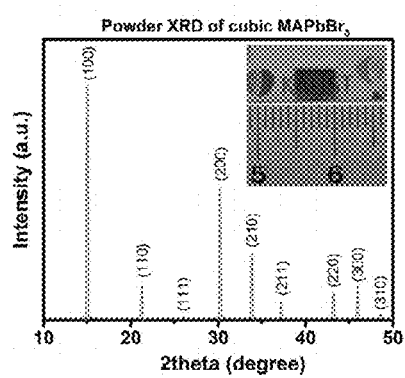 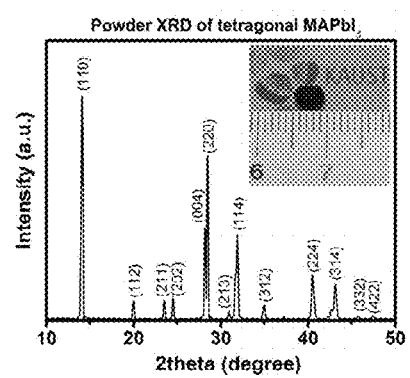
Fig. 1.1D  Fig. 1.1E

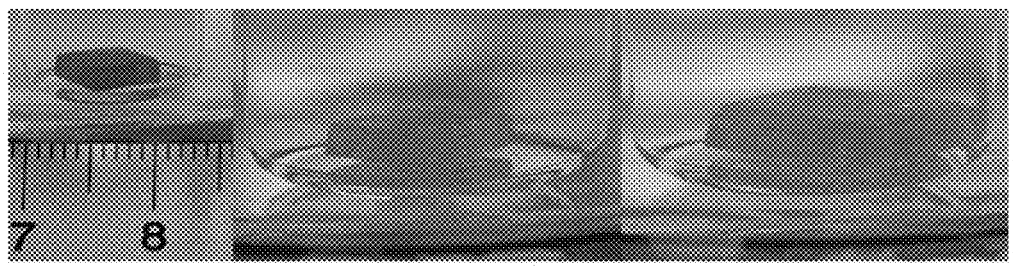
Fig. 1.2A
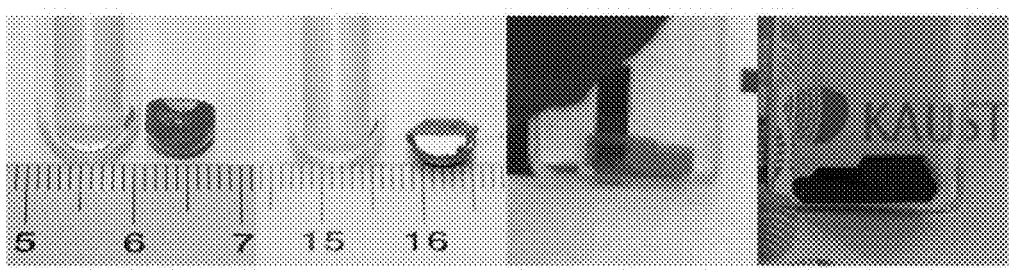
Fig. 1.2B

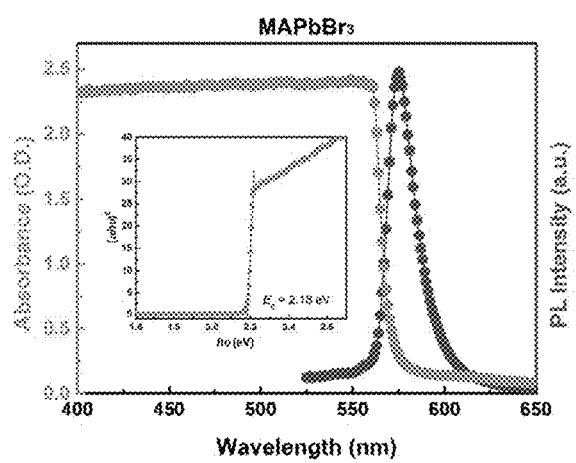
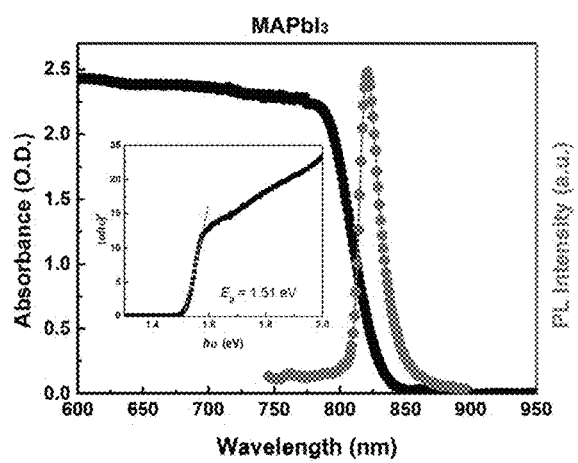
Fig. 1.3A					Fig. 1.3B

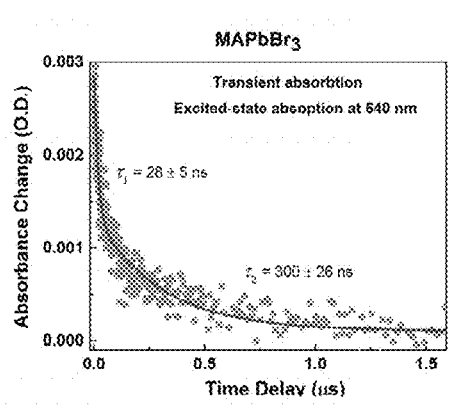
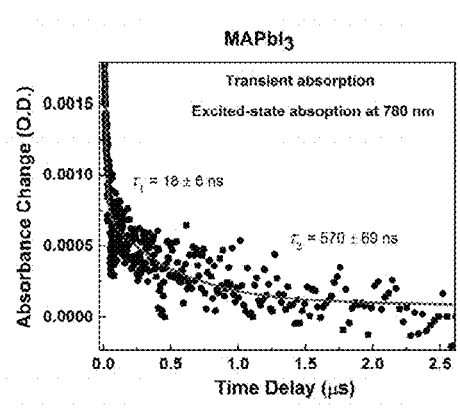
Fig. 1.4A
Fig. 1.4B
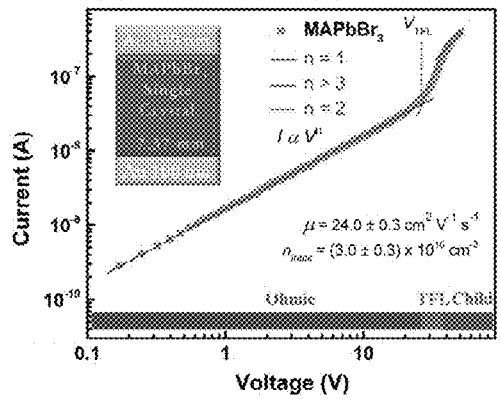
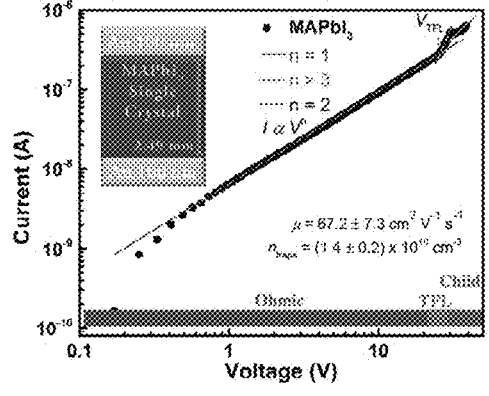
Fig. 1.4C
Fig. 1.4D

Fig. 1.5

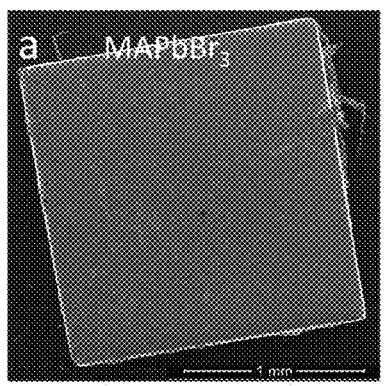
Fig. 1.6A
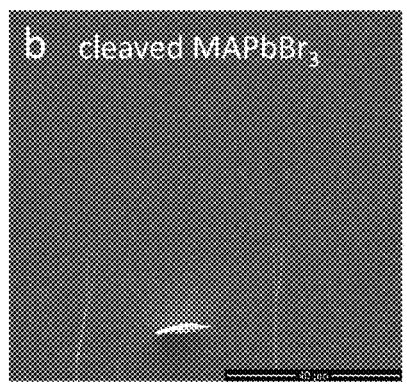
Fig. 1.6B
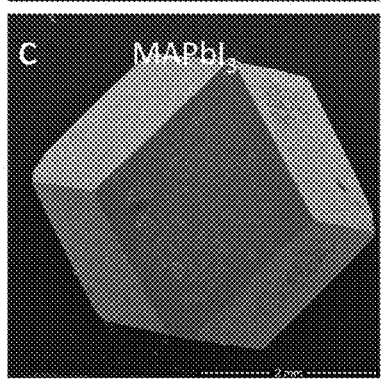
Fig. 1.6C
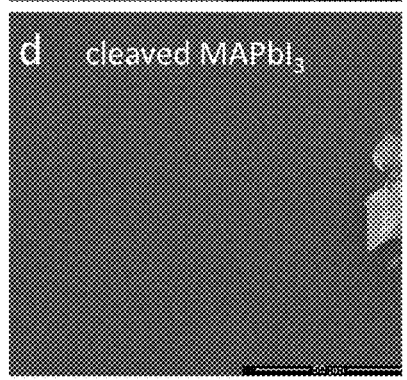
Fig. 1.6D

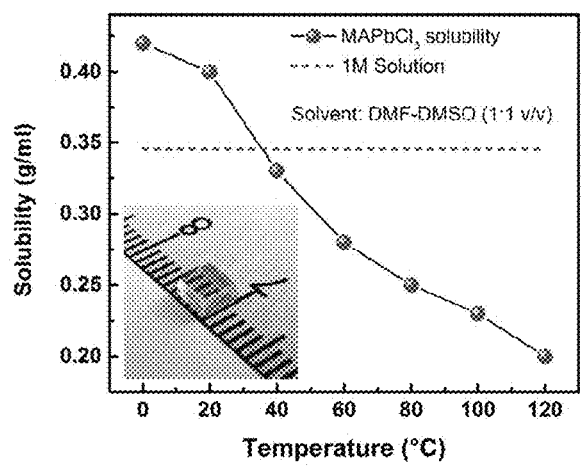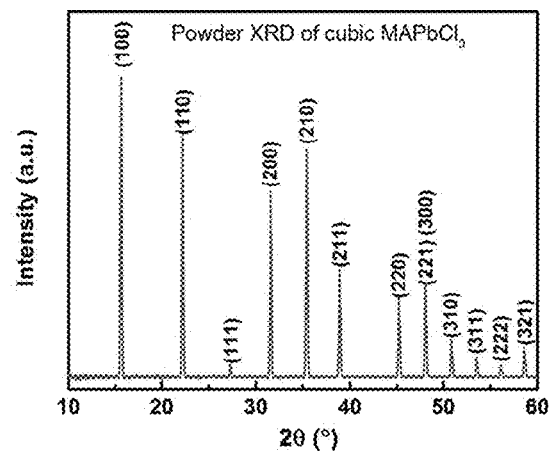
Fig. 2.1A    Fig. 2.1B

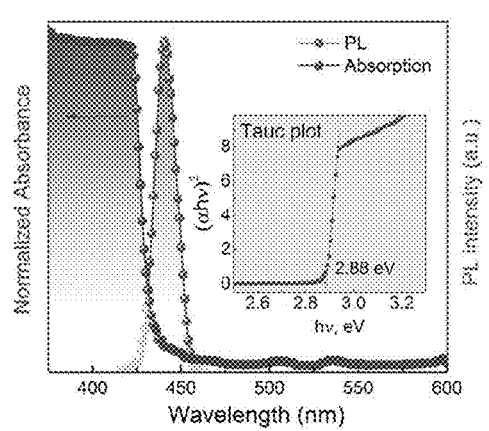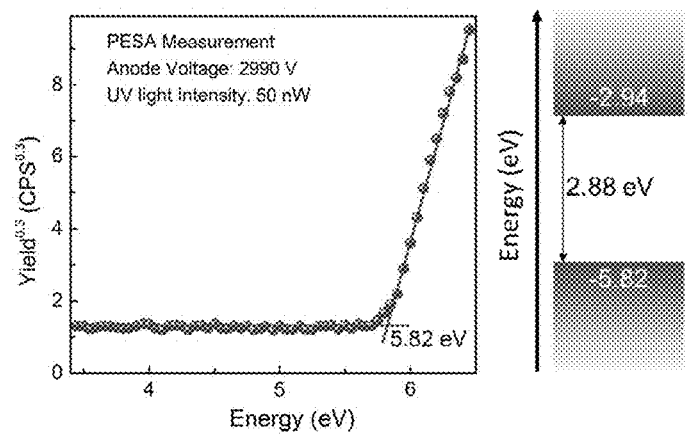
Fig. 2.2A         Fig. 2.2B         Fig. 2.2C

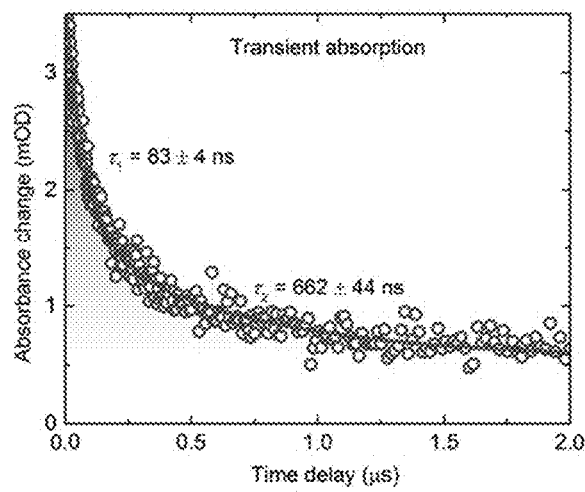 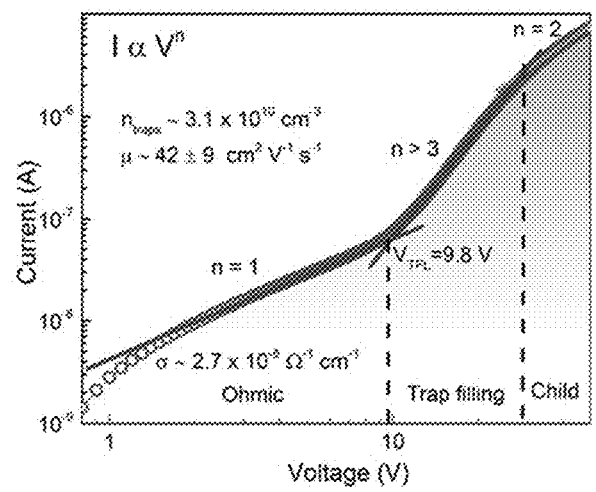
Fig. 2.3A  Fig. 2.3B

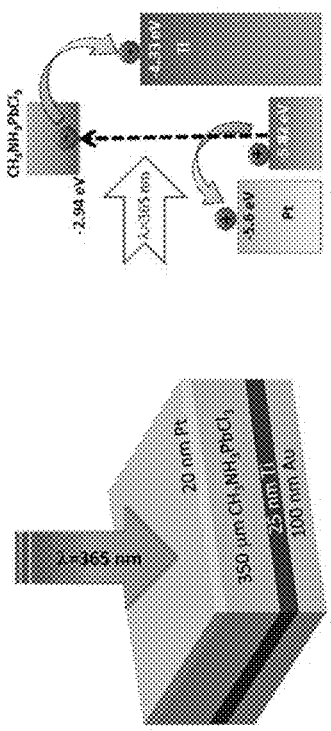
Fig. 2.4A
Fig. 2.4B
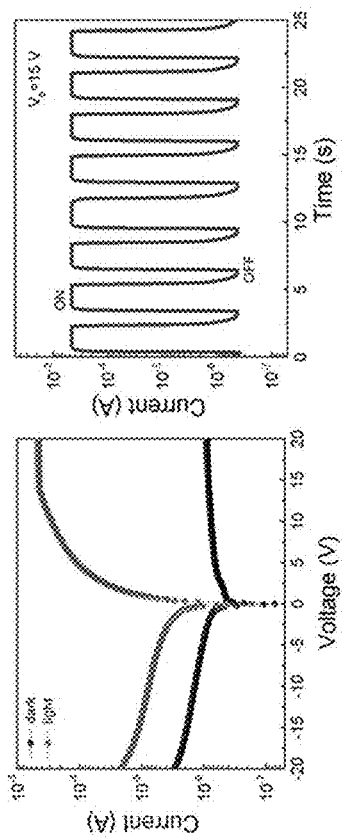
Fig. 2.4C
Fig. 2.4D

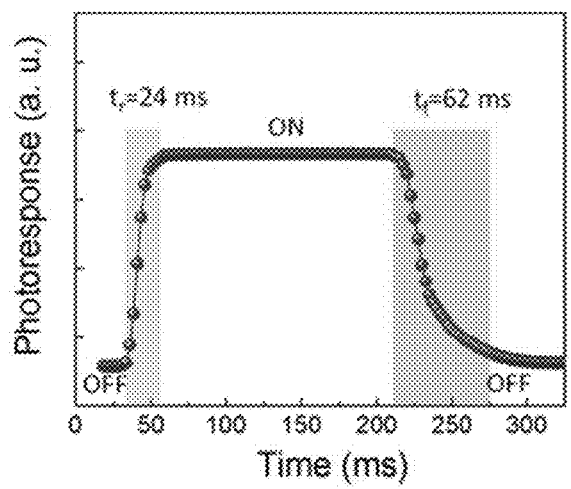 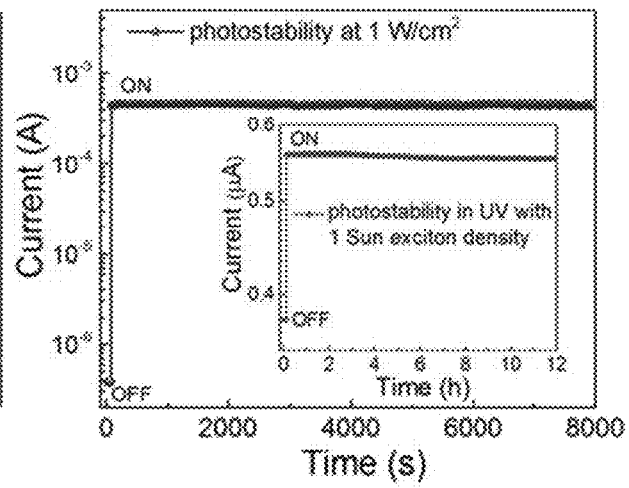
Fig. 2.5A                Fig. 2.5B

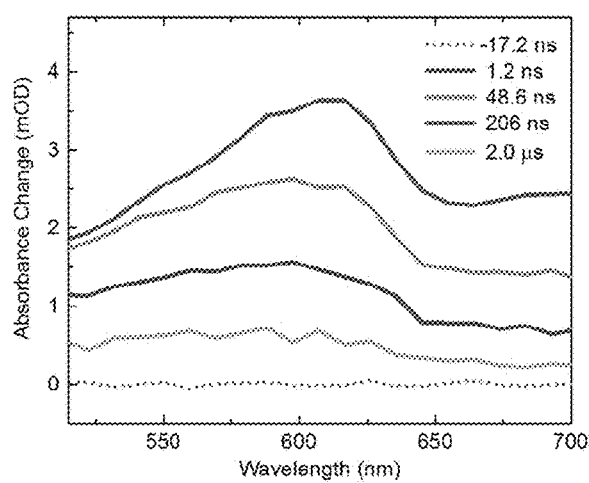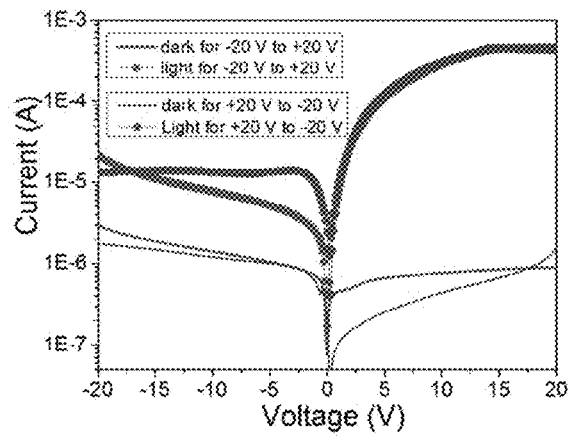
Fig. 2.6             Fig. 2.7

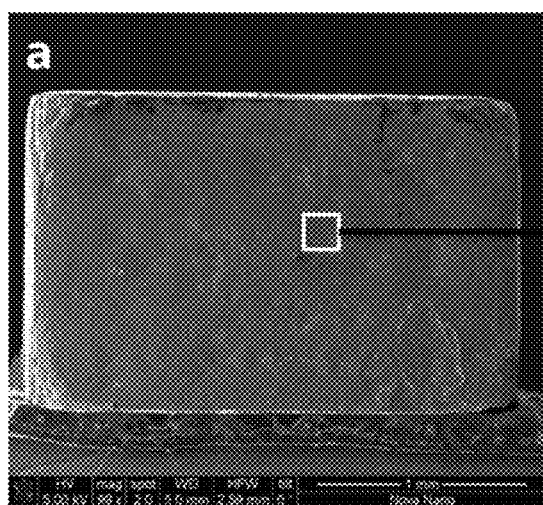
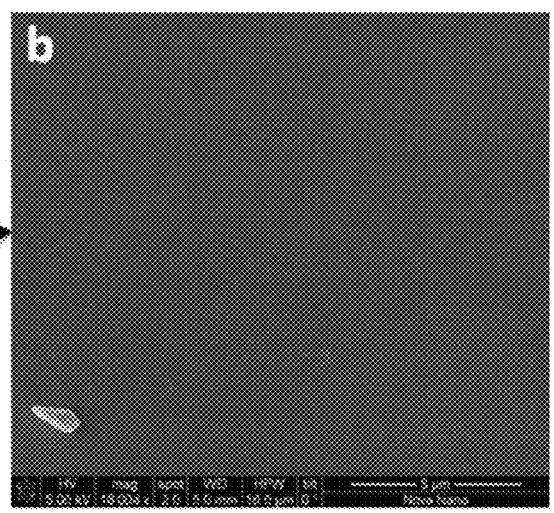
Fig. 2.8A  Fig. 2.8B

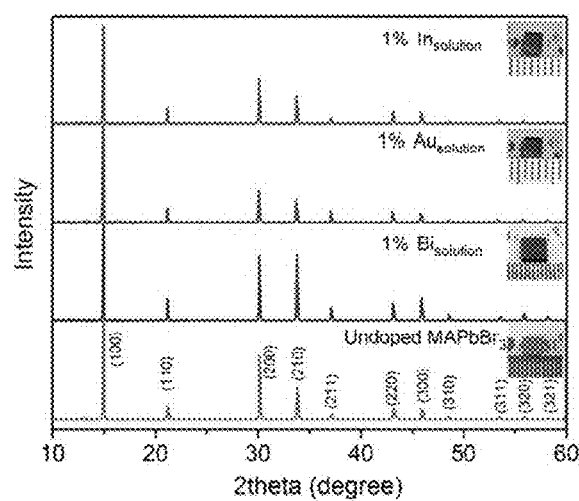 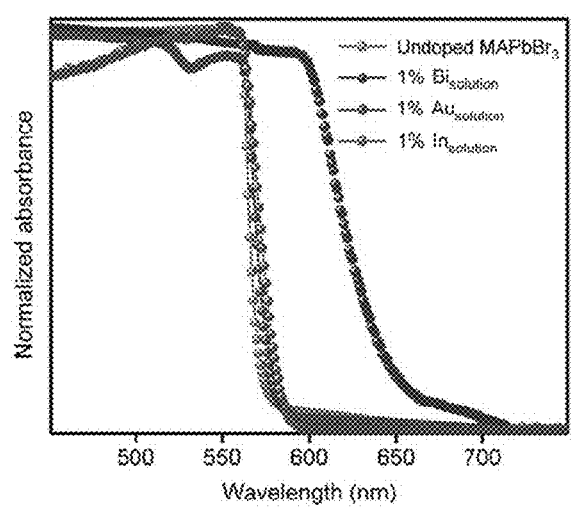
Fig. 3.1A                    Fig. 3.1B

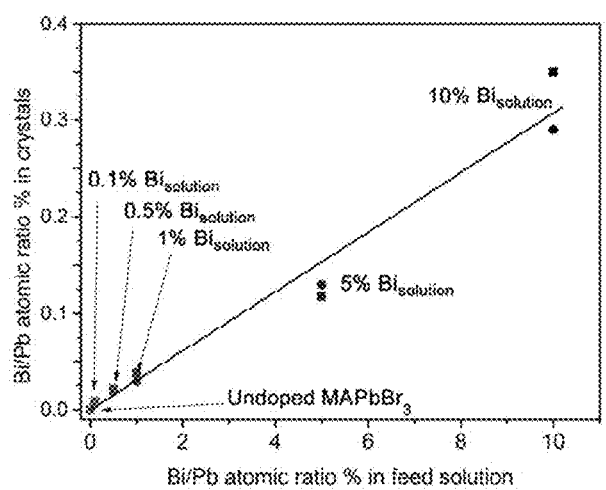
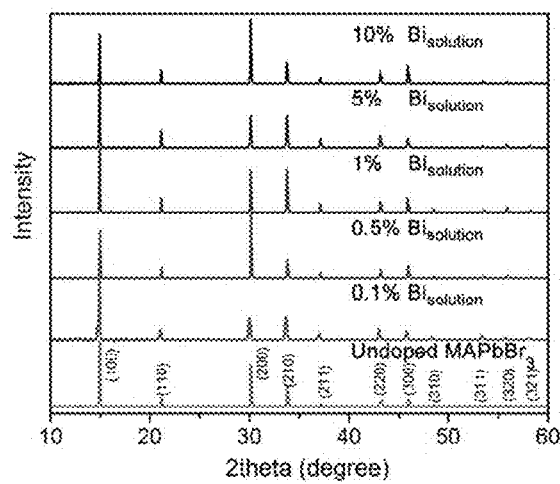
Fig. 3.2A
Fig. 3.2B
Fig. 3.2C

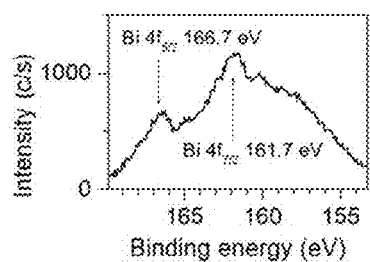
Fig. 3.3A
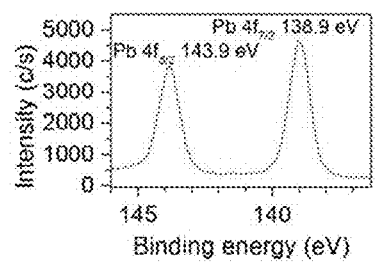
Fig. 3.3B
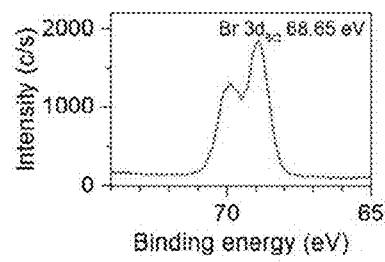
Fig. 3.3C
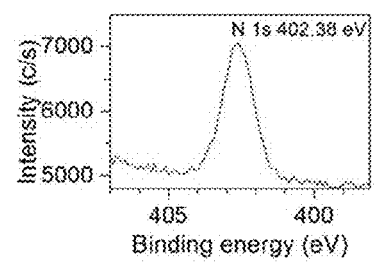
Fig. 3.3D
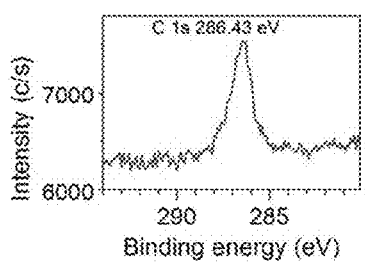
Fig. 3.3E
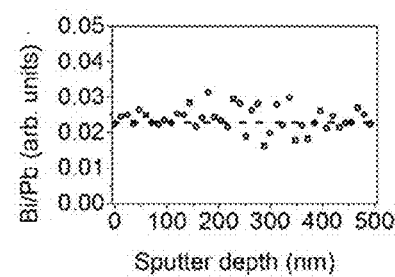
Fig. 3.3F

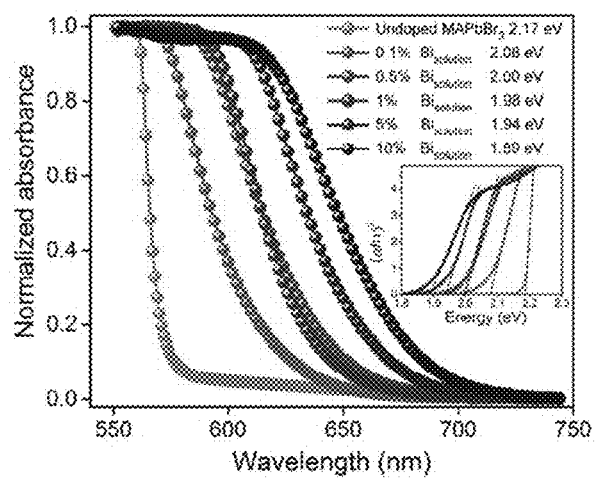
Fig. 3.4A
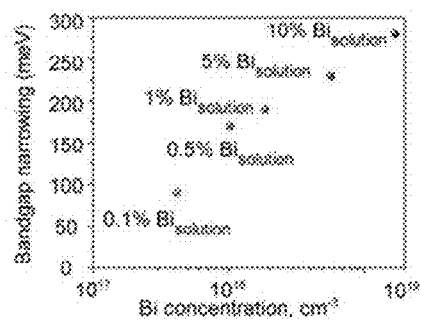
Fig. 3.4B
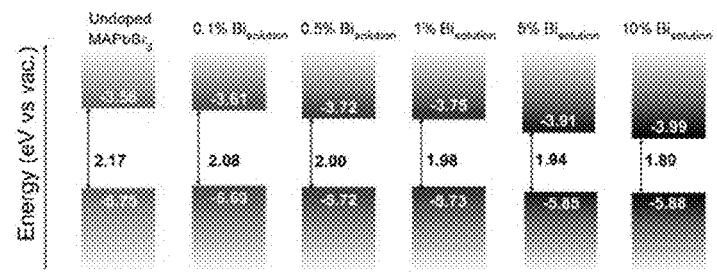
Fig. 3.4C

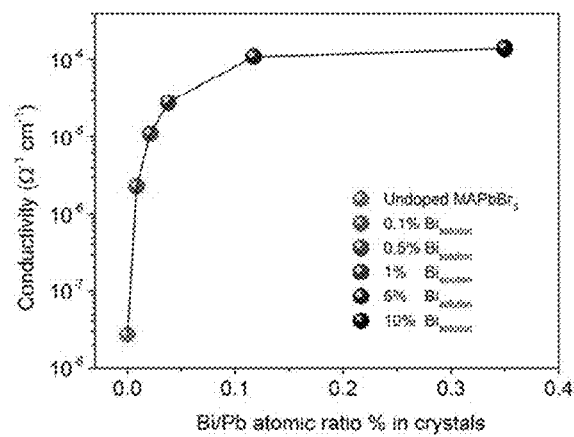
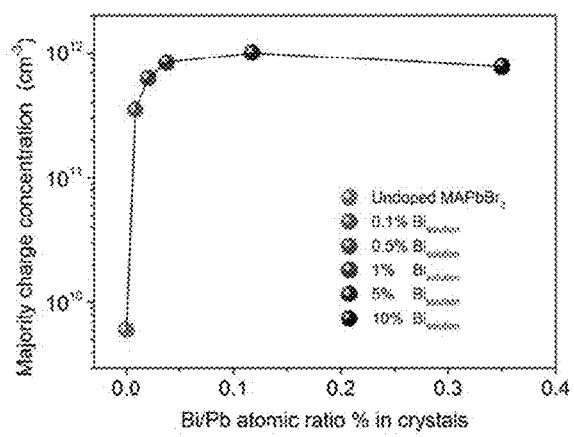
Fig. 3.5A  Fig. 3.5B

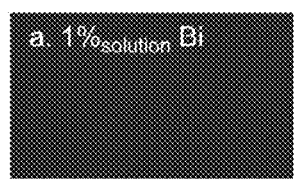
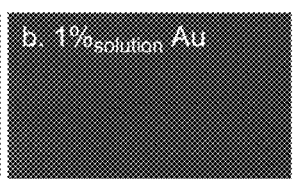
Fig. 3.6A  Fig. 3.6B  Fig. 3.6C
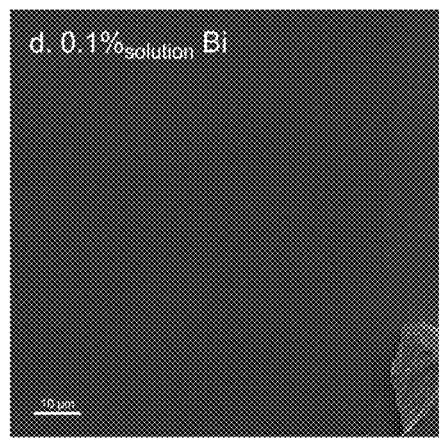
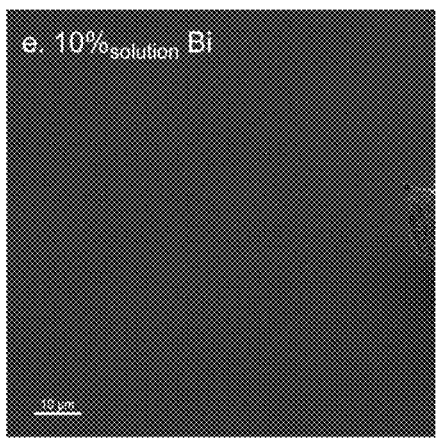
Fig. 3.6D  Fig. 3.6E

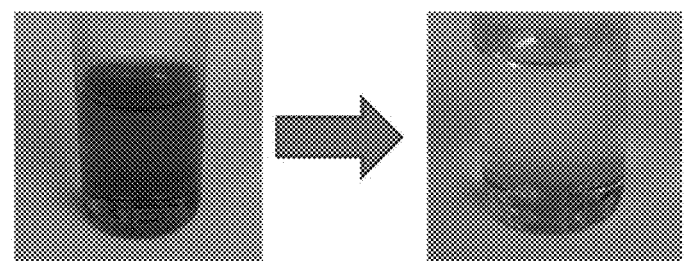
Fig. 3.7

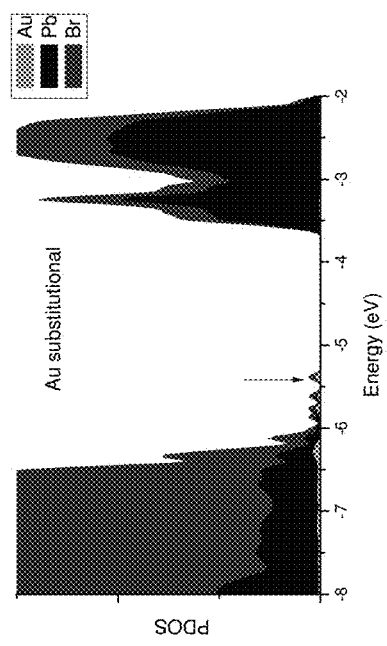
Fig. 3.8A
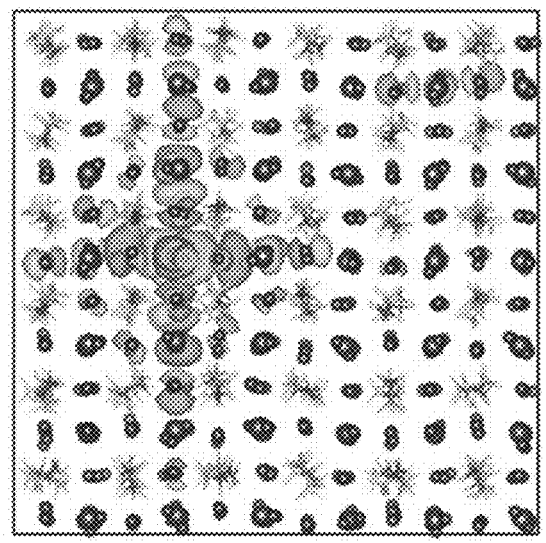
Fig. 3.8B

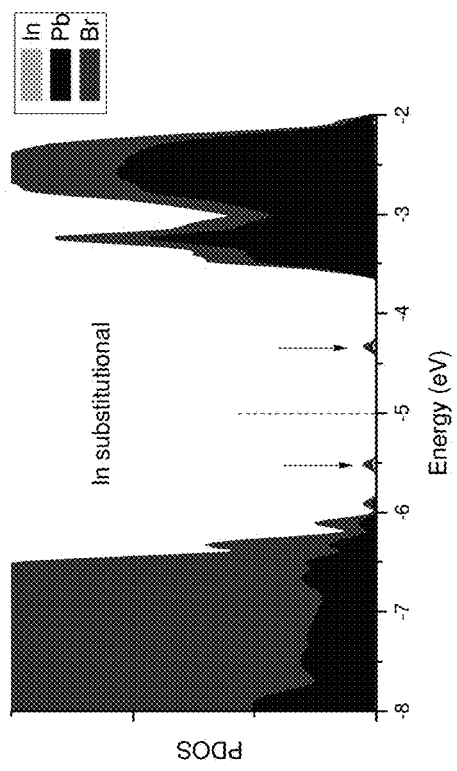
Fig. 3.8C
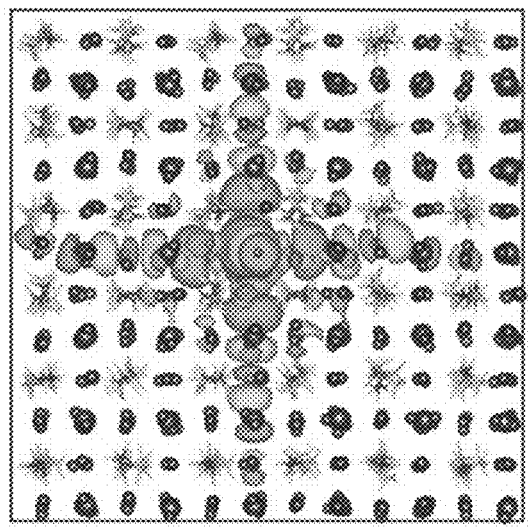
Fig. 3.8D

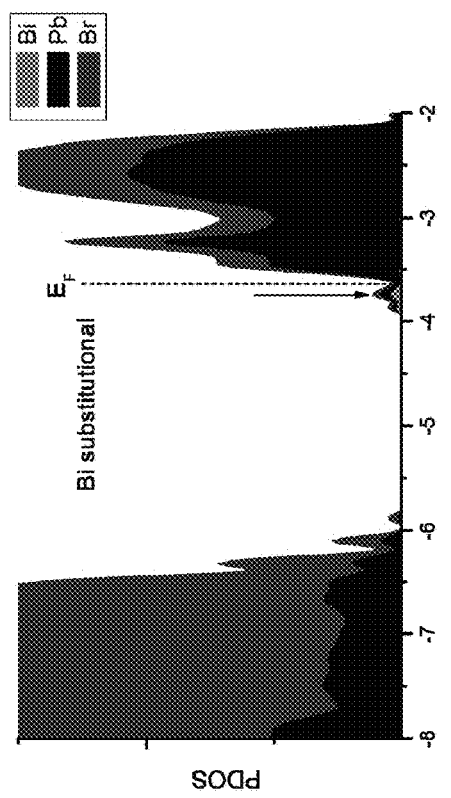
Fig. 3.9A
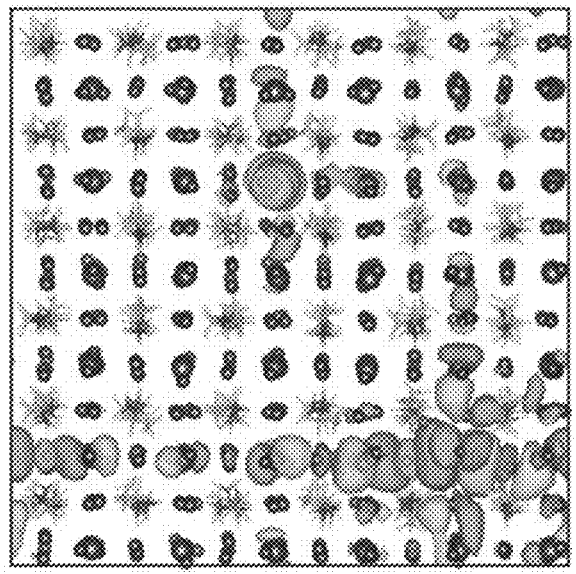
Fig. 3.9B

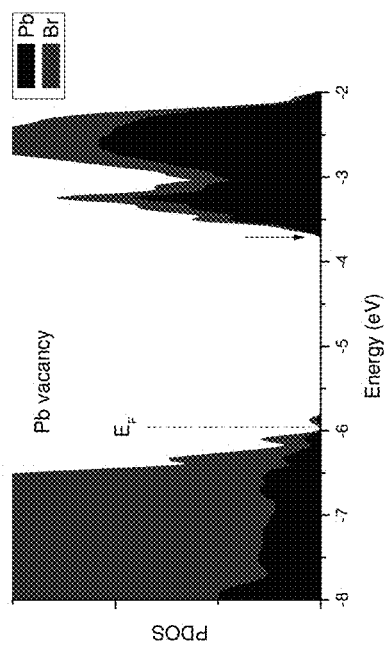
Fig. 3.9C
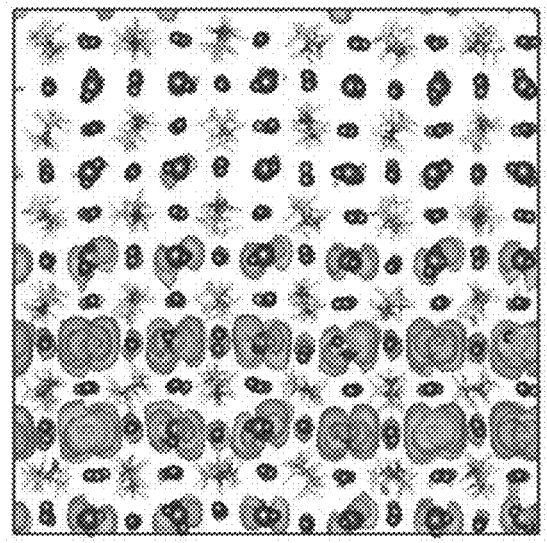
Fig. 3.9D

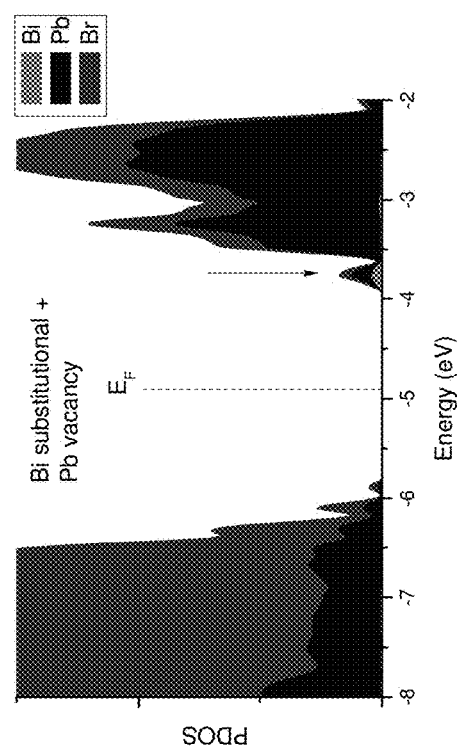
Fig. 3.9E
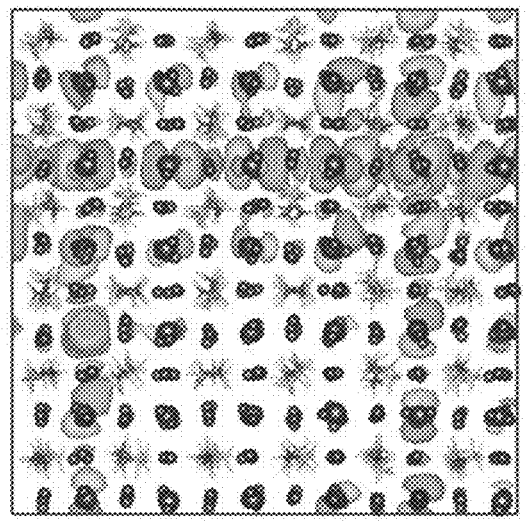
Fig. 3.9F

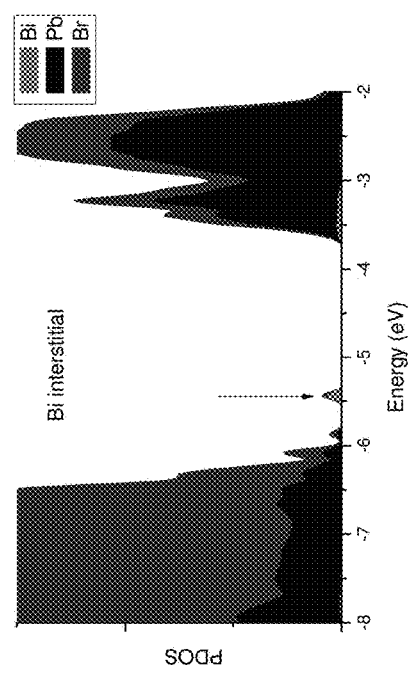
Fig. 3.10A
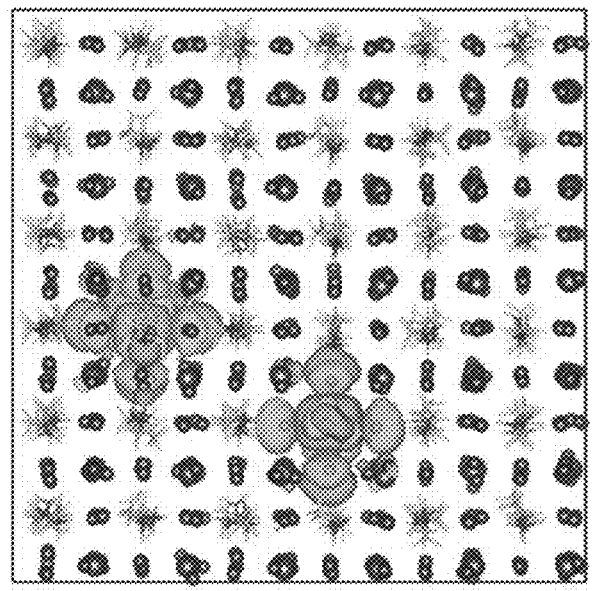
Fig. 3.10B

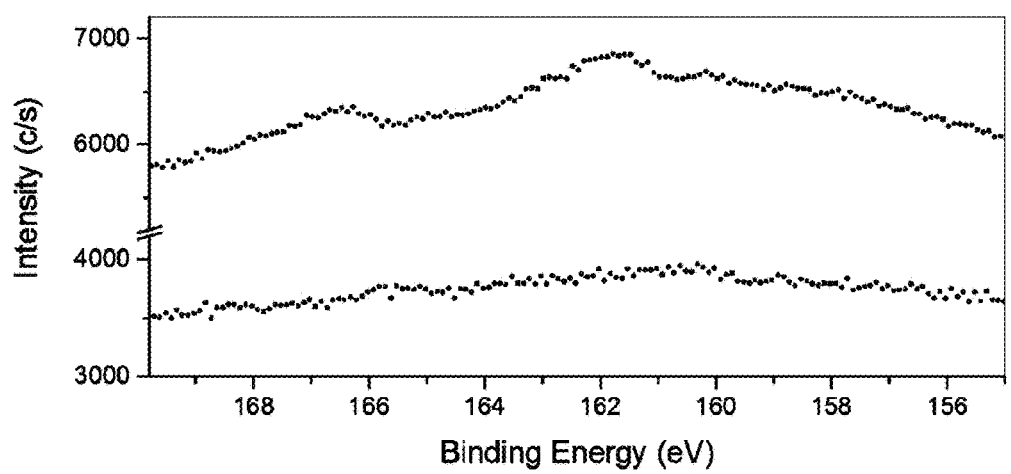
Fig. 3.11A
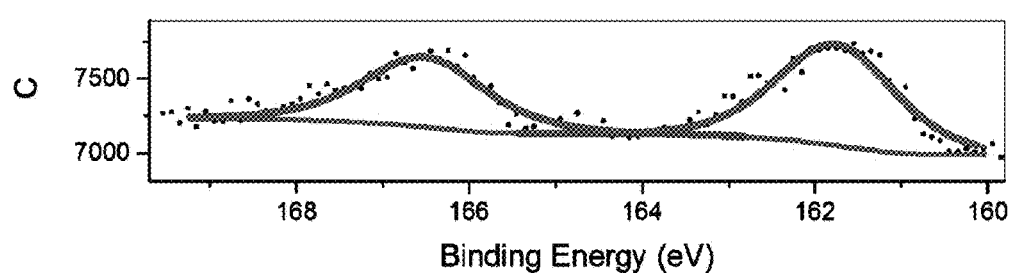
Fig. 3.11B

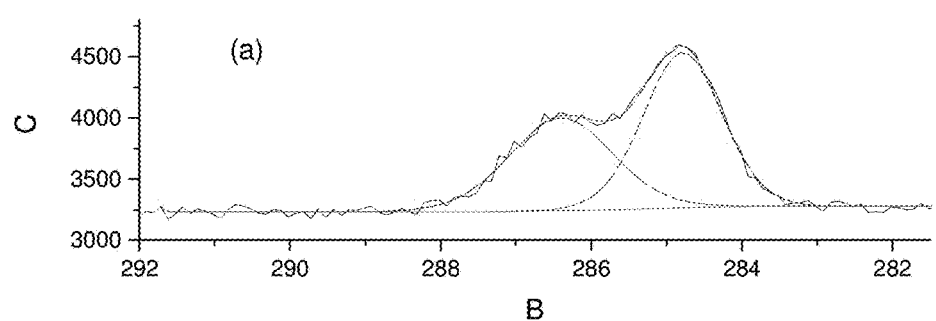
Fig. 3.12A
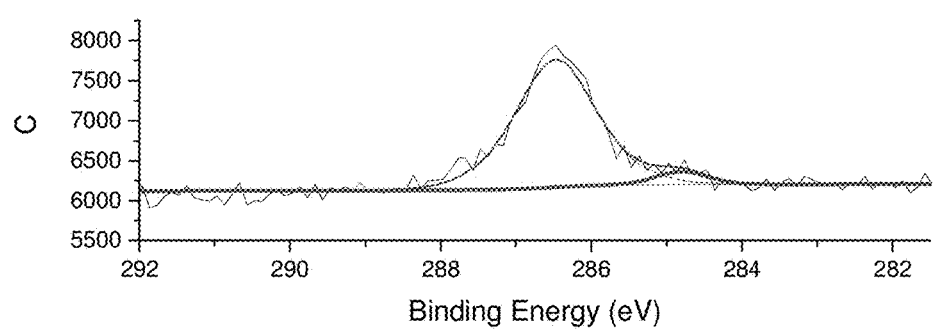
Fig. 3.12B

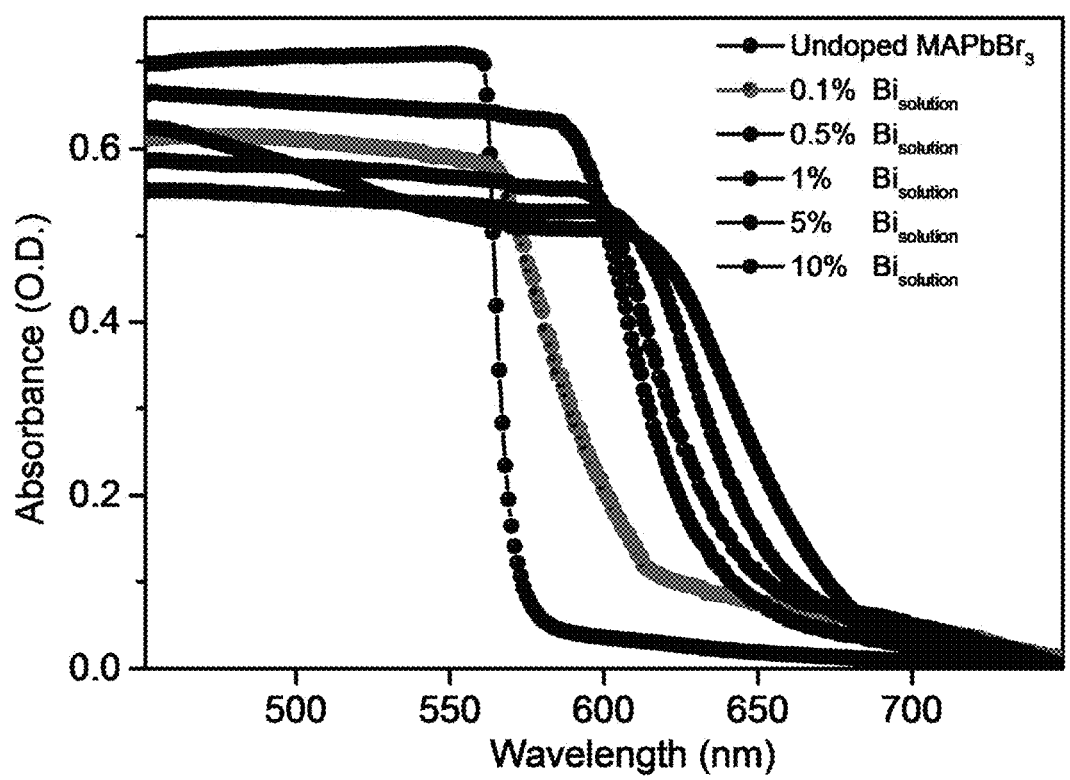
Fig. 3.13

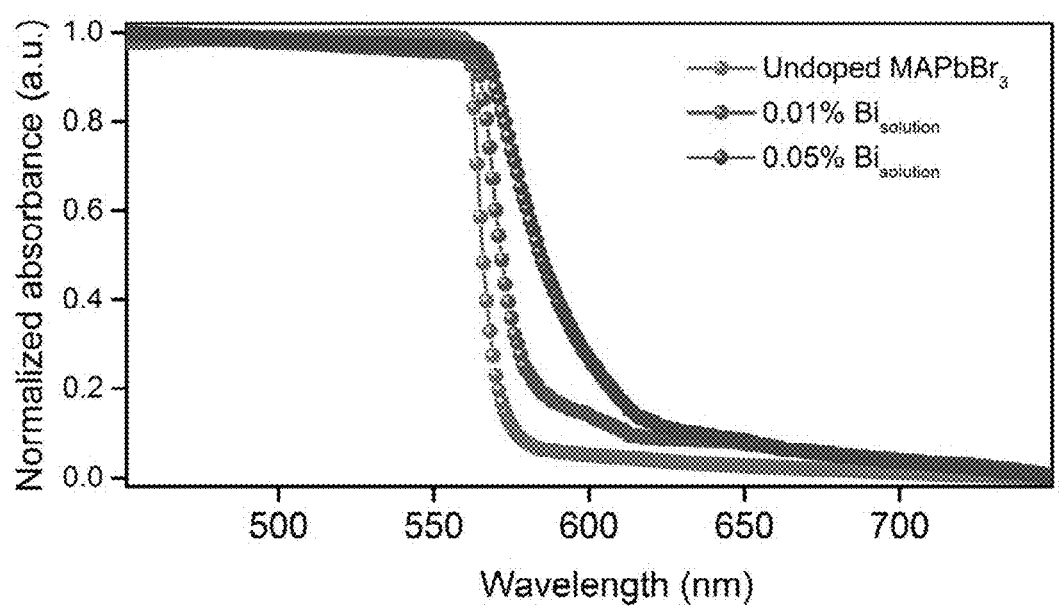
Fig. 3.14

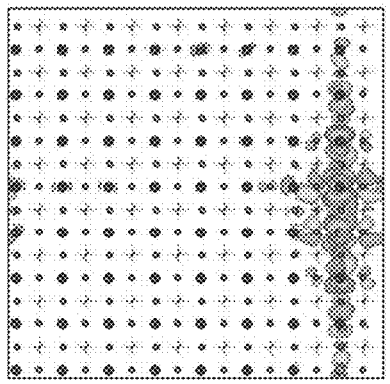 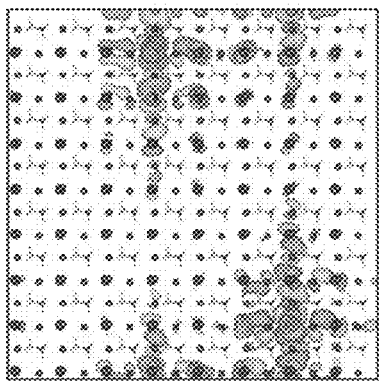 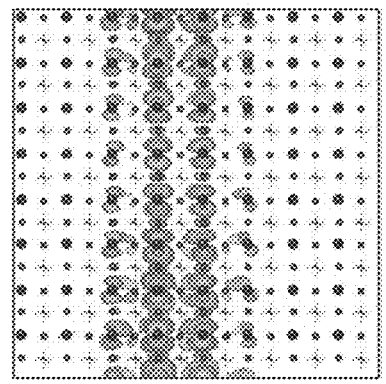
Fig. 3.15A          Fig. 3.15B          Fig. 3.15C

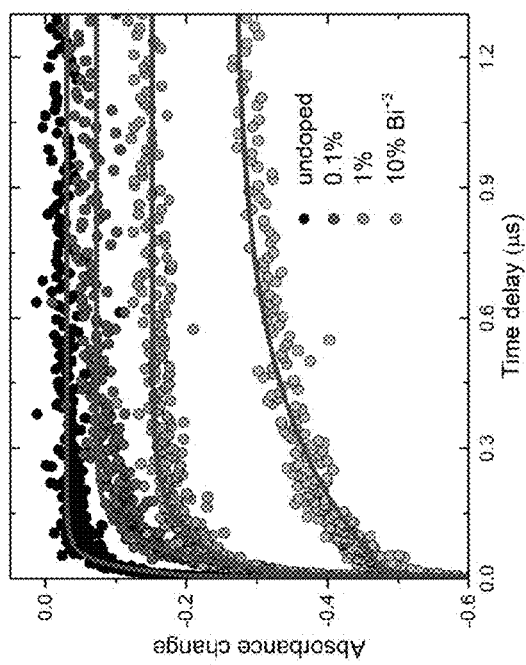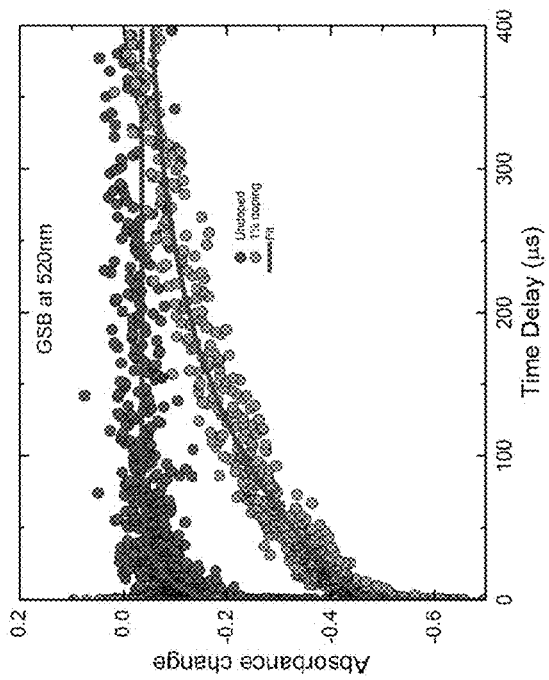
Fig. 3.16A
Fig. 3.16B

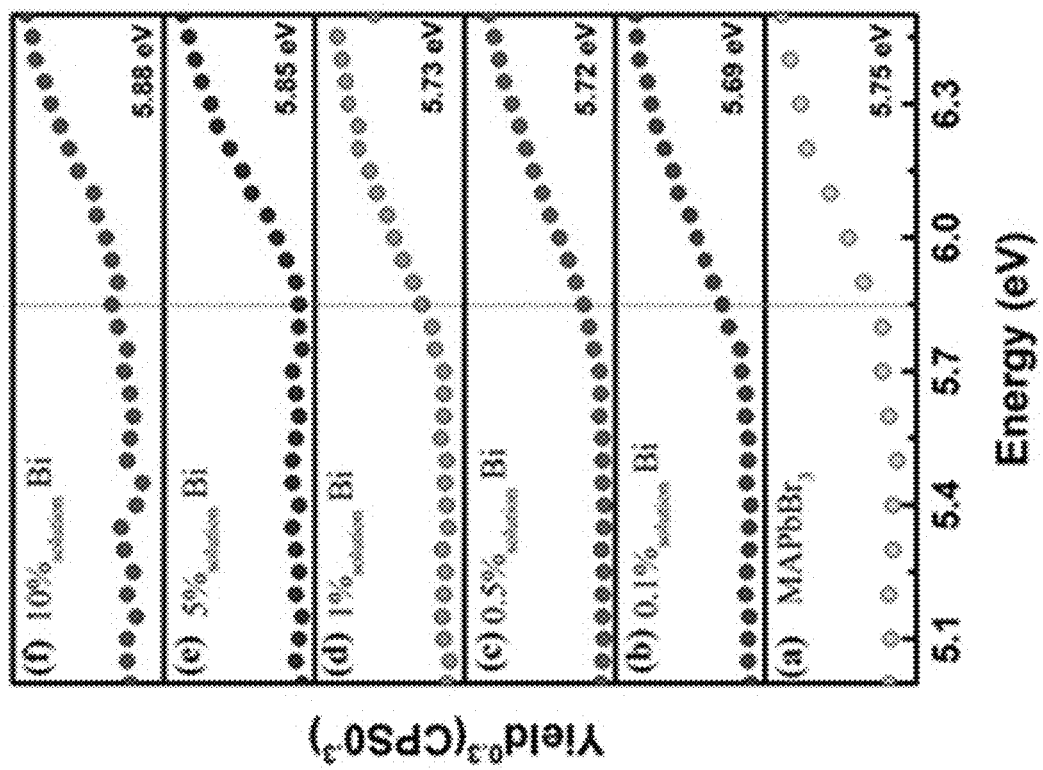
Fig. 3.17

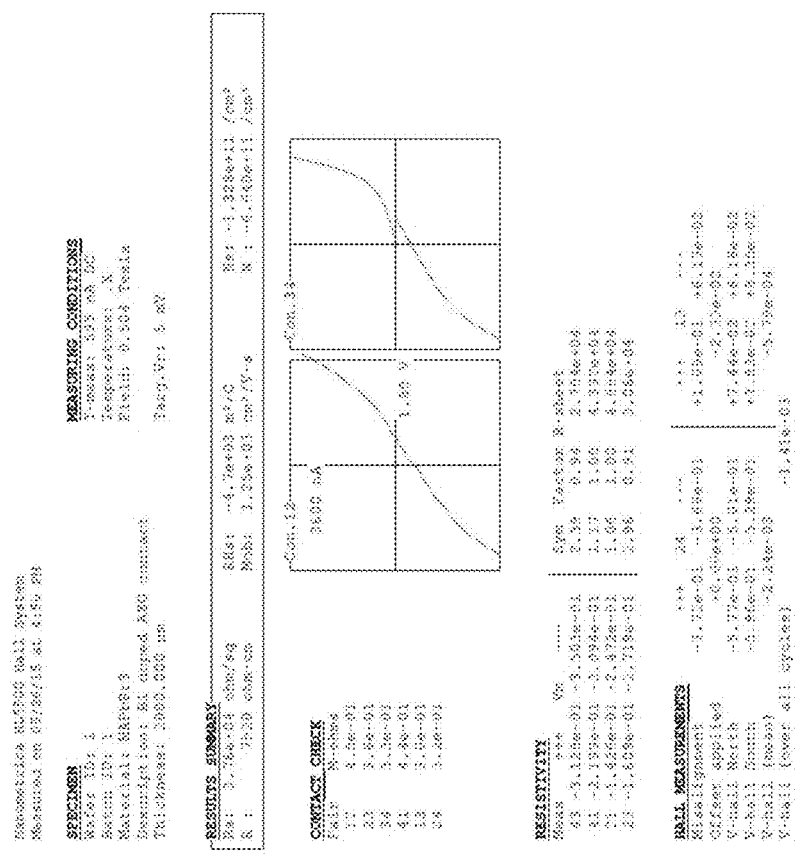
Fig. 3.18

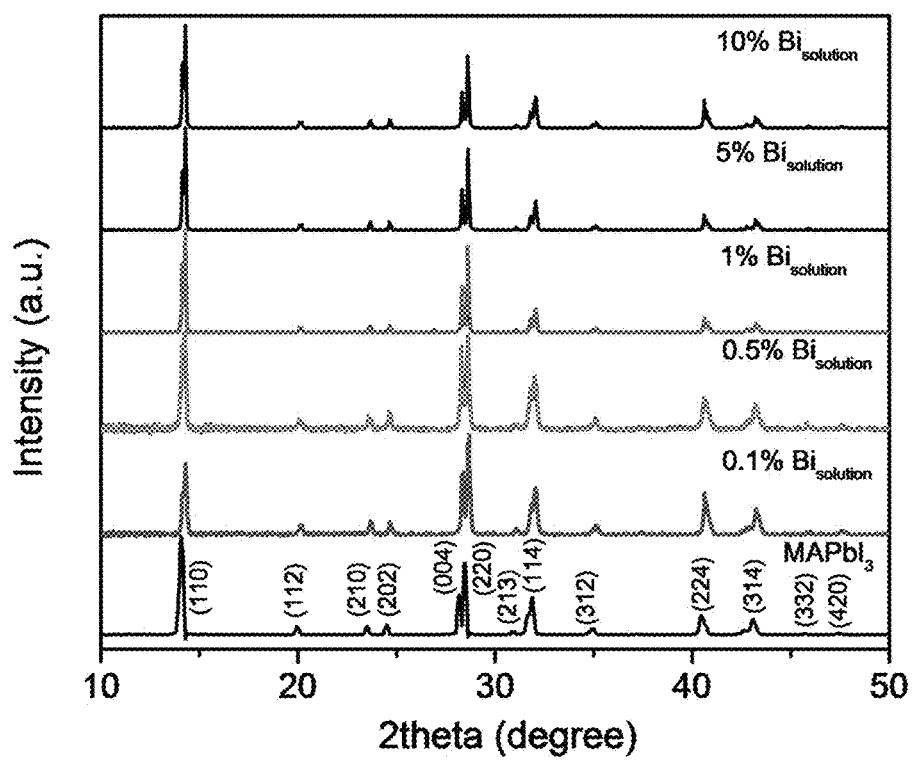
Fig. 3.19

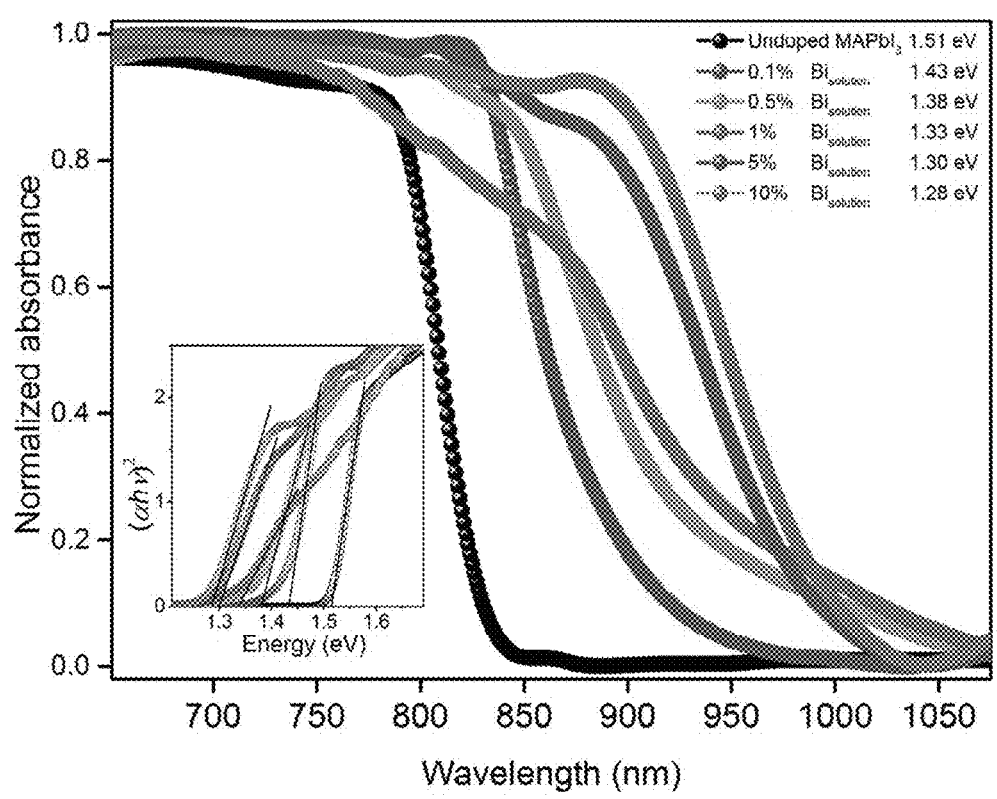
Fig. 3.20

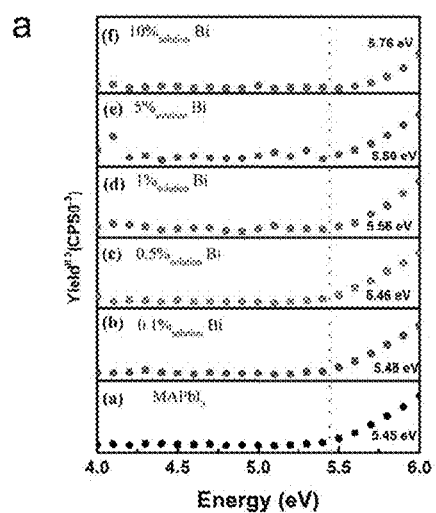
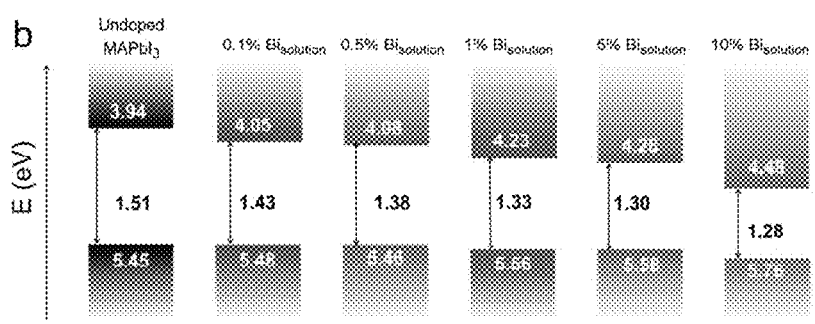
Fig. 3.21A
Fig. 3.21B

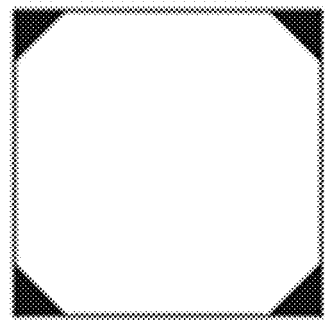
Fig. 3.22

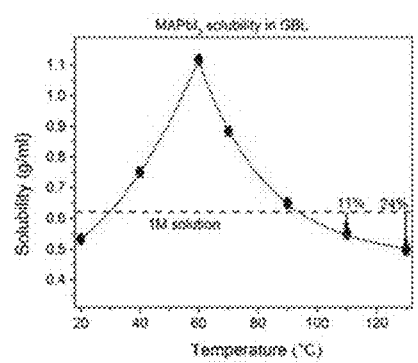 Fig. 4.1A
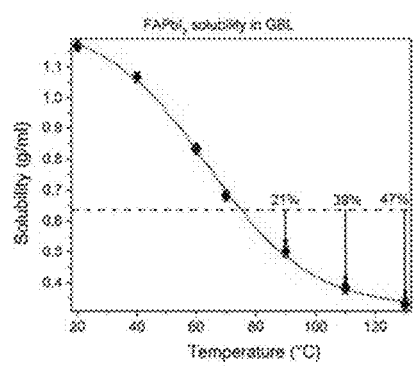 Fig. 4.1B
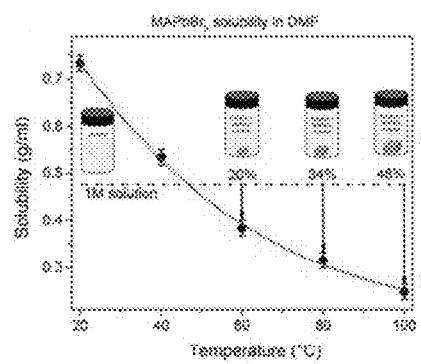 Fig. 4.1C
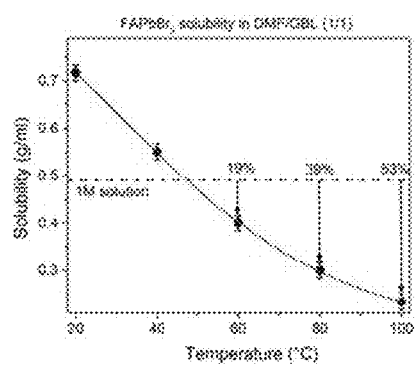 Fig. 4.1D

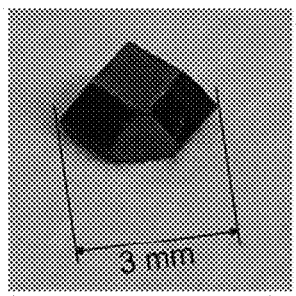
Fig. 4.2A
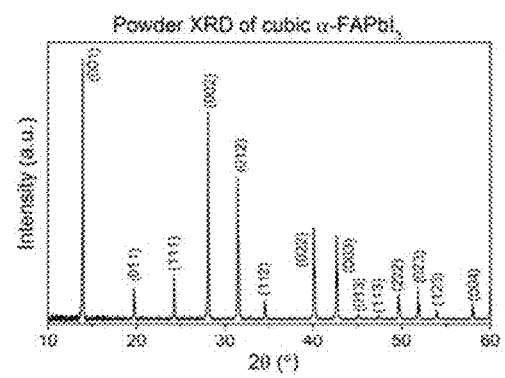
Fig. 4.2B
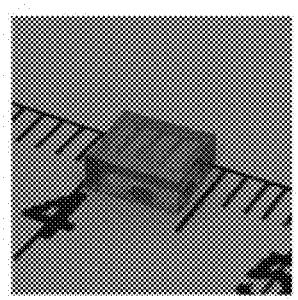
Fig. 4.2C
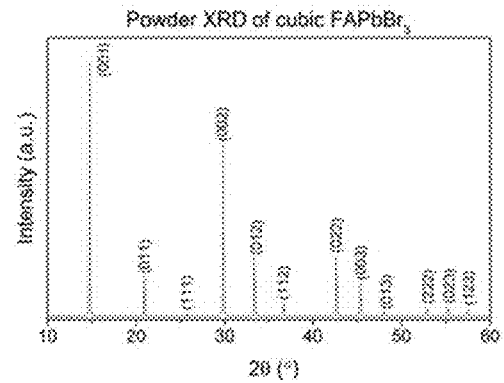
Fig. 4.2D

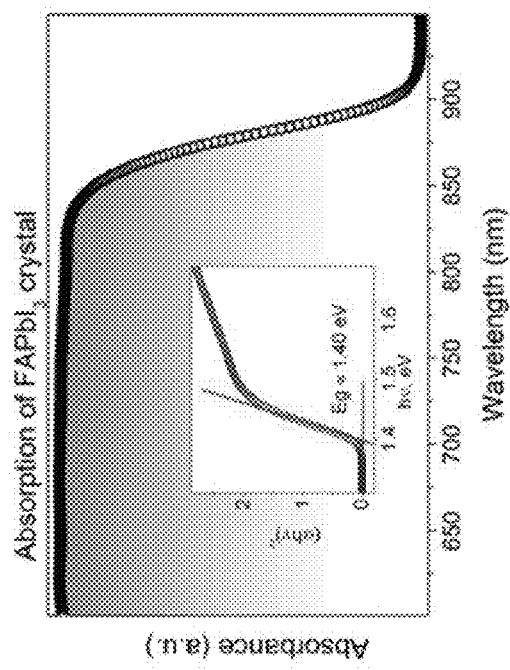 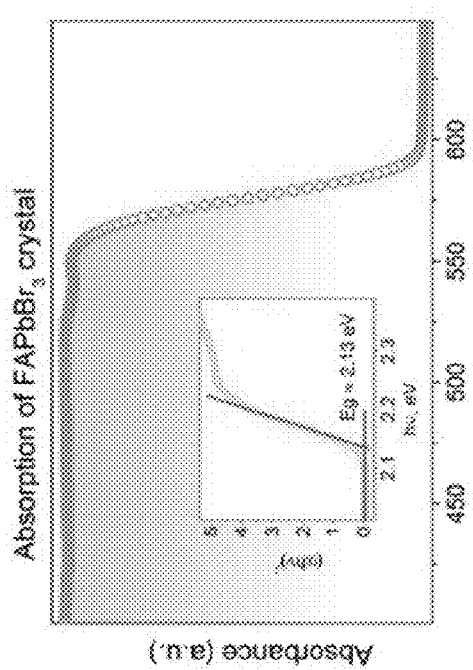
Fig. 4.3A
Fig. 4.3B

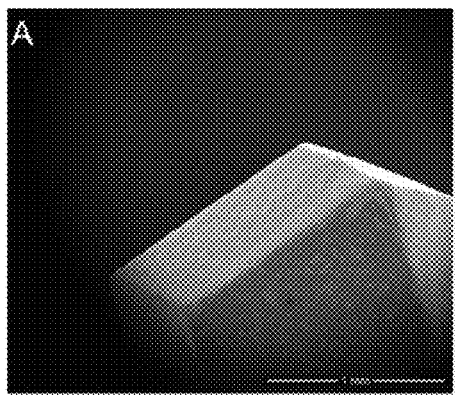
Fig. 4.4A
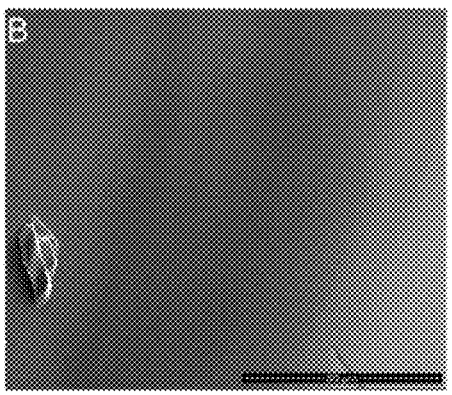
Fig. 4.4B
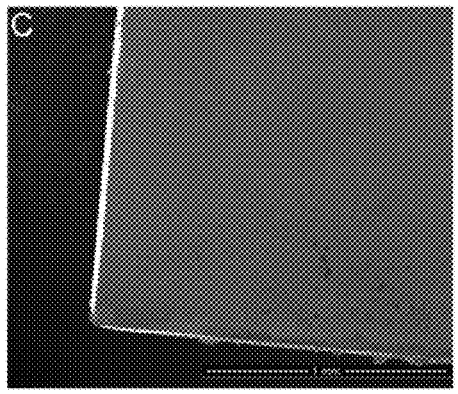
Fig. 4.4C
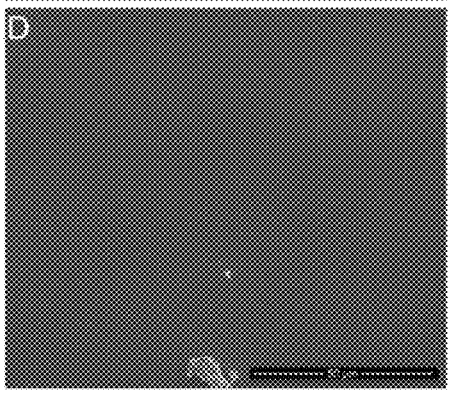
Fig. 4.4D

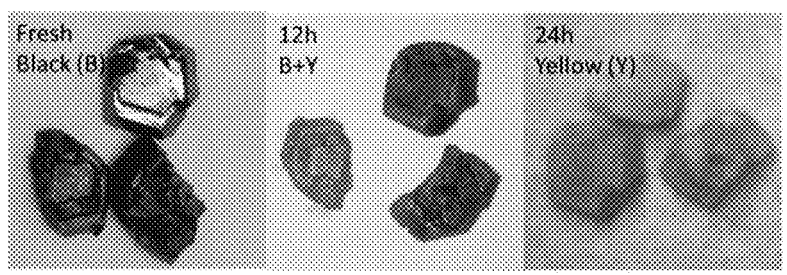
Fig. 4.5A
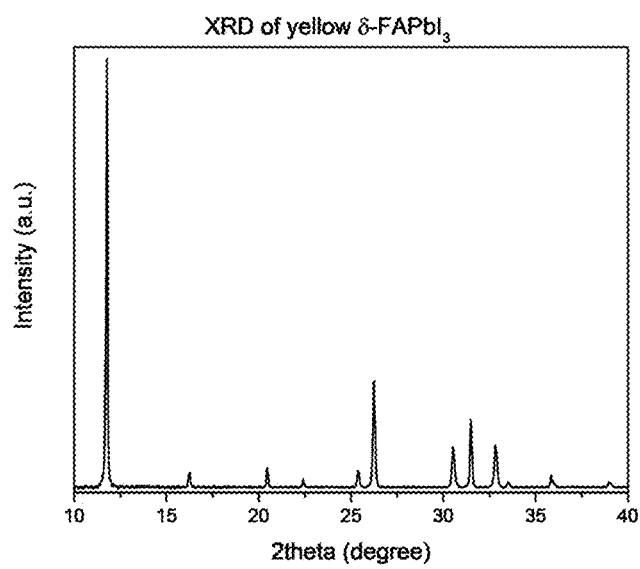
Fig. 4.5B

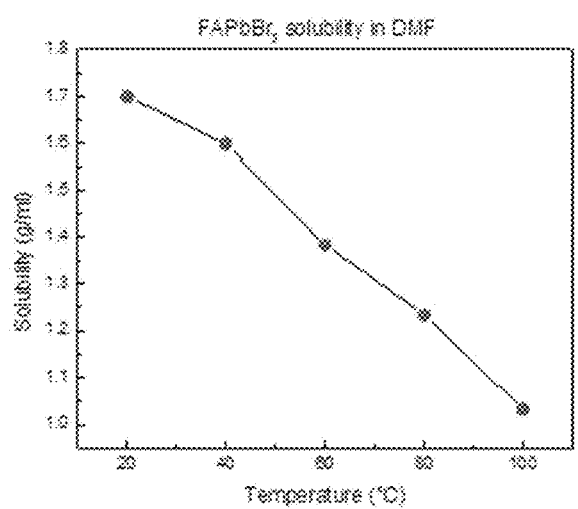
Fig. 4.6
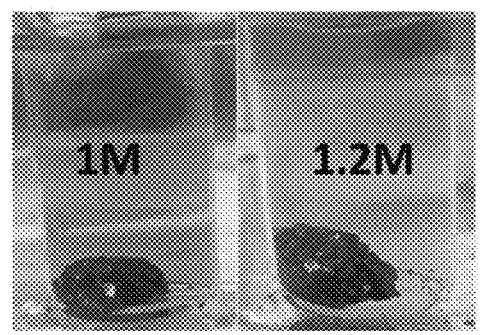
Fig. 4.7
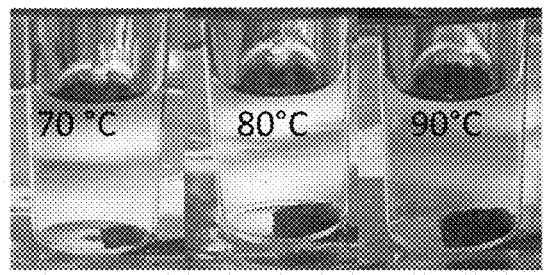
Fig. 4.8

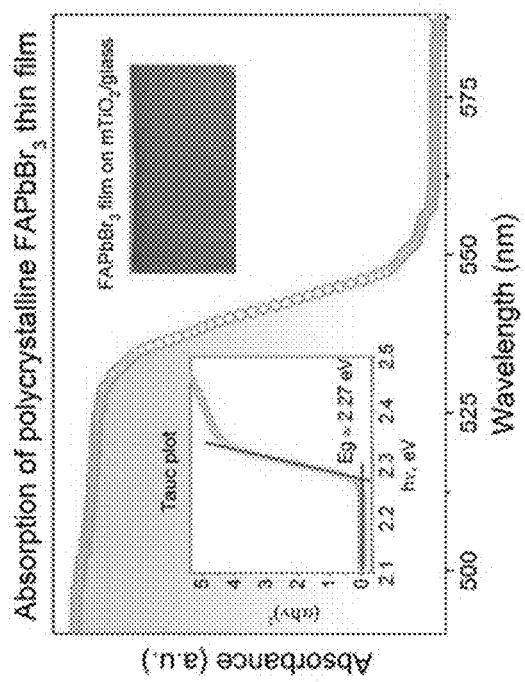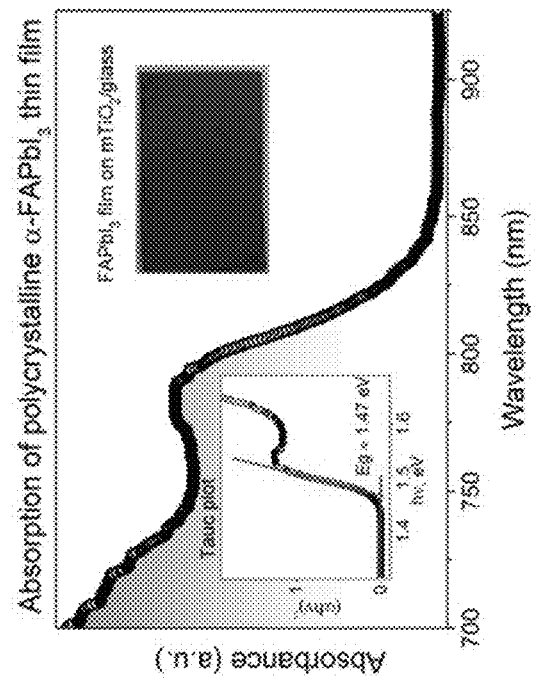
Fig. 4.9A
Fig. 4.9B

METHODS OF PREPARATION OF ORGANOMETALLIC HALIDE STRUCTURES

This application is a continuation of Ser. No. 15/560,412 filed on Sep. 21, 2017 now U.S. Pat. No. 10,557,214

BACKGROUND

This considerable interest in perovskites is due to their properties. Some have been shown to possess long carrier diffusion lengths and a remarkably low trap-state densities, which may make these materials highly desirable for various applications. However, the reported solution crystallization processes for perovskite single crystals suffer from very slow growth rates and no shape control over the resultant crystals.

SUMMARY

Embodiments of the present disclosure provide methods of growing organometallic halide structures such as single crystal organometallic halide perovskites, methods of use, devices incorporating organometallic halide structures, and the like.

An exemplary embodiment of the method of making an $AMX_3$ structure includes, among others, includes: dissolving $MX_2$ and AX in a solvent to form dissolved $AMX_3$ in a container, wherein A is an organic and/or inorganic cation, M is a divalent cation selected from the group consisting of: Pb, Sn, Cu, Ni, Co, Fe, Mn, Pd, Cd, Ge, Cs, or Eu, and X is selected from a halide; and heating the mixture in the solvent to a temperature so that the $AMX_3$ structure forms, wherein the temperature corresponds to the inverse temperature solubility for dissolved $AMX_3$. In an embodiment, the $AMX_3$ structure is a single crystal. In an embodiment, A can be alkyl-ammonium, formamidinum (FA), 5-ammoniumvaleric acid, or Cesium (Cs). In an embodiment, the solvent can be: N,N-dimethylformamide (DMF), dimethylsulfoxide (DMSO), gamma-butyrlolactone (GBR), dichrobenzene (DCB), toluene, or a combination thereof.

In an embodiment, the size of the $AMX_3$ structure can be controlled by adjusting one or more of the following: bottom surface dimensions of the container, the temperature, the concentration of $MX_2$, the concentration of AX, the time of crystal growth, and the concentration of the solvent.

An exemplary embodiment of the composition, among others, includes: an $AMX_3$ structure made by: dissolving $MX_2$ and AX in a solvent to form dissolved $AMX_3$ in a container, wherein A is an organic cation, M is a divalent cation selected from the group consisting of: Pb, Sn, Cu, Ni, Co, Fe, Mn, Pd, Cd, Ge, Cs, or Eu, and X is selected from a halide; and heating the mixture in the solvent to a temperature so that the $AMX_3$ structure forms, wherein the temperature corresponds to the inverse temperature solubility for dissolved $AMX_3$.

In an embodiment, the $AMX_3$ structure can be formed as a part of a nanoparticle, wherein the nanoparticle is a quantum dot or a core-shell nanoparticle. In an embodiment, the $AMX_3$ structure can be doped.

BRIEF DESCRIPTION OF THE DRAWINGS

Further aspects of the present disclosure will be more readily appreciated upon review of the detailed description of its various embodiments, described below, when taken in conjunction with the accompanying drawings.

FIGS. 1.1A-E illustrate crystal growth process and powder X-ray diffraction.

FIGS. 1.2A-B illustrate continuous growth and crystal shape-control.

FIGS. 1.3A-B illustrate steady-state absorption and photoluminescence.

FIG. 1.4A-D illustrate carrier lifetime measurements and current-voltage traces.

FIG. 1.5 is a picture of crystallization setup.

FIGS. 1.6A-D are SEM images of the surface and cleaved crystals.

FIG. 2.1A illustrates solubility data for $MAPbCl_3$ powder in DMSO-DMF (1:1 v/v) at different temperatures. FIG. 2.1B illustrates a powder X-ray diffraction (PXRD) of the ground crystal confirmed pure single-phase of cubic $MAPbCl_3$ perovskite with lattice constant a=5.67 Å, showing consistency with the previously reported PXRD data of the same single crystals obtained through the conventional crystallization technique.

FIGS. 2.2A-C shows absorption and PL spectra, PESA measurement, VBM and CBM of $MAPbCl_3$ single crystals.

FIGS. 2.3A-B illustrate transient absorption and Current-Voltage response in $MAPbCl_3$.

FIGS. 2.4A-D illustrate photodetection and photoresponse of $MAPbCL_3$.

FIGS. 2.5A-B illustrate photoresponse and photostability.

FIG. 2.6 illustrates TA spectra of $MAPbCl_3$ single crystal.

FIG. 2.7 illustrates I-V behavior of $MAPbCl_3$ single crystal showing hysteresis behavior under forward and reverse bias.

FIGS. 2.8A-B show a cross-sectional SEM image and surface of $CH_3NH_3PbCl_3$ single crystal.

FIG. 3.1A shows powder XRD of ground $MAPbBr_3$ and doped crystals prepared from solutions containing 1% dopant precursor. The inset above each XRD pattern shows the picture of the corresponding as-grown crystal. FIG. 3.1B shows steady-state absorption spectra of $MAPbBr_3$ crystals with and without cation doping.

FIG. 3.2A is a group of photographs showing $MAPbBr_3$ crystals having various Bi incorporation levels. FIG. 3.2B illustrates ICP measurement for Bi/Pb atomic ratio % as a function of feed solution atomic ratio %, and FIG. 3.2C illustrates powder XRD of ground $MAPbBr_3$ crystals with various Bi % doping.

FIGS. 3.3A-F show high resolution XPS spectra (3.3A) Bi 4f, (3.3B) Pb 4f, (3.3C) Br 3d, (3.3D) N 1s, (3.3E) C 1s after single sputtering cycle and (3.3F) sputter depth profile for the Bi/Pb ratio. A 500 eV Ar-ion beam was used for 2 min in single sputtering cycle.

FIG. 3.4A shows steady-state absorption spectra of $MAPbBr_3$ crystals with various Bi %. Inset: corresponding Tauc plots FIG. 3.4B illustrates bandgap narrowing as a function of Bi concentration in the crystal. FIG. 3.4C demonstrates Bandgap alignment of $MAPbBr_3$ crystals with various Bi %.

FIGS. 3.5A-B show Conductivity (FIG. 3.5A) and majority charge (FIG. 3.5B) concentration of the different crystals as a function of Bi/Pb atomic ratio % in the crystals.

FIGS. 3.6A-E are SEM images of cleaved crystals.

FIG. 3.7 illustrates decolorization of the feed solution upon the growth of Au-doped $MAPbBr_3$ crystal.

FIGS. 3.8A-D show projected density of states (3.8A, 3.8C) and wave functions (3.8B, 3.8D) of the impurity levels showing that Au and In states are deep and strongly localized.

FIGS. 3.9A-F show projected density of states (FIGS. 3.9A, 3.9C, 3.9E) and wave functions (FIGS. 3.9B, 3.9D, 3.9F) of the Bi impurities and Pb vacancies showing that they create levels near conduction band edge and they are capable of interacting.

FIGS. 3.10A-B show projected density of states (FIG. 3.10A) and wave function (FIG. 3.10B) of the two Bi interstitials forming deep and strongly localized states.

FIGS. 3.11A-B show the HR Bi 4f's XPS of cleaved 1% Bi-doped crystal (3.11A) top spectra and of undoped crystal bottom spectra. The Bi 4f binding energy range after processing in MultiPack v.9 and deconvolution is shown in 3.11B.

FIGS. 3.12A-B show high resolution C is XPS spectra of as inserted (3.12A) and after single sputtering cycle (3.12B).

FIG. 3.13 are absorbance spectra in absolute absorbance units. Absorbance spectra were measured in an integrated sphere corrected for reflection/scattering.

FIG. 3.14 show steady-state absorption spectra for lower Bi %.

FIGS. 3.15A-C illustrate wave functions of one (FIG. 3.15A) and two (FIG. 3.15B-C) Bi inclusions in a 8×8×8 unit cell showing significant delocalization when Bi inclusions cluster together, an effect responsible for bandgap narrowing.

FIGS. 3.16A-B illustrate nanoscond TA dynamics.

FIG. 3.17 illustrates photoelectron spectroscopy in air of undoped and Bi-doped $MAPbBr_3$ crystals.

FIG. 3.18 is a log sheet of the Hall Effect measurement for 10% Bi-doped $MAPbBr_3$.

FIG. 3.19. Powder XRD of ground $MAPbI_3$ crystals with various Bi % doping.

FIG. 3.20 illustrates steady-state absorption spectra of $MAPbI_3$ crystals with various Bi %. Inset: corresponding Tauc plots.

FIG. 3.21A shows photoelectron spectroscopy in air of undoped and Bi-doped $MAPbBr_3$ crystal and FIG. 3.21B illustrates bandgap alignment of $MAPbI_3$ crystals with various Bi %.

FIG. 3.22 illustrates the contact configuration used in Hall Effect measurements (the black corners are the contacts).

FIGS. 4.1A-D show temperature-dependent solubility of (FIG. 4.1A) $MAPbI_3$ in GBL and (FIG. 4.1B) $FAPbI_3$ in GBL., (4.1C) $MAPbBr_3$ in DMF showing yield at different temperatures, (FIG. 4.1D) $FAPbBr_3$ in DMF:GBL (1:1 v/v).

FIGS. 4.2A-D. Picture of (FIG. 4.1A) FAPbI3 crystal and its (FIG. 4.1B) powder XRD, picture of (FIG. 4.1C) FAPbBr3 crystal and its (FIG. 4.1D) powder XRD.

FIG. 4.3A-B illustrates absorption spectrum of (4.3A) $FAPbI_3$ and (4.3B) $FAPbBr_3$ crystals. Insets: corresponding Tauc plots to extract the bandgaps.

FIGS. 4.4A-D are SEM images of the surface and cleaved crystals. SEM of FIG. (FIG. 4.4A) surface of FAPbI3, (FIG. 4.4B) cleaved FAPbI3, (FIG. 4.4C) surface of FAPbBr3 and (FIG. 4.4D) cleaved FAPbBr3. Excess precursors from solution can be observed on the surface of the crystals. No cracks or grain boundaries are found on the surface or core of cleaved crystals indicating the single crystalline nature of both crystals. The dust in (FIG. 4.4B and FIG. 4.4D) indicate the good focus of electron beam.

FIGS. 4.5A-B shows transformation of $FAPbI_3$ crystal from black polymorph to yellow. FIG. 4.5A is picture of fresh $FAPbI_3$ (left), and $FAPbI_3$ after 12 h (center) and 24 h (right) in air. FIG. 4.5B shows XRD of the yellow phase of $FAPbI_3$.

FIG. 4.6 illustrates temperature-dependent solubility of FAPbBr3 in DMF. FAPbBr3 demonstrates retrograde solubility behavior in DMF. Solubility drops 1.7 times through the increasing temperature from 20° C. to °100 C.

FIG. 4.7 illustrates the effect of the precursors concentration on the crystallization yield. FAPbI3 crystals grown from 1 M (left) and 1.2 M (right) solutions in 3 h at 120° C. The size of the crystal is bigger from higher concentrated solution. Note that the crystals are mosaic due to fast heating of solution. In order to get well-shaped crystals, the conditions described in the Synthesis section should be used.

FIG. 4.8 illustrates the effect of the crystallization temperature on the crystallization yield.

FIGS. 4.9A-B show absorption of polycrystalline $FAPbX_3$ films.

DETAILED DESCRIPTION

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, material science, synthetic organic chemistry, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in bar. Standard temperature and pressure are defined as 25° C. and 1 bar.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

General Discussion

Embodiments of the present disclosure provide methods of growing organometallic halide structures such as single crystal organometallic halide perovskites, methods of use, devices incorporating organometallic halide structures, and the like. Embodiments of the present disclosure provides for a method of making organometallic halide structures that is simple and an order of magnitude faster than other methods. In addition, methods of the present disclosure can be used to control the dimensions and/or shape of the organometallic halide structure.

Furthermore, single crystal organometallic halide perovskites formed using embodiments of the present disclosure can have superior characteristics as compared to state-of-the-art crystalline thin films prepared by other methods and these characteristic can include charge carrier mobility, lifetime, trap-state density, and/or diffusion length. In this regard, embodiments of the single crystal organometallic halide perovskite can be used in photovoltaic devices such as perovskite-type photovoltaic devices.

Embodiments of the present disclosure provide for organometallic halide structures such as single crystal organometallic halide perovskites. In an embodiment, the organometallic halide structure can be doped. In an embodiment, the organometallic halide structure can have the following formula: $AMX_3$. In an embodiment, A can be an organic cation such as alkyl-ammonium (e.g., methylammonium (MA)), formamidinum (FA), 5-ammoniumvaleric acid or an inorganic cation such Cesium (Cs), or a combination thereof. In an embodiment, M can be a cation or divalent cation of an element such as Pb, Sn, Cu, Ni, Co, Fe, Mn, Pd, Cd, Ge, Cs, or Eu. In a particular embodiment, M is Pb. In an embodiment, X can be a halide anion such as Cl, Br, F, I, and At. In particular, X is Br or I. The selection of the components of $AMX_3$ is made so that the organometallic halide has a neutral charge. In an embodiment, alkyl can refer to linear or branched hydrocarbon moieties having one to six carbon atoms (e.g., methyl, ethyl, propyl, and the like).

In an embodiment, AMX3 can be: methylammonium lead iodide ($MAPbI3$), methylammonium lead bromide ($MAPbBr_3$), formamidinum lead bromide (FAPbBr3), formamidinum lead iodide (FAPbI3), MAPbCl3, FAPbCl3, CsPbI3, CsPbCl3, CsPbBr3, FASnI3, FASnBr3, and FASnCl3, MASnI3, MASnBr3, and MASnCl3.

In an embodiment, the $AMX_3$ structure can be a single crystal organometallic halide perovskite and can have dimensions greater than 500 microns or greater than 1000 microns. In an embodiment, the single crystal organometallic halide perovskite can have one or more dimensions of about 0.1 mm to 10 mm or more. In an embodiment, the single crystal organometallic halide perovskite can have the following dimensions: one or more dimensions (e.g., length, width or diameter) of about 1 mm to 10 mm and a thickness of about 0.05 to 3 mm. In an embodiment, the single crystal organometallic halide perovskite can have a crystal volume of 100 $mm^3$ or more. In an embodiment, the single crystal organometallic halide perovskite can have the following dimensions: a length of about 1 mm to 10 mm or about 2 mm to 8 mm, a width of about 1 mm to 10 mm or about 2 mm to 8 mm and a thickness of about 0.2 to 2 mm.

In an embodiment, the $AMX_3$ structure can be in the form of a crystal wafer, nanostructure (e.g., nanowire), as a layer in, on, or around a particle (e.g., a layer in a shell-core particle, part of a quantum dot, and the like), QBit, and an alloy in any of the above.

An embodiment of the present disclosure includes a method of making an organometallic halide structure, in particular organometallic halide perovskite single crystals, as described herein. The method is simple, the component set up is not complex and does not require specialized equipment, the time of reaction is an order of magnitude shorter than other methods, and the reaction requires little energy input.

In an embodiment, the method includes dissolving $MX_2$ and AX in a solvent to form dissolved $APbX_3$ in a container at or near room temperature. In an embodiment, the solubility can be enhanced using a vortex mixer. In an embodiment, undissolved $MX_2$ or AX can be filtered out. In an embodiment, A can be an organic cation. In an embodiment, the concentration of the $MX_2$ can be about 4 to 44 weight %. In an embodiment, the concentration of the AX can be about 2 to 15 weight %.

In an embodiment, M can be selected from: Pb cation, Sn cation, Cu cation, Ni cation, Co cation, Fe cation, Mn cation, Pd cation, Cd cation, Ge cation, or Eu cation, Cs cation, and in a particular embodiment, M can be $Pb^{2+}$. In an embodiment, X can be a halide such as $Br^-$, $Cl^-$, or $I^-$. In an embodiment, A is a cation selected from methyl-ammonium, formamidinium, and Cesium (Cs).

In an embodiment, the solvent can be N,N-dimethylformamide (DMF), dimethylsulfoxide (DMSO), gamma-butyrolactone (GBL), dichlorobenzene (DCB), toluene, or a combination thereof, depending upon the $AMX_3$ structure to be formed.

Subsequently, the mixture in the solvent is heated to a temperature (e.g., about 40 to 150° C.) so that the $APbX_3$ structure forms, where the temperature corresponds to the inverse temperature solubility for dissolved $APbX_3$. In an embodiment, the $APbX_3$ structure can be formed in about 1-6 hours or about 2-3 hours. Additional details are provided in the Examples.

In an embodiment, the solvent is matched with the reactants so that at room temperature the reactants are soluble in the solvent, but at higher temperatures, the $APbX_3$ structure is formed (e.g., crystalizes). In this regard, when a $MAPbBr_3$ perovskite structure is to be formed, the solvent used is N,N-dimethylformamide (DMF). In another embodiment, when a $MAPbI_3$ perovskite structure is to be formed, the solvent is γ-butyrolactone (GBL). In another embodiment, when a $MAPbCl_3$ perovskite structure is to be formed, the solvent is dimethylsulfoxide (DMSO).

In an embodiment, the $APbX_3$ structure can be doped by adding a dopant such as bismuth, gold, indium, tin germanium, phosphine, copper, strontium, cadmium, calcium, and/or nickel ions (2+ and 3+ cations as appropriate) to the reaction process by added these to the precursor solution. In an embodiment, the atomic % of the dopant can be about 0.0001 to 5%.

In an embodiment, after the APbX$_3$ structure is formed, the diluted dissolved APbX$_3$ can be replenished so that a larger APbX$_3$ structure can be grown. This process can be repeated to form the desired size of the APbX$_3$ structure. In an embodiment, the dissolved APbX$_3$ can be replenished by removing the diluted mixture from the container, and mixing in fresh dissolved APbX$_3$ or adding in the reactants to form the dissolved APbX$_3$.

In an embodiment, the container can be made of materials that do not impede the formation of the organometallic halide structure for example, metal, plastic, glass, and the like. In an embodiment, the container can have dimensions on the millimeter scale to the centimeter scale or larger as needed. The shape of the container can be constructed to control the rate formation of organometallic halide structure, dimensions of the organometallic halide structure, and the like.

In an embodiment, a template can be positioned in the bottom of the container to define the shape and/or size of the organometallic halide structure. In an embodiment, the template can include a nanoparticle and the organometallic halide structure can form a layer on or around the nanoparticle to form a composite structure (e.g., a core-shell particle, quantum dot, etc.).

In an embodiment the method can be designed to control the temperature to which the mixture is subjected in the container. In general, the temperature is controlled by a heating solution in contact with the outside of the container (e.g., an oil bath), which can be adjusted to control the rate of formation of the organometallic halide structure, the size of the organometallic halide structure, and the like.

In an embodiment, the organometallic halide structure (e.g., single crystal organometallic halide perovskite) can be used in transistors, solar cells (e.g., standard solar cells, hybrid solar cells, tandem solar cells, etc.), broadband (wideband), and narrowband photon detectors, other detectors, quantum-based computers, and the like. Use of single crystal organometallic halide perovskites of the present disclosure in a solar cell can lead to enhanced photocurrent generation and/or collection or the overall power conversion efficiency upon use in photovoltaic devices.

EXAMPLES

Now having described the embodiments of the disclosure, in general, the examples describe some additional embodiments. While embodiments of the present disclosure are described in connection with the example and the corresponding text and figures, there is no intent to limit embodiments of the disclosure to these descriptions. On the contrary, the intent is to cover all alternatives, modifications, and equivalents included within the spirit and scope of embodiments of the present disclosure.

Example 1

Single crystals of methylammonium lead trihalide perovskites (MAPbX$_3$; MA=CH$_3$NH$_3$, X=Br$^-$ or I$^-$) have shown remarkably low trap density and charge transport properties, however, growth of such high-quality semiconductors is a time consuming process. Here we present a rapid crystal growth process to obtain MAPbX$_3$ single crystals, an order of magnitude faster than previous reports. The process is based on our observation of the substantial decrease of MAPbX$_3$ solubility, in certain solvents, at elevated temperatures. The crystals can be both size- and shape-controlled by manipulating the different crystallization parameters. Despite the rapidity of the method, the grown crystals exhibit transport properties and trap densities comparable to the highest quality MAPbX$_3$ reported to date. The phenomenon of inverse or retrograde solubility and its correlated inverse temperature crystallization strategy, present a major step forward for advancing the field on perovskite crystallization.

Introduction

Organo-lead trihalide hybrid perovskites (MAPbX$_3$; MA=CH$_3$NH$_3$, X=Br$^-$ or I$^-$) have been widely investigated for solar cells,[1-8] lasing,[9] light-emitting diodes,[10] photodetectors[11] and hydrogen production[12]. This considerable interest in organo-lead trihalide perovskites is due to their tunable optical properties, high absorption coefficients, long-ranged balanced electron and hole transport,[13] and low cost and facile deposition techniques.[14-16] In particular, single crystals of MAPbBr$_3$ and MAPbI$_3$ were shown to possess long carrier diffusion lengths and a remarkably low trap-state densities, which is comparable to the best photovoltaic-quality silicon.[17] These properties provide a view of the ultimate potential of hybrid perovskites, and make single crystals of MAPbX$_3$ a highly desirable semiconductor for optoelectronic applications that are much broader than their polycrystalline thin film counterpart. However, the reported solution crystallization processes for perovskite single crystals suffer from very slow growth rates and no shape control over the resultant crystals.[17-21] The highest reported growth rate was estimated to be ~26 mm$^3$ per day (~1 mm$^3$ h$^{-1}$), based on a MAPbI$_3$ crystal with the dimensions of 10 mm×10 mm×8 mm that took a month to grow.[20] A radically faster crystallization technique that could also address the need for a diverse variety of crystal geometries will allow more extensive use of hybrid perovskite single crystals.

The choice of a suitable solvent medium has always been a defining factor for the quality of the ensuing crystals. In the case of hybrid perovskites, the most widely used solvents are γ-butyrolactone (GBL), N,N-dimethylformamide (DMF), and dimethylsulphoxide (DMSO). The solubility of PbX$_2$ and MAX in these solvents or their mixtures was found to vary, hence, it was previously reported that MAPbBr$_3$ crystallized more aptly from DMF while MAPbI$_3$ crystallized better from GBL.[17] Perovskite crystallization from aqueous solution was also reported; in which crystals were formed, classically, upon cooling a preheated solution.[20] It is generally the norm that solutes tend to have a higher degree of solubility at higher temperatures; hence, a good solvent for crystallization will dissolve more precursors when hot, and while cooling down induces supersaturation commencing the crystallization. On the other hand, a decrease of solute solubility in solvents with increasing temperature (i.e. inverse temperature or retrograde solubility) is a rare occurrence that is only displayed by a few materials.[22]

In this example it is shown that MAPbX$_3$ perovskites exhibit inverse temperature solubility behavior in certain solvents. This novel phenomenon in hybrid perovskites enabled us to design an innovative crystallization method for these materials, referred to here as inverse temperature crystallization (ITC), to rapidly grow high-quality size- and shape-controlled single crystals of both MAPbBr$_3$ and MAPbI$_3$, at a rate that is an order of magnitude faster than the previously reported growth methods.[17-21] The versatility of this approach provides the continuous enlargement of crystals, through replacement of the depleted growth solution, and the use of templates for controlling their shapes.

Results

Hybrid Perovskite Single Crystals' Growth and Structural Characterization.

We noticed the rapid formation of small MAPbBr$_3$ perovskite precipitates at high temperatures in some concentrated solutions (e.g. DMF) and not in others (e.g. DMSO). On the other hand, GBL could not be used as a solvent because of the very low solubility of MAPbBr$_3$ (<0.05 g ml$^{-1}$ at both room temperature and 80° C.). The effect of the different solvents could be related to their varying degrees of coordination with the precursors, as it was previously reported that DMSO may retard the crystallization process due to its strong binding to the lead precursor.[23-25]

Consequently, DMF was chosen for MAPbBr$_3$ ITC. Through studying the solubility of MAPbBr$_3$ in DMF, we observed, that it drops dramatically from 0.80±0.05 g ml$^{-1}$ at room temperature to 0.30±0.05 g ml$^{-1}$ at 80° C. This inverse solubility phenomenon was used to crystallize MAPbX$_3$ rapidly in hot solutions as illustrated in FIG. 1.1A. Through balancing both temperature and concentration of precursors in DMF, only a few crystals were formed. For instance, by setting the temperature of the heating bath at 80° C. usually <5 crystals are formed in case of 1 M solution of PbBr$_2$ and MABr (FIG. 1.5). Inspired by this observation, we repeated the same procedure and studied different solvents that could lead to the same effect in MAPbI$_3$. Unlike MAPbBr$_3$, ITC of MAPbI$_3$ was only possible in GBL solution, while no precipitates were observed in the case of DMF or DMSO.

As expected, we observed that the crystallization process in both MAPbBr$_3$ and MAPbI$_3$ is reversible and the crystals dissolve back when cooled to room temperature. It is also worth mentioning that individual precursors PbX$_2$ and MAX did not show any inverse solubility behavior (i.e. saturated solutions of the individual precursor did not show precipitation upon heating), implying that the phenomenon is tied to the perovskite structure.

The growth process of MAPbI$_3$ crystal by ITC technique was recorded on video using time-accelerated mode, several snapshots of which are shown in FIG. 1.1B. Individual MAPbI$_3$ crystal was calculated to grow at a rate of ~3 mm$^3$ h$^{-1}$ for the first hour, a rate that significantly increases to ~9 mm$^3$ h$^{-1}$ for the second hour, and ~20 mm$^3$ h$^{-1}$ for the following hour. This value is an order of magnitude greater than the previously reported highest growth rate.[20] An even faster growth rate was observed for MAPbBr$_3$ crystals, reaching up to 38 mm$^3$ h$^{-1}$ for the third hour (FIG. 1.1C); resulting in a higher yield in comparison to MAPbI$_3$. Powder X-ray diffraction (XRD) patterns of the ground crystals demonstrate pure perovskite phase for both MAPbBr$_3$ and MAPbI$_3$ (FIGS. 1.1D, 1.1E). Single crystal XRD (SCXRD) analysis showed a good match with previous single crystals grown at room temperature using anti-solvent vapor-assisted crystallization[17] (Table 1.1). Single crystals of both materials have been obtained and their unit cells have been verified by single crystal X-ray diffraction. The unit cell dimensions as well as the space groups (cubic, space group Pm3m, a=5.9173 (6) Å for MAPbBr$_3$ and tetragonal, space group I4/m, a=b=8.8310 (5) Å, c=12.6855 (7) Å for MAPbBr$_3$) are in excellent agreement with literature reports[17, 19, 21]. Scanning electron microscopy images of the cleaved crystals show the absence of any grain-boundaries, indicating the single crystalline nature of both crystals (FIGS. 1.6A-D).

TABLE 1.1

Single Crystal XRD data

| Compound | MAPbBr$_3$ | MAPbI$_3$ |
|---|---|---|
| D$_{calc.}$/g cm$^{-3}$ | 3.582 | 3.947 |
| μ/mm$^{-1}$ | 55.601 | 105.893 |
| Max Size/mm | 0.98 | 0.58 |
| Mid Size/mm | 0.09 | 0.56 |
| Min Size/mm | 0.05 | 0.53 |
| T/K | 250 (2) | 250 (2) |
| Crystal System | cubic | tetragonal |
| Space Group | Pm3m | I4/m |
| a/Å | 5.9173 (6) | 8.8310 (5) |
| b/Å | 5.9173 (6) | 8.8310 (5) |
| c/Å | 5.9173 (6) | 12.6855 (7) |
| α/° | 90 | 90 |
| β/° | 90 | 90 |
| γ/° | 90 | 90 |
| V/Å$^3$ | 207.19 (6) | 989.30 (12) |
| Z | 1 | 4 |
| Z' | 0.02083 | 0.125 |
| Θ$_{min}$/° | 10.617 | 6.981 |
| Θ$_{max}$/° | 71.520 | 72.151 |
| Measured Refl. | 1572 | 2093 |
| Independent Refl. | 64 | 278 |
| Reflections Used | 64 | 274 |
| R$_{int}$ | 0.0659 | 0.0971 |
| Parameters | 4 | 9 |
| Restraints | 0 | 0 |
| Largest Peak | 4.507 | 8.090 |
| Deepest Hole | −6.787 | −17.741 |
| GooF | 1.336 | 1.491 |
| wR$_2$ (all data) | 0.2197 | 0.3021 |
| wR$_2$ | 0.2197 | 0.3010 |
| R$_1$ (all data) | 0.0868 | 0.1034 |
| R$_1$ | 0.0868 | 0.1029 |

Further growth of the crystal was achieved by carefully removing the crystal and placing it in a fresh 1 M solution of the precursors (FIG. 1.2A). We observed a possible shape control of the crystal by the geometry of crystallization vessel. Hence, single crystals of MAPbBr$_3$ and MAPbI$_3$ were synthesized with a number of different shapes by changing the geometry of the vessel in which crystallization takes place (FIG. 1.2B).

Optical and Transport Properties of Hybrid Perovskite Single Crystals.

Further, we investigated optical and transport properties of the crystals, demonstrating that MAPbX$_3$ obtained by ITC in few hours are comparable quality to previously reported crystals grown in several weeks. From the steady-state absorption measurements a sharp band edge is observed (FIG. 1.3A-B). Band gaps extracted from Tauc plots show values of 2.18 eV and 1.51 eV for MAPbBr$_3$ and MAPbI$_3$, respectively. The band gap values for crystals grown by ITC are in a good agreement with the values reported for single crystals grown at room temperature through antisolvent vapor-assisted crystallization.[17] The photoluminescence peak position of MAPbBr$_3$ and MAPbI$_3$ single crystals is located at 574 nm and 820 nm, respectively, matching the values reported earlier for the same single crystals grown by antisolvent vapor-assisted crystallization.[17]

To investigate the excited-state lifetime of these single crystals, we monitored both the ground-state bleach recovery and the excited stated absorption in the nano- and microsecond time regime using nanosecond transient absorption spectroscopy with broadband capabilities. Two-time components are observed for both single crystals. A fast component of τ≈28±5 ns and τ≈18±6 ns together with a slower decay of τ≈300±26 ns and τ≈570±69 ns were measured for MAPbBr$_3$ and MAPbI$_3$ crystals, respectively.

These measured surface (fast component) and bulk (slow component) carrier lifetimes are in good agreement with the ones reported recently for the same kinds of single crystals.[17]

The carrier mobility $\mu$ ($\mu=\mu_P\approx\mu_n$, where $\mu_P$ and $\mu_n$ are hole and electron mobility, respectively, as MAPbX$_3$ is an intrinsic semiconductor)[26] of MAPbX$_3$ (X=Br$^-$, I$^-$) was estimated from the dark current-voltage characteristics, following the standard space charge limited current (SCLC) model. The I-V traces showed the Mott gurney's power law dependence, for instance, an Ohmic region at the lower and an SCLC at higher bias. A quadratic dependence of the transition from the Ohmic to Child's law through the trap filled limit (TFL) was observed in both MAPbBr$_3$ and MAPbI$_3$ crystals. The carrier mobilities and the trap densities ($n_{traps}$) were estimated to be 24.0 cm$^2$ V$^{-1}$ s$^{-1}$ and 3×10$^{10}$ cm$^{-3}$ for MAPbBr$_3$ crystals (FIG. 1.4C), as well as 67.2 cm$^2$ V$^{-1}$ s$^{-1}$ and 1.4×10$^{10}$ cm$^{-3}$ for MAPbI$_3$ crystals (FIG. 1.4D).

We calculated the carrier diffusion length by combining carrier lifetime with mobility $L_D=\sqrt{\mu k_E T/e}$, (where $k_B$ is Boltzmann's constant and T is the samples temperature). By using the longer carrier lifetime (bulk component), a best-case carrier diffusion length was calculated to be ~4.3 m for MAPbBr$_3$ and ~10.0 m for MAPbI$_3$. A worst-case diffusion length could be estimated from the shorter carrier lifetime, corresponding to the surface component: ~1.3 m and ~1.8 m for MAPbBr$_3$ and MAPbI$_3$, respectively. Hence, despite the rapid rate with which crystals were grown via ITC, their transport characteristics together with trap-state densities are comparable to single crystals prepared by classical techniques, which were grown over a much longer period of time.

Discussion

We observed experimentally that perovskite crystals formed in the precursor solution at elevated temperatures dissolved back when the solution temperature was decreased to room temperature. This observation demonstrates that the thermodynamic stability of a precipitated hybrid perovskite compound has seemingly paradoxical temperature dependence, since simple monomolecular compounds are expected to dissolve at higher temperatures. Therefore, it is instructive to analyze how such a situation may arise. We hypothesize that this phenomenon might be related to the formation of complexes of precursors (whose nature is not the subject of this report and is under intensive study) or their products with the solvent.[23,27,28] The theory presented below illustrates how these complexes can affect the temperature dependent stability of the precipitate and reverse its effect depending on the different parameters of the system.

Suppose there is only one type of molecular precursor controlling the crystallization of a complex compound such as a perovskite. Then the formation of complexes involving the precursor molecule and solvent molecules may significantly affect the precipitation of material. To illustrate this situation we analyze the thermodynamic stability of a monomolecular precipitate made of molecules A in the solution, where molecules A can form complexes with solvent molecules; the complex's binding energy being $\varepsilon_C$. As an ultimate stable state always contains only one precipitated particle, and to avoid secondary issues related to crystal facets, we assume that a single precipitated A-particle is placed in a unit volume of solution and has a spherical shape.

In general, the stability of precipitated solids in a solution is determined by several conditions based on the balance of chemical potentials of all its molecular or atomic constituents present in the solution and the solid form. These conditions must also take into account the presence of complexes formed by the constituents in the solution. In our case these conditions are the equality of the chemical potentials of A-molecules in the particle and solution (i.e. $\mu_P=\mu_A$), and of the complex's chemical potential, $\mu_C$, and the sum of chemical potentials for all complex constituents (one A-molecule and j solvent molecules), namely $\mu_C=j\mu_S+\mu_A$. Expressed in terms of concentrations and binding energies these conditions read (additional detail below).

$$-\varepsilon + \gamma \cdot \frac{2\gamma}{R} = T \cdot \ln(v_A \cdot n_A) \qquad (1)$$

$$-\varepsilon_C + T \cdot \ln(v_C \cdot n_C) = jT \cdot \ln(v_S \cdot n_S) + T \cdot \ln(v_A \cdot n_A),$$

where, $\varepsilon$ is the cohesive energy of A-molecule in the particle, $\gamma$ is the surface energy per A-molecule, R is the particle radius measured in terms of the characteristic inter-molecular distance, T is the solution temperature, $n_C$ and $n_A$ are the number concentrations in the solution; and $v_C$, $v_A$, and $v_S$ are the characteristic volumes of the complex, A-molecule and solvent molecule, respectively. Resolving equations (1) with respect to concentrations gives $$n_A = \frac{1}{v_A}\exp\left(\frac{1}{T}\left(-\varepsilon + \gamma \cdot \frac{2}{R}\right)\right) \qquad (2)$$

$$n_C = \frac{1}{v_C}(n_S v_S)^j \exp\left(\frac{1}{T}\left(\varepsilon_C - \varepsilon + \gamma \cdot \frac{2}{R}\right)\right)$$

To simplify the analysis we consider the limit when the particle size is large enough, i.e. far from its critical value. In that case, the surface energy contributions in the exponents of equations (2) can be neglected, i. e. we take the limit $\gamma\rightarrow 0$. The total number concentration $m_C$ of all A-molecules consists of the part $n_P$ forming the particle, the part $n_C$ forming complexes, and the part $n_A$ of individual molecules in the solution such that $m_A=n_P+n_C+n_A$. Using these constraints and equations (2) we obtain for the number fraction of precipitated A-molecules, $n_P v_A$ $$n_P v_A \approx m_A v_A - \frac{v_A}{v_C}(n_S v_S)^j \exp\left(\frac{\varepsilon_C - \varepsilon}{T}\right) - \exp\left(-\frac{\varepsilon}{T}\right) \qquad (3)$$

To illustrate the effect of temperature upon $n_P$ it is convenient to analyze the derivative of equation (3)

$$v_A \frac{dn_P}{dT} = \frac{1}{T^2} \cdot \exp\left(-\frac{\varepsilon}{T}\right) \cdot \left(-\varepsilon + \frac{v_A}{v_C} \cdot (n_S v_S)^j \cdot (\varepsilon_C - \varepsilon) \cdot \exp\left(\frac{\varepsilon_C}{T}\right)\right) \qquad (4)$$

If $dn_P/dT<0$ then it would mean that the precipitated mass (i.e. A-particle size) decreases with increasing temperature—the situation typically observed for most materials precipitating from solution. In contrast, if $dn_P/dT>0$ an interesting situation occurs in which an increase in temperature results in an increase of the precipitated number of A-molecules, as observed experimentally for hybrid perovskites. This effect, as can be seen from equation (4), takes place if $$\varepsilon_C > \varepsilon \cdot \left(1 + \frac{v_C}{v_A} \cdot (n_S v_S)^{-j} \cdot \exp\left(-\frac{\varepsilon_C}{T}\right)\right), \quad (5)$$

or, if we accept that $$\frac{v_C}{v_A} \cdot (n_S v_S)^{-j} \cdot \exp\left(-\frac{\varepsilon_C}{T}\right) << 1$$

(i.e. large enough $\varepsilon_C/T$ ratio) then the inequality given by equation (5) reduces to $\varepsilon_C > \varepsilon$. These analytical relation can be further understood in physical terms as follows: at low temperatures most of the A-molecules are bound in the complexes with the solvent, therefore, the solution has no supersaturation in terms of concentration of unbound A-molecules. When the temperature increases the concentration of unbound A-molecules increases (due to dissociation of the complexes) and may reach the supersaturation, thus triggering the precipitation of A-particles. Conversely, when the temperature of the solution containing the precipitated A-particle is decreased, the concentration $n_A$ of unbound A-molecules is also decreased due to formation of many more complexes with solvent. This decrease in $n_A$ makes the solution too diluted in A-molecules such that the particle has to transfer some molecules to the solution, i.e. it dissolves. It should be noted that the process of crystallization is endothermic with respect to A-molecules, as a molecule moves from the complex with higher binding energy to the precipitate, where its binding (cohesive) energy is lower. Therefore, the crystallization reaction consumes thermal energy.

The temperature behavior described by equation (5) provides a qualitative framework to explain the effects observed experimentally for perovskite materials. A quantitative analysis requires a detailed investigation of the molecular content of the precursor solution, a subject of future research.

In summary, we report the novel observation of inverse solubility of hybrid organo-lead trihalide perovskites. A careful choice of solvent, temperature and other parameters made it possible to utilize this method to rapidly grow single crystals of MAPbBr$_3$ and MAPbI$_3$ in hot solutions via ITC. Despite the fact that these crystals grow very fast, they exhibit carrier transport properties comparable to those grown by the usual cooling or antisolvent vapor-assisted crystallization techniques. The "quantum leap" in crystal growth rates in ITC, over the previously reported growth methods so far used for single crystal hybrid perovskites, represents a major breakthrough in the field of perovskite single crystals for enabling the wide applications of these remarkable semiconductor materials.

Additional Information

The free energy of a system of unit volume containing a number ns of solvent molecules in the solution and numbers $n_A$ and $n_C$ of, respectively, isolated A-molecules, and the complexes is $$G = -\varepsilon n_P + \gamma \cdot S_P - \varepsilon_C \cdot n_C T n_C \cdot \ln(n_C v_C) + T n_A \cdot \ln(n_A v_A) + T n_S \cdot \ln(n_S v_S), -T \cdot (n_A + n_S + n_C) \cdot \ln(n_A v_A + n_S v_S + n_C v_C) \quad (1)$$

where $\varepsilon$ is the cohesive energy of A-molecules in the particle, $\gamma$ is the surface energy per molecule, $\varepsilon_C$ is the binding energy of the complexes, $S_P$ is the number of A-molecules on the surfaces of A-particle, T is the solution temperature and $v_S$, $v_C$ and $v_A$ are the characteristic volumes of the solvent molecule, the complex, and the A-molecule, respectively. It is convenient to introduce total concentrations of A- and solvent molecules $m_A = n_A + n_P + n_C$ and $m_S = n_S + j \cdot n_C$, respectively, where j is the number of solvent molecules in the A-solvent complex. Expressing ns and $n_A$ in terms of the total concentrations allows rewriting equation (1) in the form $$G = -\varepsilon n_P + \gamma \cdot S_P - \varepsilon_C \cdot n_C + T n_C \cdot \ln(n_C v_C) + \quad (2)$$
$$T(m_A - n_P - n_C) \cdot \ln((m_A - n_P - n_C) v_A) +$$
$$T(m_S - j n_C) \cdot \ln((m_S - j n_C) v_S) - T(m_A + m_S - n_P - j n_C) \cdot$$
$$\ln(v_A m_A + v_S m_S - v_A n_P + n_C \cdot (v_C - V_A - j v_S))$$

We are interested in both the equilibrium size of A-particles and the concentration $n_C$ of A complexes with solvent. Therefore we choose $n_P$ and $n_C$ as independent variables. Minimization of the free energy with respect to these variables leads to the equations $$\frac{\partial G}{\partial n_P} = -\varepsilon + \gamma \cdot \frac{2}{R} - T \cdot \ln(n_A v_A) = 0 \quad (3)$$
$$\frac{\partial G}{\partial n_C} = -\varepsilon_C + T \cdot \ln(n_C v_C) - T \cdot \ln(n_A v_A) - jT \cdot \ln(n_S v_S) = 0$$

The first line gives an equality of the chemical potentials of A-molecules in the particle $\mu_{AP} = -\varepsilon + 2\gamma/R$ and in the solution $\mu_{AS} = T \cdot \ln(n_A v_A)$. The second line states that chemical potential of the complex is equal to the sum of chemical potentials of A-molecule and j solvent molecules involved in complex formation $\mu_{SS} = T \cdot \ln(n_S v_S)$. Solving the equations $$-\varepsilon + \gamma \cdot \frac{2}{R} = T \cdot \ln(n_A v_A) \quad (4)$$
$$-\varepsilon_C + T \cdot \ln(n_C v_C) = T \cdot \ln(n_A v_A) + jT \cdot \ln(n_S v_S)$$

with respect to $n_A$ and $n_C$ gives $$n_A = \frac{1}{v_A} \exp\left(\frac{1}{T}\left(-\varepsilon + \gamma \cdot \frac{2}{R}\right)\right) \quad (5)$$
$$n_C = \frac{1}{v_C} (n_S v_S)^j \exp\left(\frac{1}{T}\left(\varepsilon_C - \varepsilon + \gamma \cdot \frac{2}{R}\right)\right)$$

These equations contain the particle radius R, which can be expressed in terms of $n_P$. Therefore, these equations can be solved numerically. However, we can understand qualitatively the temperature effect on $n_P$ by considering the particle size to be far from its critical value (where the surface energy is really important) when we may set $\gamma \approx 0$. In that limit the number fraction of precipitated molecules is $$n_P v_A = m_A v_A - \frac{v_A}{v_C} (n_S v_S)^j \exp\left(\frac{(\varepsilon_C - \varepsilon)}{T}\right) - \exp\left(-\frac{\varepsilon}{T}\right). \quad (6)$$

Methods

Chemicals and Reagents.

Lead bromide (≥98%), lead iodide (99.999% trace metal basis), DMF (anhydrous, 99.8%) and GBL (≥99%) were purchased from Sigma Aldrich. MABr and MAI were purchased from Dyesol Limited (Australia). All salts and solvents were used as received without any further purification.

Synthesis of $MAPbX_3$ Single Crystals.

1 M solution containing $PbX_2$ and MAX was prepared in DMF or GBL for X=Br$^-$, I$^-$ respectively. The bromide solution was prepared at room temperature whereas the iodide solution was heated up to 60° C. The solutions were filtered using PTFE filter with 0.2 m pore size. 2 ml of the filtrate were placed in a vial and the vial was kept in an oil bath undisturbed at 80° C. and 110° C. for Br-based and I-based perovskites, respectively. All procedures were carried out under ambient conditions and humidity 55-57%. The crystals used for measurements were grown for 3 hours. The reaction yield for $MAPbBr_3$ and $MAPbI_3$ was calculated to be 35 wt. % and 11 wt. %, respectively.

Measurement and Characterization.

Powder X-Ray diffraction was performed on a Bruker AXS D8 diffractometer using Cu-Kα radiation. SCXRD was performed on Bruker D8 Venture, CMOS detector, micro-focus copper source. The steady-state absorbance and photoluminescence were recorded using Cary 6000i spectrophotometer with an integrating sphere, and Edinburgh Instrument spectrofluorometer, respectively. Time-resolved transient absorption decays were measured with a femto-nanoseconds pump-probe setup. The excitation pulse at 480 nm was generated using a spectrally tunable optical Parametric Amplifier (Light Conversion LTD) integrated to a Ti:sapphire femtosecond regenerative amplifier operating at 800 nm with 35 fs pulses and a repetition rate of 1 kHz. The white light probe pulse, on the other hand, was generated by a super continuum source.[29,30] The pump and probe beams were overlapped spatially and temporally on the sample, and the transmitted probe light from the samples was collected and focused on the broad-band UV-visible-near-IR detectors to record the time-resolved excitation-induced difference spectra. Current-Voltage characteristics were carried out in the dark under vacuum (~$10^{-4}$ mbar) at 300 K, in the simple two electrode configuration (Au/$MAPbX_3$/Au). The perovskite crystal was sandwiched between the rectangular electrodes (3 mm×2 mm) Au (100 nm), deposited on both sides of the single crystal, by an Angstrom thermal evaporator at a 0.5 Å s$^{-1}$ deposition rate. The thickness and rate of deposition during the evaporation of Au contact was monitored by an Inficon thickness monitor. The thickness of $MAPbBr_3$ and $MAPbI_3$ crystals were measured as 2.32 mm and 2.49 mm respectively, by the digital Vernier caliper. The typical non-linear dark current, voltage plots followed the Lampert's theory, where the current was found to be limited by the trap assisted space charge conduction. Onset voltage ($V_{TFL}$) for the TFL was used for the calculation (equation (6)) of density of traps ($n_{traps}$) in the perovskite crystals.

$$n_{traps} = 2\varepsilon\varepsilon_o V_{TFL}/qd^2 \quad (6)$$

Where q is the electronic charge, d is the thickness of the crystal, ε is the dielectric constant of the material (25.5 for $MAPbBr_3$ and 32 for $MAPbI_3$)[19,31], and $\varepsilon_o$ being the vacuum permittivity.

Further Description of Selected Figures

FIGS. 1.1A-E. illustrate crystal growth process and powder X-ray diffraction. FIG. 1.1A is a schematic representation of the ITC apparatus in which the crystallization vial is immersed within a heating bath. The solution is heated from room temperature and kept at an elevated temperature (80° C. for $MAPbBr_3$ and 110° C. for $MAPbI_3$) to initiate the crystallization. (1.1B-C) $MAPbI_3$, and $MAPbBr_3$ crystal growth at different time intervals. (1.1D-E) Powder XRD of ground $MAPbBr_3$ and $MAPbI_3$ crystals. Insets: pictures of the corresponding crystals grown within a non-constraining vessel geometry.

FIGS. 1.2A-B illustrate continuous growth and crystal shape-control. FIG. 1.2A shows continuous growth of an $MAPbBr_3$ crystal by moving the crystal into a larger vial with a fresh growth solution. FIG. 1.2B shows shape-controlled crystals of $MAPbBr_3$ and $MAPbI_3$ by varying the geometry of the confining vessel. From left to right—growth in a round-bottom test tube and a 2 mm cuvette.

FIGS. 1.3A-B illustrate steady-state absorption and photoluminescence. FIG. 1.3A is a $MAPbBr_3$ single crystal; FIG. 1.3B is a $MAPbI_3$ single crystal. Insets: corresponding Tauc plots displaying the extrapolated optical band gaps.

FIGS. 1.4A-D illustrate carrier lifetime measurements and current-voltage traces. 1.4A-B show transient absorption of (FIG. 1.4A) $MAPbBr_3$ and (FIG. 1.4B) $MAPbI_3$ crystals. FIGS. 1.4C-D show Current-Voltage characteristics (I-V) of perovskite crystals exhibiting different regions obtained from the log I vs. log V plots. The regions are marked for Ohmic (I $\alpha V^{n=1}$), TFL (I$\alpha V^{n>3}$), and Child's regime (I$\alpha V^{n=2}$). The trap densities were calculated from the Child's regime shown in FIGS. 1.4C-D.

FIG. 1.5 is a picture of crystallization setup. This picture demonstrates, that all 8 vessels containing 1 M MAPbBr3 in DMF produced less than 5 crystals, in particular, 3 of them produced an individual MAPbBr3 crystal.

FIGS. 1.6A-D are SEM images of the surface and cleaved crystals. SEM of (FIG. 1.6A) surface of MAPbBr3, (FIG. 1.6B) cleaved MAPbBr3, (FIG. 1.6C) surface of MAPbI3 and (FIG. 1.6D) cleaved MAPbI3 are shown. Excess precursors from solution can be observed on the surface of the crystals. No grain boundaries are found on the surface or core of cleaved crystals indicating the single crystalline nature of both crystals. The dusts in FIGS. 1.6B and 1.6D indicate the good focus of electron beam.

REFERENCES, EXAMPLE 1

1. Docampo P, Ball J M, Darwich M, Eperon G E, Snaith H J. Efficient organometal trihalide perovskite planar-heterojunction solar cells on flexible polymer substrates. *Nat. commun.* 4, 2761 (2013).
2. Kim H S, et al. Mechanism of carrier accumulation in perovskite thin-absorber solar cells. *Nat. commun.* 4, 2242 (2013).
3. Stranks S D, et al. Electron-hole diffusion lengths exceeding 1 micrometer in an organometal trihalide perovskite absorber. *Science* 342, 341-344 (2013).
4. Mei A, et al. A hole-conductor-free, fully printable mesoscopic perovskite solar cell with high stability. *Science* 345, 295-298 (2014).
5. Christians J A, Fung R C M, Kamat P V. An inorganic hole conductor for organo-lead halide perovskite solar cells. improved hole conductivity with copper iodide. *J. Am. Chem. Soc.* 136, 758-764 (2014).
6. Liu D, Yang J, Kelly T L. Compact layer free perovskite solar cells with 13.5% efficiency. *J. Am. Chem. Soc.* 136, 17116-17122 (2014).

7. Nie W, et al. High-efficiency solution-processed perovskite solar cells with millimeter-scale grains. *Science* 347, 522-525 (2015).
8. Choi J J, Yang X, Norman Z M, Billinge S J L, Owen J S. Structure of methylammonium lead iodide within mesoporous titanium dioxide: active material in high-performance perovskite solar cells. *Nano Lett.* 14, 127-133 (2014).
9. Xing G, et al. Low-temperature solution-processed wavelength-tunable perovskites for lasing. *Nat. Mater.* 13, 476-480 (2014).
10. Tan Z-K, et al. Bright light-emitting diodes based on organometal halide perovskite. *Nat. Nano.* 9, 687-692 (2014).
11. Dou L, et al. Solution-processed hybrid perovskite photodetectors with high detectivity. *Nat. Commun.* 5, 5404, (2014).
12. Chen Y-S, Manser J S, Kamat P V. All solution-processed lead halide perovskite-BiVO4 tandem assembly for photolytic solar fuels production. *J. Am. Chem. Soc.* 137, 974-981 (2015).
13. Xing G, et al. Long-range balanced electron- and hole-transport lengths in organic-inorganic $CH_3NH_3PbI_3$. *Science* 342, 344-347 (2013).
14. Noh J H, Im S H, Heo J H, Mandal T N, Seok S I. Chemical management for colorful, efficient, and stable inorganic-organic hybrid nanostructured solar cells. *Nano Lett.* 13, 1764-1769 (2013).
15. Filip M R, Eperon G E, Snaith H J, Giustino F. Steric engineering of metal-halide perovskites with tunable optical band gaps. *Nat. commun.* 5, 5757 (2014).
16. D'Innocenzo V, Kandada A R S, De Bastiani M, Gandini M, Petrozza A. Tuning the light emission properties by band gap engineering in hybrid lead halide perovskite. *J. Am. Chem. Soc.* 136, 17730-17733 (2014).
17. Shi D, et al. Low trap-state density and long carrier diffusion in organolead trihalide perovskite single crystals. *Science* 347, 519-522 (2015).
18. Stoumpos C C, Malliakas C D, Kanatzidis M G. Semiconducting tin and lead iodide perovskites with organic cations: phase transitions, high mobilities, and near-infrared photoluminescent properties. *Inorg. Chem.* 52, 9019-9038 (2013).
19. Dong Q, et al. Electron-hole diffusion lengths >175 m in solution-grown $CH_3NH_3PbI_3$ single crystals. *Science* 347, 967-970 (2015).
20. Dang Y, et al. Bulk crystal growth of hybrid perovskite material $CH_3NH_3PbI_3$. *Cryst. Eng. Comm.* 17, 665-670 (2015).
21. Baikie T, et al. Synthesis and crystal chemistry of the hybrid perovskite ($CH_3NH_3$) $PbI_3$ for solid-state sensitised solar cell applications. *J. Mater. Chem. A* 1, 5628-5641 (2013).
22. Söhnel O, Novotný. P, *Densities of Aqueous Solutions of Inorganic Substances*. Elsevier, Amsterdam, (1985).
23. Wu Y, et al. Retarding the crystallization of $PbI_2$ for highly reproducible planar-structured perovskite solar cells via sequential deposition. *Energy Environ. Sci.* 7, 2934-2938 (2014).
24. Miyamae H, Numahata Y, Nagata M. The crystal structure of lead(II) iodide-dimethylsulphoxide(1/2), $PbI_2$ $(dmso)_2$. *Chem. Lett.* 9, 663-664 (1980).
25. Wakamiya A, et al. Reproducible fabrication of efficient perovskite-based solar cells: X-ray crystallographic studies on the formation of $CH_3NH_3PbI_3$ layers. *Chem. Lett.* 43, 711-713 (2014).
26. Giorgi G, Yamashita K. Organic-inorganic halide perovskites: an ambipolar class of materials with enhanced photovoltaic performances. *J Mater Chem A*, doi: 10.1039/C4TA05046K (2015).
27. Stamplecoskie K G, Manser J S, Kamat P V. Dual nature of the excited state in organic-inorganic lead halide perovskites. *Energy Environ. Sci.* 8, 208-215 (2015).
28. Jeon N J, Noh J H, Kim Y C, Yang W S, Ryu S, Seok S I. Solvent engineering for high-performance inorganic-organic hybrid perovskite solar cells. *Nat. Mater.*, 13, 897-903 (2014).
29. Bose R, et al. Direct femtosecond observation of charge carrier recombination in ternary semiconductor nanocrystals: the effect of composition and shelling. *J. Phys. Chem. C* 119, 3439-3446 (2015).
30. Mohammed O F, Xiao D, Batista V S, Nibbering ETJ. Excited-State Intramolecular Hydrogen Transfer (ESIHT) of 1,8-Dihydroxy-9,10-anthraquinone (DHAQ) Characterized by Ultrafast Electronic and Vibrational Spectroscopy and Computational Modeling. *J. Phys. Chem. A* 118, 3090-3099 (2014).
31. Poglitsch A, Weber D. Dynamic disorder in methylammoniumtrihalogenoplumbates (II) observed by millimeter-wave spectroscopy. *J. Chem. Phys.* 87, 6373-6378 (1987).

Example 2

Single crystals of hybrid perovskites have shown remarkably improved physical properties compared to their polycrystalline film counterparts, underscoring their importance in the further development of advanced semiconductor devices. Here we present a new method of growing sizeable $CH_3NH_3PbCl_3$ single crystals based on retrograde solubility behavior of hybrid perovskites. We show, for the first time, the energy band structure, charge recombination and transport properties of $CH_3NH_3PbCl_3$ single crystal. These crystals exhibit trap-state density, charge carriers concentration, mobility and diffusion length comparable with the best quality crystals of methylammonium lead iodide or bromide perovskites reported so far. The high quality of the crystal along with its suitable optical band gap enabled us to build an efficient visible-blind UV-photodetector, demonstrating its potential in optoelectronic applications.

In the last few years, organo-lead halide perovskites $MAPbX_3$ (MA=$CH_3NH_3$, X=$Cl^-$, $Br^-$, or $I^-$) have drawn the attention of many scientists due to their attractive optical and electrical properties, together with their moderate cost and low-temperature solution-processability.[1-7] These merits make them one of the most promising candidates for the industrial development of next-generation optoelectronic devices. In particular, $MAPbI_3$ and $MAPbBr_3$ showed strong optical absorption coefficients across the visible spectra,[8] combined with balanced and long-range electron-hole diffusion lengths[9] and low trap-state densities,[10,11] resulting in broad employment of these materials in high efficiency solar cells,[12-17] light emitting diodes,[18,19] lasers[20,21] and photodetectors.[22-24]

Optical and electrical studies conducted on single crystals of organo-lead bromide and iodide perovskites[11,25] revealed that the properties are considerably enhanced in single crystals, compared to their polycrystalline thin film counterparts. This property enhancement is reflected by the absence of absorption peak near the band gap of the crystals, which indicates more order and long-range structure.[11] Moreover, charge carrier lifetime in single crystal are longer due to lower trap-induced recombination rate (357 ns for MAPbBr₃ single crystal and 168 ns for the polycrystalline thin films)[11]. In terms of diffusion length, it was reported that there is two orders of magnitude increase from 1 μm (films) to 175 μm (crystals)[25]. Hence, the growth of MAPbX₃ crystals from solution is of key importance towards the advancement of perovskite-based applications.

Very recently we have reported the fast solution-based crystal growth of MAPbI₃ and MAPbBr₃ by inverse temperature crystallization (ITC),[26] overcoming the time-consuming conventional crystallization methods such as the typical cooling[27] or antisolvent vapor-assisted crystallization techniques.[11] The optical and transport properties of these ITC grown crystals were comparable to the crystals grown over a much longer period of time.

However, for MAPbCl₃ single crystals grown by the traditional crystallization techniques,[28,29] only structural characterization was carried out, showing the temperature-dependent phase transitions of the material,[29-31] while the electrical characterization was limited to the phase-dependent dielectric permittivity investigation.[28,29] Moreover, up to date, optical absorption and emission spectra of MAPbCl₃ single crystal have not been reported. Exploring the optical and electrical properties of the wide band gap MAPbCl₃ single crystal may provide a better understanding of the chloride-based perovskite in the development of optoelectronic devices, in particular, visible-blind UV-detectors.

We report here the ITC of MAPbCl₃ through selecting an appropriate solvent mixture. We investigated the electrical and optical properties to estimate, for the first time, the energy band levels and a number of important semiconducting figures of merit such as charge carrier mobility, exciton lifetime and diffusion length. All these parameters are essential for the utilization of this material in practical applications. Furthermore, we exploited the optical and charge-transport properties of MAPbCl₃ single crystals to design the first UV-photodetector based on organo-lead chloride perovskite single crystal, with high ON-OFF current ratio, fast photoresponse, and long-term photostability.

High purity along with minimum structural defects are well known to be key factors for the successful application of semiconductors in optoelectronic devices.[32] To this end, particular attention was paid to the synthesis and solution growth process, primarily, to the choice of the solvent. We made several attempts trying to form 1M solution of the precursors by dissolving stoichiometric amounts of MACl and PbCl₂ in different solvents; we figured out that while the mixture of the two precursors were likely to dissolve in dimethylsulfoxide (DMSO), without showing any retrograde solubility, only small amount of precursors dissolved in N,N-dimethylformamide (DMF). We hypothesized that a mixture of DMSO and DMF might initiate the retrograde solubility behavior of MAPbCl₃. Accordingly, highly concentrated solution (1M) of the precursors with retrograde solubility behavior was achieved through balancing the ratio of DMF to DMSO.

FIG. 2.1A shows the solubility of MAPbCl₃ powder in a mixture of DMSO-DMF (1:1 v/v), clearly demonstrating the decrease of solubility at elevated temperatures. Next, we optimized crystallization temperature and precursors concentration to form only a few nuclei/crystals. The optimized synthesis and growth processes as well as the solubility test procedure are described in detail in the Methods section. Inset of FIG. 2.1A shows a highly transparent and colorless MAPbCl₃ crystal grown by ITC, with a parallelepiped shape and typical dimensions of 2×4×4 mm³. Powder X-ray diffraction (PXRD) of the ground crystal confirmed pure single-phase of cubic MAPbCl₃ perovskite (FIG. 2.1B) with lattice constant a=5.67 Å, showing consistency with the previously reported PXRD data of the same single crystals obtained through the conventional crystallization technique.[33]

Further, we studied optical properties of the MAPbCl₃ crystal. Crystals exhibit a sharp absorption edge at 435 nm and photoluminescence (PL) peak at 440 nm (FIG. 2.2A), notably red-shifted compared to MAPbCl₃ thin films, which show optical absorption edge at 399 nm and PL peak at 408 nm.[34] These findings are in good agreement with recent studies on MAPbBr₃ and MAPbI₃ where single crystalline samples possess a narrower band gap and a subsequent red-shifted PL peak, compared to their thin film counterparts, suggesting lower trap densities due to a higher-dimensional structurally coherent units that are more tight in the single crystal compared to their polycrystalline counterparts, while the low-dimensional units which could be present in thin films are known to emit at lower wavelength.[11] In addition it has been reported that larger crystallite size results in red-shifted PL.[35]

From photo-electron spectroscopy in air (PESA) measurement, we estimated the valence band maxima (VBM) of MAPbCl₃ to be −5.82 eV (FIG. 2.2B). VBM of MAPbBr₃ and MAPbI₃ were previously measured to be −5.68 eV[36] and −5.43 eV,[37] respectively. The monotonic lowering of VBM in MAPbX₃ with descending halogen group (Cl to Br to I) is mainly due to the change of the halogen orbitals participating in the VBM from 3p to 4p to 5p, respectively, which leads to a more covalent bond between the halogen and lead ions.[38] From the VBM and the optical band gap we determined the conduction band edge position of MAPbCl₃ (FIG. 2.2C).

As shown in FIG. 2.3A we also studied recombination property of excitons by transient absorption (TA). We observed both fast (τ ~83 ns) and slow (τ ~662 ns) components of the carrier dynamics, as revealed from a biexponential fit of the TA signal. The fast and slow components are likely associated with the surface and the bulk of the crystal, respectively. These values are comparable to the results presented for MAPbBr₃ and MAPbI₃ single crystals.[11,26]

We studied the charge-transport properties of MAPbCl₃ single crystal in order to evaluate its potential for optoelectronic applications. We formed a capacitor-like device with selective hole injection by sandwiching a MAPbCl₃ single crystal between two Pt electrodes deposited by sputtering, and investigated the evolution of space-charge-limited current (SCLC) under different biases (FIG. 2.3B). At low electric field, an ohmic region is confirmed; we extracted the electrical conductivity (σ) to be $2.7 \times 10^{-8} \Omega^{-1}$ cm$^{-1}$. The I-V characteristics of the crystal change at $V_{TFL}$ (at 9.8 V) where the current exhibits a sharp rise ($I \propto V^{n>3}$), indicating the transition into the trap-filled limit (TFL), where all the trap states are occupied by the charge carriers.[39] Exploiting the linear dependence between $V_{TFL}$ and the trap density ($n_{traps}$), $$n_{traps} = \frac{2\varepsilon\varepsilon_0 V_{TFL}}{eL^2}$$

where ε (23.9)[29] and ε₀ are the dielectric constant of MAPbCl₃ and the vacuum permittivity respectively, L is the thickness of the crystal and e is the elementary charge, we estimated the trap density $n_{traps}$ to be $\sim 3.1 \times 10^{10}$ cm$^{-3}$. At higher bias, the current shows a quadratic dependence ($I \propto V^2$). Fitting with the Mott-Gurney law, $$J_d = \frac{9\varepsilon\varepsilon_0\mu V^2}{8L^3}$$

where $J_d$ is the current density and V is the applied voltage, we extracted the value of the carrier mobility (μ) as (42±9) cm$^2$ V$^{-1}$ s$^{-1}$. The uncertainties represent standard deviation in the measurements based on 5 similar devices. We also estimated the free charge carrier density $n_o=\pi/e\mu$ to be ~4×10$^9$ cm$^{-3}$.

Combining the p value obtained from SCLC and the exciton lifetime τ by TA, we calculated diffusion length (L$_D$), which represents one of the key parameters for designing high-performance optoelectronic devices:

$$L_D = \sqrt{\frac{k_B T \mu \tau}{e}}$$

where $k_B$ is the Boltzmann constant and T is the sample temperature. In particular, we estimated a best-case diffusion length (~8.5 μm) by using the longer carrier lifetime, namely the bulk component, and a worst-case diffusion length (~3.0 μm) by considering the shorter carrier lifetime value, ascribed to the surface of the crystal. All these results are comparable to the ones reported for the best-quality MAPbBr$_3$ and MAPbI$_3$ single crystals.[11,26]

As a prototypical demonstration of optoelectronic devices, we constructed a photodetector based on MAPbCl$_3$ single crystal, taking advantage of the materials large band gap and visible transparency. The device architecture is shown in FIG. 2.4A. A semitransparent Pt layer of 20 nm (with transmittance of 26% at 365 nm) was deposited on the MAPbCl$_3$ perovskite crystal as the top electrode. A layer of 20 nm Ti/100 nm Au was deposited on the opposite side as the bottom electrode. The corresponding band energy diagram is illustrated in FIG. 2.4B. To investigate the photoresponse, the current-voltage (I-V) curves of the device were measured in the dark and under illumination with 365 nm UV light (power intensity of 1 W/cm$^2$) as shown in FIG. 2.4C. At 15 V, the photodetector showed a dark current as low as 4.15×10$^{-7}$ A. Under light illumination, the photocurrent, particularly at high voltage bias, increases drastically, demonstrating a nonlinear and asymmetrical I-V behavior. A photocurrent of 4.7×10$^{-4}$ A was measured at an applied voltage of 15 V. In addition, a slight hysteresis behavior was observed under forward and reverse scans of bias (FIG. 2.7), which is consistent with the reports on other organo-lead halide perovskites, and it is likely due to the voltage-induced drift of ions.[40]

The temporal photoresponse measured at a bias voltage of 15 V is shown in FIG. 2.4D. The current ON-OFF ratio was as high as 1.1×10$^3$. The responsivity (R) was calculated as follows, $$R = \frac{I_{light} - I_{dark}}{P_{light}}$$

where $I_{light}$ is the photocurrent (A), $I_{dark}$ is the dark current (A), and $P_{light}$ is the incident light power (W). At the bias voltage of 15 V, the responsivity of the MAPbCl$_3$ single crystal based photodetector was estimated to be 46.9 mA/W. Detectivity of 1.2×10$^{10}$ Jones was calculated using the formula, $$D = \frac{R}{\sqrt{2qJ_{dark}}}$$

where q is the elementary charge and $J_{dark}$ is the dark current density.

The response speed is another important parameter for photodetectors, which is related to the extraction of the photogenerated charge carriers. The thickness of the MAPbCl$_3$ single crystal was reduced to 300 μm in order to reduce parasitic resistance, which is the limit of our polishing technique (see Methods section for more details). The photo response as a function of time is shown in FIG. 2.5A, demonstrating a rise time (t$_r$) of 24 ms and a decay time (t$_f$) of 62 ms. These response times compare favorably to those reported for UV photodetectors based on TiO$_2$ thin films (rise time: 6 s; decay time: 15 s)[41] and ZnO nanoparticles (rise time: 48 s; decay time: 0.9 s)[42].

Photostability of the MAPbCl$_3$ single crystal photodetector, without encapsulation, was studied at room temperature in ambient air with a humidity level of 55-60%. As illustrated in FIG. 2.5B, at an applied bias of 15 V and under continuous 365 nm light illumination (1 W/cm$^2$), the photocurrent as a function of time remains stable up to 8000 seconds without degradation. The inset of FIG. 2.5B demonstrates the photostability of the same device measure under blue light (1 Sun excitation density). These MAPbCl$_3$ single crystals present high photostability over 12 h. This exceptional device stability can be ascribed to the fact that our single crystal contains very few defects and is free from grain boundary (FIGS. 2.8A-B), which benefits the structural and chemical integrity of the device.

Perovskite-structured oxide single crystals like SrTiO$_3$[43], LaAlO$_3$[44], LiTaO$_3$[45] and LiNbO$_3$[46] as well as their heterostructures[47-49] have been used in UV photodetectors. However, such oxide single crystals are quite expensive and cannot be easily produced in most laboratories. One important advantage of hybrid perovskite single crystals is their solution-based processability. As shown in Table 2.1, our device based on hybrid perovskite single crystal is quite promising compared to those published in literature.

TABLE 2.1

Comparative performance of MAPbCl3 single crystal perovskite with literature.

| Material | λ (nm) | ON-OF ratio | Responsivity | Rise time | Decay time | Reference |
|---|---|---|---|---|---|---|
| ZnO thin film | 380 | 10$^6$ | 0.1 mA/W | 48 s | 0.9 s | 3 |
| TiO$_2$ thin film | 260 | — | 199 A/W | 6 s | 15 s | 4 |
| SrTiO$_3$ single crystal | 330 | — | 213 mA/W | 1.3 ns | — | 5 |
| LaAlO$_3$ single crystal | 200 | — | 71.8 mA/W | — | — | 6 |

TABLE 2.1-continued

Comparative performance of MAPbCl3 single crystal perovskite with literature.

| Material | λ (nm) | ON-OF ratio | Responsivity | Rise time | Decay time | Reference |
|---|---|---|---|---|---|---|
| LiNbO$_3$ single crystal | 300 | — | 17.1 mA/W | 0.5 ns | — | 7 |
| LiTaO$_3$ single crystal | 235 | — | 2 mA/W | 0.2 ns | — | 8 |
| ZnO/SrTiO$_3$ heterostructure | 365 | 10$^3$ | — | — | — | 9 |
| TbMnO$_3$/Nb—SrTiO$_3$ heterostructure | 365 | | — | 510 ns | — | 10 |
| CH$_3$NH$_3$PbCl$_3$ single crystal | 365 | 10$^3$ | 46.9 mA/W | 24 ms | 62 ms | Present work |

In summary, we have demonstrated a simple one step approach to grow high-quality MAPbCl$_3$ crystals through the proper selection of DMSO-DMF solution, which allowed the crystallization to occur in the retrograde solubility regime. The optical and electrical properties of the single crystal were studied; and band structure and charge transport parameters, such as carrier mobility and diffusion length, were determined. The grown MAPbCl$_3$ crystals possess optoelectronic properties that make them attractive candidate semiconductors for visible-blind UV photodetection. We found that MAPbCl$_3$ single crystal-based UV-photodetector provides high detectivity and ON-OFF ratio, with a response time in the order of milliseconds, indicating that hybrid perovskite single crystals are promising to function as the active component in such optoelectronic devices. In addition, the exceptional long-term stability in ambient conditions with 55% humidity suggests a potential for the deployment of MAPbCl$_3$ single crystals in practical applications.

Experimental Methods

Materials.

Methylamine (Sigma Aldrich, 33 wt % in absolute ethanol), hydrochloride acid (Sigma Aldrich, 37 wt % in water), ethanol (Fisher Scientific), diethyl ether (Sigma Aldrich, anhydrous, ≥99%), dimethylsulfoxide (Sigma Aldrich, anhydrous, ≥99.9%), N—N, dimethylformamide (Sigma Aldrich, 99.8%), lead chloride crystalline powder (Alfa Aesar, 99%).

Synthesis of MAC.

MACl was synthesized by reacting methylamine and hydrochloride acid with the molar ratio of 1.2:1 in an ice bath for 2 h whit stirring. It followed vacuum dry at 50° C. for 2 h. The sample was then dissolved in ethanol and filtered using PTFE filter with 0.2 m pore size. MACl powder was subsequently precipitated by adding diethyl ether and dry at 60° C. under vacuum.

Synthesis of MAPbCl$_3$.

A 1M MAPbCl$_3$ solution in DMSO-DMF (1:1 by volume) was prepared by dissolving equimolar amounts of MACl and PbCl$_2$. The solution was then filtered using PTFE filter with 0.2 m pore size. We subsequently split the filtrate into several vials, filling them with 1 ml each, and we grew single crystals from this solution, keeping the vials undisturbed for 6 h in an oil bath at the temperature of 50° C.

Solubility Test.

MAPbCl$_3$ powder was obtained through grinding single crystals prepared from the solution growth method discussed above. 3 ml of the mixture DMSO-DMF (1:1 v/v) were set in a vial placed on a hot plate, while stirring. The system was heated to 120° C. and we started adding small amount of powder, 0.05 g by 0.05 g. Saturation conditions were assumed when the amount of solute did not completely dissolve within 30 minutes after being dropped into the solution. The same process was repeated at different temperatures. Temperature of 0° C. has been investigated in the same manner, but keeping the vial in an ice bath.

The stability of MAPbCl$_3$ is theoretically suggested to be more stable compared to it's I— analogue due to the different binding powers (Zhang et al arXiv:1506.01301 [cond-mat.mtrl-sci]). However, the experimental stability of perovskites in single crystal fashion will be fully studied in a separate manuscript.

Powder X-Ray Diffraction.

XRD was performed on a Bruker AXS D8 diffractometer using Cu-Kα radiation. Powder was prepared grinding some MAPbCl$_3$ crystals obtained with the method discussed above.

Diffuse UV-Vis Absorption.

The steady-state absorbance was recorded using Cary 6000i UV/VIS/NIR spectrophotometer with the external Diffuse Reflectance accessory (DRA).

Photoluminescence.

Steady-state PL was recorded using Edinburgh Instrument spectrofluorometer.

Transient Absorption (TA).

Time-resolved transient absorption decay was measured with an EOS Sub-Nanosecond Transient Absorption Spectrometer (Ultrafast Systems, LLC) utilizing two-channel probe-reference detection method. The excitation pulse at 480 nm was generated using spectrally tunable TOPAS-C Optical Parametric Amplifier (Light Conversion Ltd) integrated to a Spitfire Pro XP Ti:sapphire femtosecond regenerative amplifier operating at 800 nm and producing 35 fs pulses with a repetition rate of 1 kHz (Spectra-Physics). The white light probe pulse, on the other hand, was generated by a supercontinuum source.[1] The pump and probe beams were overlapped spatially and temporally on the sample, and a broad-band UV-VIS-NIR detector was used to collect the transmitted probe light from the sample to record the time-resolved excitation-induced difference spectra (FIG. 2.6).

The pump pulse below the band gap can provide a TA signal by two photon process.[2] However, we repeated the experiment at 380 nm excitation and similar results are obtained. The monitoring wavelength of the TA kinetics is 600 nm.

Photon-Electron Spectroscopy in Air (PESA).

PESA measurement was carried out on the MAPbCl$_3$ single crystal fixed on a glass substrate, using the Riken Photoelectron Spectrometer (Model AC-2). The light correction coefficient was applied for the UV lamp intensity fixed at 50 nW, with the power number of 0.3, during the measurements.

Space Charge Limited Current (SCLC) Measurement.

Hole only devices were obtained by sputter deposition of 80 nm Platinum electrodes on both sides of the MAPbCl$_3$ crystals (2×2×0.85 mm$^3$). The SCLC measurement was performed using Keithley 2635A source-meter in the dark, under vacuum at room temperature.

UV-Photodetector.

Single crystals of MAPbCl$_3$ were mechanically polished to reduce the thickness to approximately 300 µm. Because of the brittle nature of the crystal, it was not possible to reach thickness under the order of micrometers. The current-voltage (I-V) measurements were performed on a probe station connected to a Keithley 4200 semiconducting analyzer. The photoresponse was measured using oscilloscope with monochromatic UV illumination (wavelength: 365 nm; intensity: 1 W/cm$^2$).

Further Description of Selected Figures

FIG. 2.1A shows solubility data for MAPbCl$_3$ powder in DMSO-DMF (1:1 v/v) at different temperatures, showing the monotonic decrease of solubility from (0.40±0.05) g/ml at room temperature, to (0.20±0.05) g/ml at 120° C. Inset—Transparent single crystal grown from MAPbCl$_3$ solution in DMSO-DMF (1:1 v/v) after 48 h in an oil bath at 50° C. (FIG. 2.1B shows PXRD pattern of ground MAPbCl$_3$ crystal.

FIG. 2.2A shows absorption and PL spectra of MAPbCl$_3$ single crystal, which reveals an absorption edge at 435 nm and determines the optical band gap to be 2.88 eV (inset). Excitation wavelength of 294 nm was used to record the PL. FIG. 2.2B illustrates PESA measurement showing the level of the valence band at −5.82 eV. FIG. 2.2C illustrates VBM and CBM of MAPbCl$_3$ single crystals. Energy levels are expressed using the electron energy in vacuum as a reference.

FIG. 2.3A illustrates transient absorption in MAPbCl$_3$, showing a fast component decay time of (83±4) ns and a slow component of (662±44) ns. The monitoring wavelength of the TA kinetics is 600 nm. FIG. 2.3B shows Current-Voltage response of MAPbCl$_3$ single crystal, which shows three different regions: a linear ohmic regime (I∝V, red line) is found at lower voltages. V$_{TFL}$ (=9.8 V) marks the transition into the trap-filled limit (I∝V$^{n>3}$ blue line) which is followed by the Child's regime (I∝V$^2$, green line) at higher voltages.

FIG. 2.4A illustrates the device architecture of the MAPbCl$_3$ single crystal based photodetector. FIG. 2.4B shows an energy band diagram. FIG. 2.4C illustrates photo and dark current-voltage (I-V) curves of the photodetector under illumination with solar-blind UV light (λ=365 nm). FIG. 2.4D shows the ON-OFF photoresponse at a bias voltage of 15 V under modulated UV illumination.

FIG. 2.5A shows time dependent photoresponse. FIG. 2.5B illustrates photostability measured on the single crystal MAPbCl$_3$ photodetector in UV (1 W/cm$^2$), and inset represents data measured under UV light (one sun excitation density).

FIG. 2.8A is a cross-sectional SEM image and FIG. 2.8B shows the surface of CH$_3$NH$_3$PbCl$_3$ single crystal. No grain boundaries are found on the surface of the crystal. The dust in 2.8B indicates good focus of electron beam.

REFERENCES, EXAMPLE 2

(1) Snaith, H. J. Perovskites: the emergence of a new era for low-cost, high-efficiency solar cells. (2013). *J. Phys. Chem. Lett.* 2013, 4, 3623-3630

(2) Christians, J. A.; Fung, R. C. M.; Kamat, P. V. An inorganic hole conductor for organo-lead halide perovskite solar cells: Improved hole conductivity with copper iodide. *J. Am. Chem. Soc.* 2014, 136, 758-764.

(3) Liu, D.; Kelly, T. L. Perovskite solar cells with a planar heterojunction structure preparing using room-temperature solution processing techniques. *Nat. Photonics* 2013, 8, 133-138.

(4) Liang, K.; Mitzi, D. B.; Prikas, M. T. Synthesis and characterization of organic-inorganic perovskite thin films prepared using a versatile two-step dipping technique. *Chem. Mater.* 2013, 4756, 403-411.

(5) You, J.; Hong, Z.; Yang, Y.(M.); Chen, Q.; Cai, M.; Song, T.-B.; Chen, C.-C.; Lu, S.; Liu, Y.; Zhou, H.; et al. Low-temperature solution-processed perovskite solar cells with high efficiency and flexibility. *ACS Nano,* 2014, 8, 1674-1680.

(6) Noh, J. H.; Im, S. H.; Heo, J. H.; Mandal, T. N.; Seok, S. Il. Chemical management for colorful, efficient, and stable inorganic-organic hybrid nanostructured solar cells. *Nano Lett.* 2013, 13, 1764-1769.

(7) Kojima, A.; Teshima, K.; Shirai, Y.; Miyasaka, T. Organo metal halide perovskites as visible-light sensitizer for photovoltaic cells. *J. Am. Chem. Soc.* 2009, 131, 6050-6051.

(8) De Wolf, S.; Holovsky, J.; Moon, S.-J.; Löper, P.; Niesen, B.; Ledinsky, M.; Haug, F.-J.; Yum, J.-H.; Ballif, C. Organometallic halide perovskites: Sharp optical absorption edge and its relation to photovoltaic performance. *J. Phys. Chem. Lett.* 2014, 5, 1035-1039.

(9) Xing, G.; Mathews, N.; Sun, S.; Lim, S. S.; Lam, Y. M.; Grätzel, M.; Mhaisalkar, S.; Sum, T. C. Long-range balanced electron- and hole-transport lengths in organic-inorganic CH$_3$NH$_3$PbI$_3$. *Science* 2013, 342, 344-347.

(10) Wu, X.; Trinh, M. T.; Niesner, D.; Zhu, H.; Norman, Z.; Owen, J. S.; Yaffe, O.; Kudisch, B. J.; Zhu, X.-Y. Trap states in lead iodide perovskites. *J. Am. Chem. Soc.* 2015, 137, 2089-2096.

(11) Shi, D.; Adinolfi, V.; Comin, R.; Yuan, M.; Alarousu, E.; Buin, A.; Chen, Y.; Hoogland, S.; Rothenberger, A.; Katsiev, K.; et al. Low trap-state density and long carrier diffusion in organolead trihalide perovskite single crystals. *Science* 2015, 347, 519-522.

(12) Manser, J. S.; Kamat, P. V. Band filling with free charge carriers in organometal halide perovskites. *Nat. Photonics* 2014, 8, 737-743.

(13) Park, N.-G. Organometal perovskite light absorbers toward a 20% efficiency low-cost solid-state mesoscopic solar cell. *J. Phys. Chem. Lett.* 2013, 4, 2423-2429.

(14) Docampo, P.; Ball, J. M.; Darwich, M.; Eperon, G. E.; Snaith, H. J. Efficient organometal trihalide perovskite planar-heterojunction solar cells on flexible polymer substrates. *Nat. Commun.* 2013, 4, 2761.

(15) Sheikh, A. D.; Bera, A.; Haque M. A.; Rakhi R. B.; Gobbo, S. D.; Alshareef, H. N.; Wu, T.; Atmospheric effects on the photovoltaic performance of hybrid perovskite solar cells. *Sol. Energy Mater. Sol. Cells* 2015, 137, 6-14.

(16) Wang, H.; Sheikh, A. D.; Feng, Q.; Li, F.; Chen, Y.; Yu, W.; Alarousu, E.; Ma, C.; Haque, M. A.; Shi, D.; Wang, Z. S.; Mohammed, O. F.; Bakr, O. M.; Wu T. Facile synthesis and high performance of a new carbazole-based

(17) Nie, W.; Tsai, H.; Asadpour, R.; Blancon, J. C.; Neukirch, A. J.; Gupta, G.; Crochet, J. J.; Chhowalla, M.; Tretiak, S.; Alam, M. A.; et al. High-efficiency solution-processed perovskite solar cells with millimeter-scale grains. *Science* 2015, 347, 522-525.

(18) Jaramillo-Quintero, O. A.; Sanchez, R. S.; Rincon, M.; Mora-Sero, I. Bright visible-infrared light emitting diodes based on hybrid halide perovskite with spiro-ometad as a hole-injecting layer. *J. Phys. Chem. Lett.* 2015, 6, 1883-1890.

(19) Tan, Z. K.; Moghaddam, R. S.; Lai, M. L.; Docampo, P.; Higler, R.; Deschler, F.; Price, M.; Sadhanala, A.; Pazos, L. M.; Credgington, D.; et al. Bright light-emitting diodes based on organometal halide perovskite. *Nat. Nanotechnol.* 2014, 9, 687-692.

(20) Wehrenfennig, C.; Liu, M.; Snaith, H. J.; Johnston, M. B.; Herz, L. M. Homogeneous Emission Line Broadening in the Organo Lead Halide Perovskite $CH_3NH_3PbI_{3-x}Cl_x$. *J. Phys. Chem. Lett.* 2014, 5, 1300-1306.

(21) Xing, G.; Mathews, N.; Lim, S. S.; Yantara, N.; Liu, X.; Sabba, D.; Gratzel, M.; Mhaisalkar, S.; Sum, T. C. Low-temperature solution-processed wavelength-tunable perovskites for lasing. *Nat. Mater.* 2014, 13, 476-480.

(22) Guo, Y.; Liu, C.; Tanaka, H.; Nakamura, E. Air-stable and solution-processable perovskite photodetectors for solar-blind UV and visible light. *J. Phys. Chem. Lett.* 2015, 6, 535-539.

(23) Ken, H. W.; Sakai, N.; Jena, A. K.; Sanehira, Y.; Ikegami, M.; Ho, K. C; Miyasaka, T. A Switchable high-sensitivity photodetecting and photovoltaic device with perovskite absorber. *J. Phys. Chem. Lett.* 2015, 6, 1773-1779.

(24) Dou, L.; Yang, Y. M.; You, J.; Hong, Z.; Chang, W.-H.; Li, G.; Yang, Y. Solution-processed hybrid perovskite photodetectors with high detectivity. *Nat. Commun.* 2014, 5, 5404.

(25) Dong, Q.; Fang, Y.; Shao, Y.; Mulligan, P.; Qiu, J.; Cao, L.; Huang, J. Electron-hole diffusion lengths >175 am in solution-grown $CH_3NH_3PbI_3$ single crystals. *Science* 2015, 347, 967-970.

(26) Saidaminov, M. I.; Abdelhady, A. L.; Murali, B.; Alarousu, E.; Burlakov, V. M.; Peng, W.; Dursun, I.; Wang, L.; He, Y.; Maculan, G.; et al. High-quality bulk hybrid perovskite single crystals within minutes by inverse temperature crystallization. *Nat. Commun.* 2015, 6, 7586.

(27) Dang, Y.; Liu, Y.; Sun, Y.; Yuan, D.; Liu, X.; Lu, W.; Liu, G.; Xia, H.; Tao, X. Bulk crystal growth of hybrid perovskite material $CH_3NH_3PbI_3$. *Cryst. Eng. Comm.* 2015, 17, 665-670.

(28) Maeda, M.; Hattori, M.; Hotta, A.; Suzuki, I. Dielectric studies on $CH_3NH_3PbX_3$ (X=Cl and Br) single crystals. *J. Phys. Soc. Jpn.* 1997, 66, 1508-1511.

(29) Poglitsch, A.; Weber, D. Dynamic disorder in methylammoniumtrihalogenoplumbates (II) observed by millimeter-wave spectroscopy. *J. Chem. Phys.* 1987, 87, 6373-6378.

(30) Xu, Q.; Eguchi, T.; Nakayama, H.; Nakamura, N. Molecular motions and phase transitions in solid $CH_3NH_3PbX_3$ (x=Cl, Br, I) as studied by NMR and NQR. *Zeitschrift fuer Naturforsch* 1991, 46a, 240-246.

(31) Mashiyama, H.; Kurihara, Y.; Azetsu, T. Disordered cubic perovskite structure of $CH_3NH_3PbX_3$ (X=Cl, Br, I). *J. Korean Phys. Soc.* 1998, 32, 156-158.

(32) Taylor, P. A. Purification techniques and analytical methods for gaseous and metallic impurities in high-purity silane. *J. Cryst. Growth* 1988, 89, 28-38.

(33) Baikie, T.; Barrow, N. S.; Fang, Y.; Keenan, P. J.; Slater, P. R.; Piltz, R. O.; Gutmann, M.; Mhaisalkar S. J.; White, T. J. A combined single crystal neutron/X-ray diffraction and solid-state nuclear magnetic resonance study of the hybrid perovskites $CH_3NH_3PbX_3$ (X=I, Br and Cl). *J. Mater. Chem.* A, 2015, 3, 9298-9307.

(34) Kitazawa, N.; Watanabe, Y.; Nakamura, Y. Optical properties of $CH_3NH_3PbX_3$ (X=halogen) and their mixed-halide crystals. *J. Mater. Sci.* 2002, 7, 3585-3587.

(35) D'Innocenzo V.; Kandada A. R. S.; De Bastiani M.; Gandini M.; Petrozza A. Tuning the light emission properties by band gap engineering in hybrid lead halide perovskite. *J. Am. Chem. Soc.* 2014, 136, 17730-17733.

(36) Ryu, S.; Noh, J. H.; Jeon, N, J.; Kim, Y. C.; Yang, W. S.; Seo, J.; Seok, S. II. Voltage output of efficient perovskite solar cells with high open-circuit voltage and fill factor. *Energy Environ. Sci.* 2014, 7, 2614-2618.

(37) Kim, H. S.; Lee, C.-R.; Im, J. H.; Lee, K. B.; Moehl, T.; Marchioro, A.; Moon, S. J.; Humphry-Baker, R.; Yum, J. H.; et al. Lead iodide perovskite sensitized all-solid-state submicron thin film mesoscopic solar cell with efficiency exceeding 9%. *Sci. Rep.* 2012, 2, 1-7.

(38) Huang, L. Y.; Lambrecht, W. R. L. Electronic band structure, phonons, and exciton binding energies of halide perovskites $CsSnCl_3$, $CsSnBr_3$, and $CsSnI_3$. *Phys. Rev. B,* 2013, 88, 1-12.

(39) Lampert M. A.; Mark P. *Current Injection in Solids.* Academic Press, New York, 1970.

(40) Xiao, Z.; Yuan, Y.; Shao, Y.; Wang, Q.; Dong, Q.; Bi,C.; Sharma, P.; Gruverman, A.; Huang, J. Giant switchable photovoltaic effect in organometal trihalide perovskite devices. *Nat. Mater.* 2014, 14, 193-198.

(41) Xue, H.; Kong, X.; Liu, Z.; Liu, C.; Zhou, J.; Chen, W.; Ruan, S.; Xu, Q. $TiO_2$ based metal-semiconductor-metal ultraviolet photodetectors. *Appl. Phys. Lett.* 2007, 90, 201118.

(42) Jun, J. H.; Seong, H.; Cho, K.; Moon, B. M.; Kim S. Ultraviolet photodetectors based on ZnO nanoparticles. *Ceram. Int.*, 2009, 35, 2797-2801.

(43) Xing, J.; Zhao, K.; Lu, H. B.; Wang, X.; Liu, G. Z.; Jin, K. J.; He, M.; Wang, C. C.; Yang, G. Z. Visible-blind, ultravioletsensitive photodetector based on $SrTiO_3$ single crystal. *Opt. Lett.* 2007, 32, 2526-2528.

(44) Xing, J.; Guo, E. J.; Jin, K. J.; Lu, H. B.; Wen, J.; Yang, G. Z.; Solar-blind deep-ultraviolet photodetectors based on an $LaAlO_3$ single crystal. *Opt. Lett.* 2009, 34, 1675-1677.

(45) Guo, E. J.; Xing, J.; Jin, K. J.; Lu, H. B.; Wen, J.; Yang, G. Z. Photoelectric effects of ultraviolet fast response and high sensitivity in $LiNbO_3$ single crystal," *J. Appl. Phys.* 2009, 106, 023114.

(46) Guo, E. J.; Xing, J.; Lu, H. B.; Jin, K. J.; Wen, J.; Yang, G. Z. "Ultraviolet fast-response photoelectric effects in $LiTaO_3$ single crystal," *J. Phys.* D 2010, 43, 015402.

(47) Bera, A.; Peng, H.; Lourembam, J.; Shen, Y.; Sun, X. W.; Wu T. A versatile light-switchable nanorod memory: wurtzite ZnO on perovskite $SrTiO_3$. *Adv. Funct. Mater.* 2013, 23, 4977-4984.

(48) Luo, C.; Jin, K. X.; Chen, C. L.; Wu, T. Suppression of photovoltaic effect by magnetic field in $Pr_{0.65}(Ca_{0.75}Sr_{0.25})_{0.35}MnO_3/Nb:SrTiO_3$ heterostructure. *Appl. Phys. Lett.* 2013, 103, 212401.

(49) Jin, K. X.; Zhai, Y. X.; Li, H.; Tian, Y. F.; Luo, B. C.; Wu, T. Favorable ultraviolet photoelectric effects in TbMnO3/Nb—SrTiO3 heterostructures. *Solid State Commun.* 2014, 199, 39-42.

Example 3

Controllable doping of semiconductors is a fundamental technological requirement for electronic and optoelectronic devices. As intrinsic semiconductors, hybrid perovskites have so far been a phenomenal success in photovoltaics. The inability to dope these materials heterovalently (or aliovalently) has greatly limited their wider utilizations in electronics. Here we show an efficient in situ chemical route that achieves the controlled incorporation of trivalent cations ($Bi^{3+}$, $Au^{3+}$, or $In^{3+}$) by exploiting the retrograde solubility behavior of perovskites. We term the new method dopant incorporation in the retrograde regime. We achieve $Bi^{3+}$ incorporation that leads to bandgap tuning (~0.3 eV), $10^4$ fold enhancement in electrical conductivity, and a change in the sign of majority charge carriers from positive to negative. This work demonstrates the successful incorporation of dopants into perovskite crystals while preserving the host lattice structure, opening new avenues to tailor the electronic and optoelectronic properties of this rapidly-emerging class of solution-processed semiconductors.

Doping of semiconductors is fundamental to modern electronic and optoelectronic devices.[1] It enables manipulation of both the optical[2,3] and the electrical properties of semiconductors key to device functionality.[1]

The properties of the doped semiconductors strongly depend on the electronic levels introduced by the dopants.[1,4-6] Upon increasing the dopant concentration, the discrete impurity levels in the band gap of the host semiconductor evolve into an impurity band that can overlap with the conduction/valence band in n-/p-type semiconductors, respectively,[1,4,7] resulting in bandgap narrowing (BGN).[1,5-7] In semiconductors, the bandgap is integral to device architecture and expected performance, such as governing the limits of power conversion efficiency (PCE) in solar cells.[5] In case of semiconductors incorporating a high concentration of dopants, band tails appear as a consequence of the large disorder in the distribution of the density of states,[4,7] and these can be useful in applications such as nonlinear optical switching.[7,8]

Hybrid trihalide perovskites, especially $MAPbX_3$ ($MA=CH_3NH_3^+$, $X=Br^-$ or $I^-$), have seen intensive investigation[9-16] particularly in the context of photovoltaic applications following early studies beginning in 2009.[17] In only a few years, the field has witnessed a remarkable increase in the PCE of polycrystalline thin film perovskite-based solar cells, recently reaching certified efficiencies of 20.1%.[18] The incorporation of dopants offers a route to tailor hybrid perovskites and endow them with new properties.

To date, $MAPbX_3$ has primarily been doped using elements that are isovalent with the anion ($I^-/Cl^-$)[19-22] or with the metal cation $Pb^{2+}/M^{2+}$ ($M^{2+}=Sn^{2+}$, $Sr^{2+}$, $Cd^{2+}$ or $Ca^{2+}$).[23] This limits dopants' capacity to impact the sign or concentration of the majority of charge carriers. In contrast, heterovalent doping in semiconductors has a propensity to switch the sign of majority charge carrier from n- to p-type or vice versa and, if established in hybrid perovskites, could permit the fabrication of devices based on a p-n perovskite homojunction with minimal lattice mismatch. In addition, incorporation of heterovalent cations into the hybrid trihalide perovskite could potentially extend their spectral range to longer wavelengths. However, despite the promised benefits, the complete absence of reports on the heterovalent doping of hybrid trihalide perovskite polycrystalline films and, more importantly, crystals reflects the challenge of incorporating differently-charged cations into perovskites. This challenge derives from the demanding requirement that incorporated dopants satisfy both octahedral and tolerance factors while maintaining the same underlying crystal structure.

It is well documented that the introduction of $Cl^-$ into perovskite precursors solutions can significantly alter the crystallinity, morphology, and grain size of the obtained thin films; the combined effects of which appreciably impact device performance.[20,21,24,25] Given this combination of mechanisms, it has been difficult to isolate the specific role of the chloride additive on polycrystalline thin film properties.

Studying single crystals, which are not conflated by grain boundary and morphological effects, offers to put the focus on the role of dopants on the underlying properties of the material. There are, however, a number of constraints and challenges to classical crystal growth techniques associated with devising a general heterovalent doping approach of $MAPbX_3$ crystals. For example, employing antisolvent vapor-assisted crystallization[26] requires the choice of a solvent-antisolvent combination that is suitable for all precursors. Also, crystal growth by cooling from a saturated solution[27] occurs at temperatures that are likely too low to dissociate the dopant from its precursor state. Moreover, in each of these methods, crystallization occurs at a very slow rate, approaching the near-equilibrium conditions that militate against the incorporation of impurities into the host lattice.

We reasoned that the in situ incorporation of a dopant might be feasible using the inverse temperature solubility regime, a regime peculiar to hybrid perovskites. In this regime, crystallization occurs at astonishingly rapid rates at moderately elevated temperatures.[28,29] The approach we explore herein, dopant incorporation in the retrograde regime (DIRR), offers advantages that overcome many of the shortcomings of other methods: it requires the use of only a single solvent; its rapidity provides a higher probability of incorporation of impurities; and its use of moderately elevated temperatures enhance the chances of dissociation of precursor-solvent complexes,[29] making the impurities more readily available for incorporation.

Additional consideration, beyond the suitable choice of reaction conditions, must be given to designing a heterovalent doping strategy. We tried various trivalent dopants to demonstrate the flexibility of the perovskite structure, focusing on $Bi^{3+}$ (isoelectronic with $Pb^{2+}$), $Au^{3+}$, or $In^{3+}$, which fit into perovskite tolerance factor.[30] Tolerance factors for $Bi^{3+}$, $Au^{3+}$, and $In^{3+}$ were calculated to be 0.889, 0.946, and 0.963, respectively. These values fall within the range (0.75-1.00) reported to allow the formation of perovskites.[30]

As a result of the development of the DIRR process, we report herein an efficient in situ solution-processed method for the synthesis of heterovalent doped hybrid perovskite crystals. The successful incorporation of trivalent dopants ($Bi^{3+}$, $Au^{3+}$, or $In^{3+}$) into $MAPbBr_3$ crystals demonstrates the flexibility of the perovskite structure to host a number of different heterovalent cations. Our studies also reveal the considerable influence of dopants on the properties of the underlying semiconductor. In particular, we achieved a high concentration of $Bi^{3+}$ reaching ~$10^{19}$ $cm^{-3}$, although the active carrier concentration was ~7 orders of magnitude less than this (but still ~3 orders of magnitude greater than the undoped crystals) and we also showed conclusively that variation in bismuth concentration in the feed crystallization solution directly impacts both optical and electronic properties of MAPbBr$_3$. The introduction of Bi$^{3+}$ as a dopant resulted in significant bandgap narrowing (~300 meV), an enhancement of charge carrier concentration, a three to four orders of magnitude increase in conductivity, and sign switching of the majority carriers. Based on our results, Bi may be of particular interest in ongoing efforts to narrow the bandgap of hybrid perovskites, including iodide perovskite crystals, in the direction of the 1.0-1.3 eV range optimal for single junction solar cells.[31]

We implemented in situ incorporation of dopants by adding a mixture of trivalent (Bi$^{3+}$, Au$^{3+}$, In$^{3+}$) bromide salts and MABr into a crystallization solution containing a mixture of PbBr$_2$ and MABr in DMF, and then heating to the required temperature (synthesis is described in detail in the Methods section). After three hours, bulk crystals—entirely lacking grain boundaries (FIGS. 3.6A-E)—of parallelepiped shape (the same as undoped MAPbBr$_3$) were formed. We observed a color change, from orange to deep red in Bi-doped crystals, but not for other dopants (inset in FIG. 3.1A). However, in the case of Au-doped crystals, the dark color of the solution (which is due to the presence of AuBr$_3$) became much lighter (FIG. 3,7). These two observations provided initial hints of successful bismuth and gold incorporation in the crystals.

The exact dopant content in the crystals grown by DIRR was quantified using inductively coupled plasma optical emission spectrometry (ICP-OES). The dopant/Pb atomic ratio % in crystals synthesized from a feed solution containing 1% dopant/Pb atomic ratio % was determined to be 0.029-0.037%, 0.020%, and 0.004% for Bi$^{3+}$, Au$^{3+}$, and In$^{3+}$ respectively. Low In$^{3+}$ content could be due to the large difference in ionic radii between lead and indium.[32] X-ray diffraction (XRD) patterns of powders made by grinding each type of crystal showed no extra peaks compared to the undoped crystal, indicating a single-phase material (FIG. 3.1A) that retains the structural framework of pure MAPbBr$_3$ crystals. The preservation of the host perovskite structure, especially the inorganic framework, is important since this substructure is associated with the semiconducting properties of the organic-inorganic hybrids.[33] On the other hand, XRD of films synthesized by spin coating of the same solution used in DIRR showed no signs of a single phase perovskite. We also attempted ex situ doping whereby a MAPbBr$_3$ crystal was placed in a 1 M BiBr$_3$ and MABr in GBL solution (10-10$^3$ times higher than the concentration used for in situ doping). Even at elevated temperatures (100° C.) and for long times up to 48 h, no color change was observed. Therefore, the in situ chemical route is the most promising one to incorporate the heterovalent dopant cations and preserve the structural framework of the perovskite.

As evidenced from the color of the crystals, the absorption spectra of the Bi-doped crystal was red-shifted, while Au- and In-doped crystals showed no obvious spectral change from the undoped crystal (FIG. 3.1B). This is consistent with prior reports that BGN is dependent on the nature of the dopant.[6] The BGN observed only in the case of Bi-doped crystals is in agreement with theoretical studies suggesting that the outer ns$^2$ electrons play a critical role in bandgap modulation.[34] Our density function theory (DFT) calculations show that Au and In create deeper, more localized, and less interacting states than Bi, consistent with the failure of Au and In incorporation to produce notable bandgap narrowing (FIGS. 3.8A-D).

The trivalent bismuth cation and Pb$^{2+}$ have very similar ionic radii and are isoelectronic (6 s$^2$), and this may explain the similarities in chemical behavior for these cations.[32] Previous reports have found that the bismuth cation forms regular chains built of nearly regular octahedra with halide anions;[35,36] in particular, the Bi—Br bond length[35] (axial: 2.926, equatorial: 2.849 and 2.826 Å) in the octahedron BiBr$_6^{3-}$ closely matches that of the Pb—Br bond (2.95 Å)[27] in the corresponding octahedral structure. Mitzi reported bismuth-deficient perovskites, yet with a distorted octahedral coordination leading to a lower-dimensionality material.[37] The degree of distortion of an octahedron is dependent on the size of the organic cation, the inorganic cation, and the halide.[14] In addition, bismuth has been previously used to dope PbS in both thin films[38] and quantum dots,[39] converting them from p-type to n-type semiconductors. The lattice mismatch between PbS[39] and MAPbBr$_3$[29] is less than 1% which may suggest Bi$^{3+}$ could be incorporated into the bromide-based perovskites crystal as well.

Motivated by this remarkable resemblance of Bi and Pb, as well as our findings of effective incorporation—BGN and preservation of the lattice structure of perovskite—we further explored the effect of bismuth concentration on crystal optoelectronic properties. The color of the crystal was readily tuned by controlling the concentration of Bi$^{3+}$ in the feed solution, as seen in FIG. 3.2A. The Bi content in the obtained crystals, identified using ICP-OES, was found to be substantially lower than the nominal precursor amount in the feed solution. However, the Bi content obtained by ICP still indicates a moderate-to-heavy doping regime.[40] Table 3.1 shows the Bi and Pb percentages in both the feed solution and the obtained crystals. Hereafter, for simplicity, we refer to the crystals by the Bi % in the feed solution. FIG. 3.2B shows the measured Bi/Pb atomic ratio % as a function of Bi/Pb atomic ratio % in the feed solution. The reduction in the Pb % is not fully compensated by an equal increase in the Bi %, and this could be explained by the formation of Pb vacancies. Previous works reported that, in doped materials, the structure stabilizes through the formation of vacancies.[41,42] DFT studies (FIGS. 3.9A-F) indicate that Pb vacancies may also contribute to BGN. Although the position of the Bi atoms in the structure was not determined, the decrease in Pb content and the similarity in the ionic radii might suggest substitutional doping, and this is also consistent with our DFT calculations (FIGS. 3.10A-B). FIG. 3.2C shows XRD patterns of undoped and Bi-doped MAPbBr$_3$ crystals. Even at the highest doping level, the XRD pattern confirmed a single phase of the host cubic perovskite structure. Careful XRD analysis revealed no differences between the lattice parameters (5.92 Å) in both doped and undoped crystals. Similarly, there is no change in the full width half maxima before and after doping (Table 3.1).

TABLE 3.1

Bi and Pb atomic % in the feed solution and obtained crystals.

| Bi % in feed solution | Bi % | Pb % | ~Number of Bi atoms per cm$^3$ of crystal |
|---|---|---|---|
| 0 (undoped) | — | 42.7 ± 0.7 | — |
| 0.1 | 0.0026 ± 0.0005 | 40.6 ± 0.7 | 4 × 10$^{17}$ |
| 0.5 | 0.0072 ± 0.0007 | 41.1 ± 0.7 | 1 × 10$^{18}$ |
| 1 | 0.0110 ± 0.0006 | 41.5 ± 0.7 | 2 × 10$^{18}$ |
| 5 | 0.055 ± 0.016 | 38.3 ± 0.6 | 6 × 10$^{18}$ |
| 10 | 0.120 ± 0.038 | 37.5 ± 0.6 | 2 × 10$^{19}$ |

TABLE 3.2

Full width half maxima of the (100) peak before and after doping.

| Sample | Full width half maxima |
|---|---|
| 0% | 0.116 |
| 0.1% | 0.116 |
| 0.5% | 0.116 |
| 1% | 0.116 |
| 5% | 0.116 |
| 10% | 0.116 | doping levels into an X-ray photoelectron spectroscopy (XPS) chamber and, following a single cycle of gentle sputtering, performed high-resolution XPS on each sample. FIGS. 3.3A-F shows the representative high-resolution XPS spectra for the regions of interest of most highly Bi-doped sample. The Bi 4f doublet is clearly resolved at the 161.7 eV (Bi $4f_{7/2}$) and 166.7 eV (Bi $4f_{5/2}$) binding energies (FIG. 3.3a), slightly higher than the reported values for $Bi^{3+}$ ions, which might suggest a different environment.[43] The expected ratio of 4/3 for the spin-orbit split f-levels is in good agreement with the experimental data (FIG. 3.11, Table 3.3). The Pb 4f doublet and Br 3d, shown in FIGS. 3.3B and 3.3C respectively, are also slightly higher than the reported values for $MAPbBr_3$ thin films.[44] N 1s, and C 1s core level peaks are observed at 402.38 and 286.43 eV respectively (FIGS. 3.3D and 3.3E, respectively). A possible explanation for the slightly higher binding energy values of $Bi^{3+}$, $Pb^{2+}$ and $Br^-$ is that XPS measurements were conducted on the bulk crystal, where the screening effect might be different of that for the thin films. The sputtering regime we chose can be concluded to be a largely nondestructive, consistent with the stable surface chemical composition observed up to 500 nm in depth (see depth profiles in FIG. 3.3F) of the crystal. The initial drop in carbon content and the increase in lead and bromine atomic concentrations can be attributed to the removal of surface contamination. This is supported by the significant reduction (up to ~6 atomic %) in the total carbon component due to its aliphatic component removal (FIG. 3.12A-B, Table 3.4) observed after the very first sputtering cycles. At the later stages, the intensity of the Bi and Pb signals remained essentially constant, indicating a uniform distribution of Bi, also confirming the effectiveness of doping.

TABLE 3.3

Fitting parameters of the high resolution Bi 4f's XPS used for the generated fit presented in FIG. 3.11B.

| Band | Position, eV | PosSep, eV | FWHM, eV | % Gauss | % Area | ChiSquared |
|---|---|---|---|---|---|---|
| 1 | 161.71 | 0.00 | 1.57 | 100 | 57.14 | 4.85 |
| 2 | 166.69 | 4.96 | 1.76 | 96 | 42.86 | |

TABLE 3.4

Fitting parameters of the high resolution C 1s XPS used for the generated fits in FIG. 3.12.

| Spectra | Band | Position, eV | PosSep, eV | FWHM, eV | % Gauss | % Area | ChiSquared |
|---|---|---|---|---|---|---|---|
| (a) | 1 | 284.83 | 0.00 | 1.26 | 70 | 60.82 | 0.8 |
| | 2 | 286.45 | 1.62 | 1.4 | 70 | 39.18 | |
| (b) | 1 | 284.79 | 0 | 1.1 | 60 | 94.31 | 1.17 |
| | 2 | 286.47 | 1.68 | 1.20 | 70 | 5.68 | |

The normalized absorption spectra of Bi-doped crystals exhibit a red-shift proportional to the Bi content (FIG. 3.4A). The absolute absorbance of the crystals is provided in FIG. 3.13. FIG. 3.4B shows the BGN as a function of Bi concentration in the crystal. Even a much lower Bi percentage in solution (0.01%) can result in BGN (FIG. 3.14). The band edge shifted from 570 nm for the undoped crystal to 680 nm in the case of the highest Bi %. This latter corresponds to a bandgap value of 1.89 eV. BGN in doped semiconductors is caused by the interaction of the electrons with positive impurities, altering the density of states.[6,7] BGN may also be explained by the higher electronegativity of Bi compared to Pb, leading to more covalent bonding with bromide. This is consonant with the previously reported decrease in bandgap from Pb to Sn and Ge perovskites due to the difference in their electronegativity[14]. The relatively shallow (in comparison to Au and In) and delocalized Bi states, as determined using DFT, facilitate the mutual interaction of nearby Bi dopants; a condition required for bandgap narrowing (FIGS. 3.15A-C). We note that the band edge is not as sharp as in the undoped crystal, with tail states in the absorption. Such Urbach tails have been exploited in other doped-semiconductors for nonlinear optical switching.[7] Notable bandtailing was also observed in mixed I/Br perovskite films,[45] nevertheless, they have been used successfully in optoelectronic devices.[46] It is worth mentioning that incorporating $Bi^{3+}$ into the perovskite crystal quenches the photoluminescence which is similar to what is observed in Bi-doped PbS quantum dots[39] and other doped quantum dots systems[47] and could be attributed to increased Auger recombination.

Generally, time-resolved laser spectroscopy provides direct information about the carrier dynamics in organic and semiconductor materials.[48-50] In this study, nanosecond time-resolved transient absorption experiments reveal an extended carrier lifetime in crystals following $Bi^{3+}$ incorporation. In addition to two time constants of tens and hundreds of nanoseconds (these are commonly observed for the undoped single crystals[27,29]), a new component with a characteristic time constant of several tens to hundreds of microseconds is observed for Bi-doped $MAPbBr_3$ crystals. The contribution of this component increases as the doping concentration (FIGS. 3.16A-B). Reduced recombination rates and longer lifetimes has been previously reported for mixed halide perovskites.[51]

The band positions of crystals were identified by combination of Photoelectron spectroscopy in air (PESA) and optical bandgap.[52] PESA was used to obtain the valence band maximum (VBM) from the onset energy value of the spectra (FIG. 3.17). Using the optical bandgaps ($E_g$) we deduced the conduction band minimum (CBM) from the relationship $VBM+E_g=CBM$ as previously reported by McGehee et al.[52] FIG. 3.4C shows the values calculated for VBM and CBM. The conduction band moves downward considerably in energy, hinting that Bi doping may be prone to produce n-type semiconductors.

The sizable dimensions of the crystals synthesized using DIRR enabled the deposition of ohmic contacts for the study of electronic parameters such as conductivity (σ) and charge concentration (n) (FIG. 3.18). The four point probe method allows measurement of conductivity in semiconductor materials.[53] Using this method, we observes an increase in conductivity of as much as 4 orders of magnitude, from $\sim 10^{-8} \Omega^{-1} cm^{-1}$ for the undoped crystal to $\sim 10^{-4} \Omega^{-1} cm^{-1}$ for the highest-conductivity Bi-doped crystals (FIG. 3.5A). As in Bi-doped PbS thin films reported previously,[38] a rapid and abrupt increase in conductivity is first observed, followed by a gradual saturation as higher dopant concentrations are approached.

Hall Effect studies revealed that free carrier concentration within Bi-doped crystals increases to ~$10^{11}$-$10^{12}$ cm$^{-3}$ compared to ~$10^9$ cm$^{-3}$ for undoped crystals (FIG. 3.5B). This indicates that, of the ~$10^{19}$ cm$^{-3}$ impurity atoms introduced, only a certain fraction contribute free carriers.

MAPbBr$_3$ is an intrinsic p-type semiconductor.[27] Through Hall Effect measurements (FIG. 3.18, FIG. 3.22) we were able to demonstrate the change in the sign of majority carriers from p- to n-type through converting the intrinsic perovskite semiconductor to an extrinsic one which is in line with values obtained from simple semiconductor physics considerations (see Additional information below). The change in the sign of charge carriers is in agreement with our measurements of VBM and CBM discussed earlier. This switching in behavior from p- to n-type has been reported for the Bi-doping of other materials systems such as PbS thin films[38] and quantum dots.[39] The mobility of charge carriers was coarsely estimated from $\mu=en/\sigma$ (e is the electron charge) to be an order of magnitude larger in doped compared to in undoped crystals. Although such an increase was previously observed in prior studies of certain materials systems,[54] it is usually the case that mobility decreases when high concentrations of impurities are introduced to the semiconductor.

Bandgap tailoring is clearly of interest across the family of hybrid perovskites, including in MAPbI$_3$. Although Bi-doped MAPbBr$_3$ crystals were used for many of the key studies herein, Bi-doped MAPbI$_3$ crystals also show a single phase material (FIG. 3.19) with BGN that depends systematically on the Bi %. The bandgap of MAPbI$_3$ is reduced from its intrinsic value of 1.51 eV[29] to as low as 1.28 eV (FIGS. 3.20 and 3.21A-B, Table 3.5), a value of interest in photovoltaics.

TABLE 3.5

Bi and Pb atomic % in the feed solution and obtained MAPbI$_3$ crystals.

| Bi % in feed solution | Bi-doped MAPbI$_3$ crystal | |
|---|---|---|
| | Bi % | Pb % |
| 0.1 | 0.007 | 30.2 |
| 0.5 | 0.009 | 31.6 |
| 1 | 0.029 | 29.9 |
| 5 | 0.086 | 32.2 |
| 10 | 0.11 | 31.2 |

Experimental Methods

Materials.

Lead bromide (≥98%), bismuth bromide (≥98%), gold bromide (99.9%), indium bromide (99%), lead iodide (99.999% trace metal basis), bismuth iodide (99%), DMF (anhydrous, 99.8%) and γ-butyrolactone (GBL, ≥99%) were purchased from Sigma-Aldrich. MABr and MAI were purchased from Dyesol Limited (Australia). All salts and solvents were used as received without any further purification.

Synthesis of Undoped and Doped MAPbBr$_3$ Crystals.

1 M solution containing PbBr$_2$ and MABr or MBr$_3$ (M=Bi$^{3+}$, Au$^{3+}$ or In$^{3+}$) and MABr was prepared in DMF separately. Both solutions were prepared at room temperature. The solutions were filtered using PTFE filter with 0.2 m pore size. The filtrate from both solutions were mixed together in particular Bi % (0%, 0.1%, 0.5%, 1.0%, 5.0% and 10.0%). The mixtures were then placed in a vial, and the vial was kept in an oil bath undisturbed between 90° C. and 100° C. All procedures were carried out under ambient conditions and humidity 55-57%.

Synthesis of Undoped and Doped MAPbI$_3$ Crystals.

Similar to the bromide crystals except that iodide salts (PbI$_2$, MAI, and BiI$_3$) were used instead of bromides and GBL was used as a solvent. Crystals were obtained at 100-110° C.

Measurement and Characterization.

SEM was performed on Quanta 200. ICP-OES was performed on Varian 720-ES ICP-optical emission spectrometer. Powder XRD was performed on a Bruker AXS D8 diffractometer using Cu-Kα radiation. The steady-state absorbance was recorded using Cary 6000i spectrophotometer with an integrating sphere. The absorbance was measured using the diffused reflectance accessory (DRA) in the transmission mode by mounting the crystal in the center port. Transient absorption spectroscopy was carried out using an EOS spectrometer (Ultrafast Systems) with a white-light continuum probe pulse that was generated by a super continuum source, and spectrally tunable (240-2600 nm) femtosecond pump pulses, with an energy of 25 μJ, were generated in an optical parametric amplifier (Newport Spectra-Physics). The detailed information of the experimental setup is published elsewhere[50]. XPS experiments were carried out using PHI Versa Probe II instrument equipped with monochromatic Al—Kα source. Instrument base pressure was ca. 8×10$^{-10}$ Torr. The X-ray power of 25 W at 15 kV was used for all experiments with 200 micron beam size at the X-ray incidence and take off angles of 45°. The instrument work function was calibrated to give a binding energy (BE) of 84.0 eV for Au 4f$_{7/2}$ line for metallic gold and the spectrometer dispersion was adjusted to give a BE's of 284.8 eV, 932.7 eV and of 368.3 eV for the C is line of adventitious (aliphatic) carbon presented on the non-sputtered samples, Cu 2p$_{3/2}$ and Ag 3d$_{5/2}$ photoemission lines, respectively. The PHI dual charge compensation system was used on all samples. The high resolution Bi 4f, Pb 4f, Br 3d and Bi 5d, Pb 5d, N 1s, C 1s, VB spectra were acquired with a minimum of 10-60 s scans and a 0.1 eV step using 5.85 and 23.55 eV pass energy. Shirley background subtraction was made using MultiPak v9.0 PHI software. The ultimate Versa Probe II instrumental resolution was determined to be better than 0.125 eV using the Fermi edge of the valence band for metallic silver. All XPS spectra were recorded using PHI software SmartSoft –XPS v2.0 and processed using PHI MultiPack v9.0 and/or CasaXPS v.2.3.14. The relative sensitivity factors from MultiPack library were used to determine the atomic percentage. Peaks were fitted using GL line shapes a combination of Gaussians and Lorentzians with 30-50% of Lorentzian contents. The sputtering cycle for the XPS samples was 2 min using PHI VersaProbeII ion gun and 500 V Ar ions. Photoelectron spectroscopy in the air (PESA) measurement was carried out on doped crystals placed on the glass substrate, using Riken Photoelectron Spectrometer (Model AC-2).[47] The UV lamp intensity was fixed at 50 nW, which was pre-calibrated for the light correction. Hall Effect measurements were performed using a Nanometrics HL5500 Hall system. The resistivity was measured using the van der Pawn technique; the contact (aluminum-doped zinc oxide) configuration is depicted in FIG. 3.22. These contacts were deposited by thermal evaporation in a vacuum chamber. During the Hall coefficient acquisition the magnetic field intensity was kept to 0.504 T. The sample was kept in a dark, metallic enclosure during the measurements. Given the high resistivity of the samples the Nanometrics HL5500 was used in a configuration that includes a current pre-amplifier. DFT model was carried out using Ab initio simulations which were performed using CP2K program suite [CP2K] in the generalized gradients approximation with Perdew-Burke-Ernzerhof functional[PBE] and without spin-orbit coupling since more accurate treatments are still computationally prohibitive for the unit cell sizes employed here. Scalar-relativistic Goedecker-Teter-Hutter pseudopotentials[GTH], double plus polarized orbital basis set[MOLOPT], and a 300 Ry density cutoff were used. Unit cells with sizes up to 8×8×8 cubic perovskite unit cells (512 Pb atoms) were studied, allowing to reach doping densities down to 0.2%. Rotation of MA molecules and the dynamic nature of the perovskite cubic cell [Walsh] were taken into account using different snapshots from a molecular dynamics run followed by full relaxation. This leads to fluctuations of the bandedge and impurity levels by ±0.1 eV which do not affect our conclusions.

In summary, we demonstrate herein an efficient in situ chemical route for the incorporation of heterovalent dopants into hybrid perovskite crystal through the DIRR technique. Trivalent metals such as Bi, Au, and In were successfully introduced while preserving the structure of the host perovskite. Our results suggest that Bi is a potential candidate for tuning a number of optical and electronic properties in the hybrid perovskite crystal. The performance of hybrid perovskite-based optoelectronic devices such as solar cells and photodetectors mainly rely on bandgap, conductivity, charge carrier concentration and mobility of the semiconductor. The observed BGN upon doping, as well as the increase in the charge carrier concentration and conductivity, and notably the change in the majority charge carrier sign, suggest promise in a more diverse set of perovskite-based optoelectronic devices.

Additional Information

The increase in charge carrier concentration reflects the shift of the Fermi energy within the bandgap. Using simple semiconductor physics considerations we can correlate these quantities according to the equation:

$$n = N_C e^{\frac{E_c - E_F}{kT}}$$

where n is the electrons concentration, $E_C$ and $E_F$ the position in energy of the conduction band and the Fermi energy respectively, kT the thermal energy.[56] Assuming for $N_C$ a value of $10^{19}$ cm$^{-3}$, we can evaluate the position of the Fermi level with respect to the conduction band to be:

$$E_C - E_F = -kT \ln\left(\frac{n}{N_C}\right) \approx 0.42 \text{ eV}.$$

This value confirms that for a 1.89 eV bandgap, the Fermi level lies much closer to the conduction band which confirms an n-type semiconductor. Whereas the undoped MAPbBr$_3$ is known to be a p-type material[26,57].

Further Description of Selected Figures

FIGS. 3.6A-E are SEM images of cleaved crystals. SEM of cleaved crystals prepared from solution containing (FIG. 3.6A) 1% Bi, (FIG. 3.6B) 1% Au, (FIG. 3.6C) 1% In, (FIG. 3.6D) 0.1% Bi and (FIG. 3.6E) 10% Bi. No grain boundaries are found in the core of cleaved crystals. The dust indicates the good focus of electron beam.

FIGS. 3.8A-D illustrate projected density of states (FIG. 3.8A, FIG. 3.8C) and wavefunctions (3.8B, 3.8D) of the impurity levels showing that Au and In states are deep and strongly localized.

The main difference between Au and In compared to Bi is that they produce much deeper and thus much more localized states which cannot interact with each other, a condition required for bandgap narrowing. For this reason, clustering of these inclusions is less favorable (0.27 eV for Au and 0.03 eV for In) compared to 0.5 eV for Bi, further reducing the degree of narrowing.

Moreover, the amount of introduced dopant is much smaller (In) or not necessarily creating extra electrons (Au can be introduced as +1 and not only +3 despite the precursor being pure +3), thus creating less Pb vacancies which results in the absence of BGN.

FIGS. 3.9A-F illustrate projected density of states (FIGS. 3.9A, 3.9C, 3.9E) and wavefunctions (FIGS. 3.9B, 3.9D, 3.9F) of the Bi impurities and Pb vacancies showing that they create levels near conduction band edge and they are capable of interacting. Bi interstitials induce n-type doping, Pb vacancies lead to p-type doping, while their combination achieves a compensated intrinsic perovskite.

In order to observe the effect of shallow states in absorption, the newly introduced levels should be empty. Since Bi provides extra electrons they would fill the new states and make them invisible in absorption. Thus, it is reasonable to expect that Bi extra electrons have been compensated, e.g. by Pb vacancies.

Pb vacancies are indeed very shallow trap[55] close in energy to Bi states and they could couple efficiently. Indeed, we observe increased amount of shallow states and a larger extent of their delocalization when Bi substitutionals are mixed with Pb vacancies, enhancing the bandgap narrowing.

FIGS. 3.10A-B show projected density of states (FIG. 3.10A) and wavefunction (FIG. 3.10B) of the two Bi interstitials forming deep and strongly localized states.

Calculated formation energy of Bi interstitial is 1.1 eV (very high) and the created levels are too deep in the bandgap, thus, strongly localized. Both facts are incompatible with observations of shallow states and bandgap narrowing.

FIGS. 3.11A-B show the HR Bi 4f's XPS of cleaved 1% Bi-doped crystal (FIG. 3.11A) top spectra and of undoped crystal bottom spectra. The Bi 4f binding energy range after processing in MultiPack v.9 and deconvolution (FIG. 3.11B). Black dots represent experimental data; red, blue and green represent generated fit, Bi 4f components and background respectively. Single sputtering cycle was used for all samples.

The spectrum presented in FIG. 3.11B was obtained from as acquired for the "1% Bi-doped crystal and "undoped crystal" spectrum (FIG. 3.11A) using Add/Subtract/Compare function of the PHI MultiPack v.9 software. The Y-Offset and Y-Linear function of MultiPack v.9 software were applied before the fitting procedure. The mixture of Gaussian/Laurencin components with 90-100% of Gaussian content and Shirley background generated satisfactory fit with constraint of 3/4 ratio for of Bi spin-orbit split components Table 3.2).

FIGS. 3.15A-C illustrate wavefunctions of one (FIG. 3.15A) and two (FIG. 3.15B-C) Bi inclusions in a 8×8×8 unit cell showing significant delocalization when Bi inclusions cluster together, an effect responsible for bandgap narrowing.

We have performed DFT simulations in an 8×8×8 unit cell with 512 Pb atoms, corresponding to 0.2% doping level, comparable to the highest experimental values. We find that Bi states are quite shallow and thus are quite delocalized, extending sufficiently far to interact with nearby Bi inclusions.

Moreover, we find that clustering of several Bi atoms is very energetically favorable (by 0.5 eV). Such clustering leads to much more extended (and thus more optically active) states even though their depth is not affected.

FIGS. 3.16A shows nanoscond TA dynamics of the ground state bleach at 520 nm of undoped, 0.1, 1, and 10% Bi-doped MAPbBr$_3$ crystals for short time delay (up to 1.3 μs). FIG. 3.16B shows TA dynamics of undoped and 1% Bi-doped MAPbBr$_3$ crystals for long time delay (up to 400 μs).

FIG. 3.18 is a log sheet of the Hall Effect measurement for 10% Bi-doped MAPbBr$_3$. The solid appears to be n-type, as shown from the Hall Effect coefficient RHs. The values of the conductivity, charge carrier concentration and mobility is particularly high ($1.3 \times 10^{-4}$ ohm$^{-1}$ cm$^{-1}$, $6.64 \times 10^{11}$ cm$^{-3}$ and 1250 cm$^2$/Vs, respectively); these results confirm that the transport properties of the Bi-doped MAPbBr$_3$ crystal is much higher than the undoped crystal.

REFERENCES, EXAMPLE 3

(1) Abram, R. A.; Rees, G. J.; Wilson, B. L. H. Heavily Doped Semiconductors and Devices. *Adv. Phy.* 1978, 27, 799-892.

(2) Piao, Y.; Meany, B.; Powell, L. R.; Valley, N.; Kwon, H.; Schatz, G. C.; Wang, Y. Brightening of Carbon Nanotube Photoluminescence through the Incorporation of sp$^3$ Defects. *Nat. Chem.* 2013, 5, 840-845.

(3) Ehli, C.; Oelsner, C.; Guldi, D. M.; Mateo-Alonso, A.; Prato, M.; Schmidt, C.; Backes, C.; Hauke, F.; Hirsch, A. Manipulating Single-wall Carbon Nanotubes by Chemical Doping and Charge Transfer with Perylene Dyes. *Nat. Chem.* 2009, 1, 243-249.

(4) Khan, A.; Das A. Diffusivity-Mobility Relationship for Heavily Doped Semiconductors Exhibiting Band Tails. *Physica B* 2010, 405, 817-821.

(5) Berggren, K. F.; Sernelius, B. E. Band-Gap Narrowing in Heavily Doped Many-Valley Semiconductors. *Phys. Rev. B* 1981, 24, 1971-1986.

(6) Palankovski, V.; Kaiblinger-Grujin, G.; Selberherr, S. Study of Dopant-Dependent Band Gap Narrowing in Compound Semiconductor Devices. *Mater. Sci. Eng. B* 1999, 66, 46-49.

(7) Van Mieghem, P. Theory of Band Tails in Heavily Doped Semiconductors. *Rev. Mod. Phys.* 1992, 64, 755-793.

(8) Liebler, J.; Haug, H. Theory of the Band-Tail Absorption Saturation in Polar Semiconductors. *Phys. Rev. B* 1990, 41, 5843-5856.

(9) Maculan, G; Sheikh, A. D.; Abdelhady, A. L.; Saidaminov, M. I.; Haque, M. A.; Murali, B.; Alarousu, E.; Mohammed, O. F.; Wu, T.; Bakr, O. M. CH$_3$NH$_3$PbCl$_3$ Single Crystals: Inverse Temperature Crystallization and Visible-Blind UV-Photodetector. *J. Phys. Chem. Lett.*, 2015, 6, 3781-3786.

(10) Jung, H. S.; Park, N-G. Perovskite Solar Cells: From Materials to Devices. *Small* 2015, 11, 10-25.

(11) Gonzalez-Pedro, V.; Juarez-Perez, E. J.; Arsyad, W-S.; Barea, E. M.; Fabregat-Santiago, F.; Mora-Sero, I.; Bisquert, J. General Working Principles of CH$_3$NH$_3$PbX$_3$ Perovskite Solar Cells. *Nano Lett.* 2014, 14, 888-893.

(12) Chen, Y-S.; Manser, J. S.; Kamat, P. V. All Solution-Processed Lead Halide Perovskite-BiVO4 Tandem Assembly for Photolytic Solar Fuels Production. *J. Am. Chem. Soc.* 2015, 137, 974-981.

(13) Boix, P. P.; Agarwala, S.; Koh, T. M.; Mathews, N.; Mhaisalkar, S. G. Perovskite Solar Cells: Beyond Methylammonium Lead Iodide. *J. Phys. Chem. Lett.* 2015, 6, 898-907.

(14) Mohammad, K. N.; Gao, P.; Gratzel, M. Organohalide Lead Perovskites for Photovoltaic Applications. *Energy Environ. Sci.* 2014, 7, 2448-2463.

(15) Saidaminov, M. I.; Adinolfi, V.; Comin, R.; Abdelhady, A. L.; Peng, W.; Dursun, I.; Yuan, M.; Hoogland, S.; Sargent, E. D.; Bakr, O. M. Planar-Integrated Single-Crystalline Perovskite Photodetectors. *Nat. Commun.*, 2015, 6, 8724.

(16. Nie, W.; Tsai, H.; Asadpour, R.; Blancon, J-C.; Neukirch, A. J.; Gupta, G.; Crochet, J. J.; Chhowalla, M.; Tretiak, S.; Alam, M. A. et al. High-Efficiency Solution-Processed Perovskite Solar Cells With Millimeter-Scale Grains. *Science* 2015, 347, 522-525.

(17) Kojima, A.; Teshima, K.; Shirai, Y.; Miyasaka, T. Organometal Halide Perovskites as Visible-Light Sensitizers for Photovoltaic Cells. *J. Am. Chem. Soc.* 2009, 131, 6050-6051.

(18) Yang, W. S.; Noh, J. H.; Jeon, N. J.; Kim, Y. C.; Ryu, S.; Seo, J.; Seok, S. I. High-Performance Photovoltaic Perovskite Layers Fabricated through Intramolecular Exchange. *Science* 2015, 348, 1234-1237.

(19) Stranks, S. D.; Eperon, G. E.; Grancini, G.; Menelaou, C.; Alcocer, M. J. P.; Leijtens, T.; Herz, L. M.; Petrozza, A.; Snaith, H. J. Electron-Hole Diffusion Lengths Exceeding 1 Micrometer in an Organometal Trihalide Perovskite Absorber. *Science* 2013, 342, 341-344.

(20) Tidhar, Y.; Edri, E.; Weissman, H.; Zohar, D.; Hodes, G.; Cahen, D.; Rybtchinski, B.; Kirmayer, S. Crystallization of Methyl Ammonium Lead Halide Perovskites: Implications for Photovoltaic Applications. *J. Am. Chem. Soc.* 2014, 136, 13249-13256.

(21) de Quilettes, D. W.; Vorpahl, S. M., Stranks, S. D.; Nagaoka, H.; Eperon, G. E.; Ziffer, M. E.; Snaith, H. J.; Ginger, D. S.; Impact of Microstructure on Local Carrier Lifetime in Perovskite Solar Cells. *Science* 2015, 348, 683-686.

(22) Colella, S.; Mosconi, E.; Fedeli, P.; Listorti, A.; Gazza, F.; Orlandi, F.; Ferro, P.; Besagni, T.; Rizzo, A.; Calestani, G. et al. R. MAPbI$_{(3-x)}$Cl$_x$ Mixed Halide Perovskite for Hybrid Solar Cells: the Role of Chloride as Dopant on the Transport and Structural Properties. *Chem. Mater.* 2013, 25, 4613-4618.

(23) Navas, J.; Sánchez-Coronilla, A.; Gallardo, J. J.; Hernández, N. C.; Piñero, J. C.; Alcántara, R.; Fernández-Lorenzo, C.; De los Santos, D. M.; Aguilara, T.; Martin-Calleja, J. New Insights into Organic-Inorganic Hybrid Perovskite CH$_3$NH$_3$PbI$_3$ Nanoparticles. An Experimental and Theoretical Study of Doping in Pb$^{2+}$ Sites with Sn$^{2+}$, Sr$^{2+}$, Cd$^{2+}$ and Ca$^{2+}$. *Nanoscale* 2015, 7, 6216-6229.

(24) Zhao, Y.; Zhu, K. Solution Chemistry Engineering toward High-Efficiency Perovskite Solar Cells. *J. Phys. Chem. Lett.* 2014, 5, 4175-4186.

(25) Eperon, G. E.; Burlakov, V. M.; Docampo, P.; Goriely, A.; Snaith, H. J. Morphological Control for High Performance, Solution-Processed Planar Heterojunction Perovskite Solar Cells. *Adv. Funct. Mater.* 2014, 24, 151-157.

(26) Shi, D.; Adinolfi, V.; Comin, R.; Yuan, M.; Alarousu, E.; Buin, A.; Chen, Y.; Hoogland, S.; Rothenberger, A.; Katsiev, K. et al. Low Trap-State Density and Long Carrier Diffusion in Organolead Trihalide Perovskite Single Crystals. *Science* 2015, 347, 519-522.

(27) Stoumpos, C. C.; Malliakas, C. D.; Kanatzidis, M. G. Semiconducting Tin and Lead Iodide Perovskites with Organic Cations: Phase Transitions, High Mobilities, and Near-infrared Photoluminescent Properties. *Inorg. Chem.* 2013, 52, 9019-9038.

(28) Saidaminov, M. I.; Abdelhady, A. L.; Murali, B.; Alarousu, E.; Burlakov, V. M.; Peng, W.; Dursun, I.; Wang, L.; He, Y.; Maculan, G. et al. High-Quality Bulk Hybrid Perovskite Single Crystals within Minutes by Inverse Temperature Crystallization. *Nat. Commun.* 2015, 6, 7586.

(29) Saidaminov, M. I.; Abdelhady, A. L.; Maculan, G.; Bakr, O. M. Retrograde Solubility of Formamidinium and Methylammonium Lead Halide Perovskites Enabling Rapid Single Crystal Growth. *Chem. Commun.,* 2015, 51, 17658-17661.

(30) Li, C.; Lu X.; Ding, W.; Feng, L.; Gao, Y.; Guo, Z. Formability of $ABX_3$ (X=F, Cl, Br, I) Halide Perovskites. *Acta Crystallogr. Sect. B* 2008, 64, 702-707.

(31) Shockley, W.; Queisser, H. J. Detailed Balance Limit of Efficiency of p-n Junction Solar Cells. *J. Appl. Phys.* 1961, 32, 510.

(32) Shannon, R. Revised Effective Ionic Radii and Systematic Studies of Interatomic Distances in Halides and Chalcogenides. *Acta Crystallogr. Sect. A* 1976, 32, 751-767.

(33) Bi, W.; Louvain, N.; Mercier, N.; Luc, J.; Rau, I.; Kajzar, F.; Sahraoui, B. A Switchable NLO Organic-Inorganic Compound based on Conformationally Chiral Disulfide Molecules and $Bi(III)I_5$ Iodobismuthate Networks. *Adv. Mater.* 2008, 20, 1013-1017.

(34) Wang, K.; Liang, Z.; Wang, X.; Cui, X. Lead Replacement in $CH_3NH_3PbI_3$ Perovskites. *Adv. Electron. Mater.,* 2015, 1, 1500089.

(35) Bi, W.; Leblanc, N.; Mercier, N.; Auban-Senzier, P.; Pasquier C. Thermally Induced Bi(III) Lone Pair Stereoactivity: Ferroelectric Phase Transition and Semiconducting Properties of $(MV)BiBr_5$ (MV=methylviologen). 2009, *Chem. Mater.* 21, 4099-4101.

(36) Leblanc, N.; Mercier, N.; Zorina, L.; Simonov, S.; Auban-Senzier, P.; Pasquier, C. Large Spontaneous Polarization and Clear Hysteresis Loop of a Room-Temperature Hybrid Ferroelectric Based on Mixed-Halide $[BiI_3Cl_2]$ Polar Chains and Methylviologen Dication. *J. Am. Chem. Soc.* 2011, 133, 14924-14927.

(37) Mitzi D. B. Organic-Inorganic Perovskites Containing Trivalent Metal Halide Layers: the Templating Influence of the Organic Cation Layer. *Inorg. Chem.* 2000, 39, 6107-6113.

(38) Abe, S.; Masumoto, K.; Suto, K. Growth and Characterization of Bi-doped PbS Thin Films Prepared by Hot-Wall Epitaxy. *J. Cryst. Growth* 1997, 181, 367-373.

(39) Stavrinadis, A.; Rath, A. K.; de Arquer, F. P. G.; Diedenhofen, S. L.; Magén, C.; Martinez, L.; So, D.; Konstantatos, G. Heterovalent Cation Substitutional Doping for Quantum Dot Homojunction Solar Cells. *Nat. commun.* 2013, 4, 2981.

(40) Achuthan, M. A. & Bhat, K. N. *Fundamentals of Semiconductor Devices*. (Tata McGraw-Hill Education 2006).

(41) Zunger, A. Practical Doping Principles. *Appl. Phys. Lett.* 2003, 83, 57-59.

(42) Neagu, D.; Tsekouras, G.; Miller, D. N.; Ménard, H.; Irvine, J. T. S. In situ Growth of Nanoparticles through Control of Non-stoichiometry. *Nat. Chem.* 2013, 5, 916-923.

(43) Liu, H.; Nakamura, R.; Nakato, Y. Promoted Photo-Oxidation Reactivity of Particulate $BiVO_4$ Photocatalyst Prepared by a Photoassisted Sol-Gel Method. *J. Electrochem. Soc.* 2005, 152, G856-G861.

(44) Kim, Y-H.; Cho, H.; Heo, J. H.; Kim, T-S.; Myoung, N.; Lee, C-L.; Im, S. H.; Lee, T-W. Multicolored Organic/Inorganic Hybrid Perovskite Light-Emitting Diodes. *Adv. Mater.* 2015, 27, 1248-1254.

(45) Fedeli, P.; Gazza, F.; Calestani, D.; Ferro, P.; Besagni, T.; Zappettini, A.; Calestani, G.; Marchi, E.; Ceroni, P.; Mosca, R. Influence of the Synthetic Procedures on the Structural and Optical Properties of Mixed-Halide (Br, I) Perovskite Films. *J. Phys. Chem. C* 2015, 119, 21304-21313.

(46) Bi, C.; Yuan, Y.; Fang, Y.; Huang, J. Perovskite Solar Cells: Low-Temperature Fabrication of Efficient Wide-Bandgap Organolead Trihalide Perovskite Solar Cells. *Adv. Energy Mater.* 2015, 5, 1401616.

(47) Jana, S.; Srivastava, B. B.; Jana, S.; Bose, R.; Pradhan, N. Multifunctional Doped Semiconductor Nanocrystals. *J. Phys. Chem. Lett.* 2012, 3, 2535-2540.

(48) Pan, J.; Sarmah, S. P.; Murali, B.; Dursun, I.; Peng, W.; Parida, M. R.; Liu, J.; Sinatra, L.; Alyami, N.; Zhao, C. et al. Air-Stable Surface-Passivated Perovskite Quantum Dots for Ultra-Robust, Single- and Two-Photon-Induced Amplified Spontaneous Emission. *J. Phys. Chem. Lett.* 2015, 6, 5027-5033.

(49) Aly, S. M.; Parida, M. R.; Alarousua, E.; Mohammed, O. F. Ultrafast Electron Injection at the Cationic Porphyrin-Graphene Interface Assisted by Molecular Flattening. *Chem. Commun.,* 2014, 50, 10452-10455.

(50) Bose, R.; Ahmed, G. H.; Alarousu, E.; Parida, M. R.; Abdelhady, A. L.; Bakr, O. M.; Mohammed, O. F. Direct Femtosecond Observation of Charge Carrier Recombination in Ternary Semiconductor Nanocrystals: the Effect of Composition and Shelling. *J. Phys. Chem. C* 2015, 119, 3439-3446.

(51) Suarez, B.; Gonzalez-Pedro, V.; Ripolles, T. S.; Sanchez, R. S.; Otero, L.; Mora-Sero, I. Recombination Study of Combined Halides (Cl, Br, I) Perovskite Solar Cells. *J. Phys. Chem. Lett.,* 2014, 5, 1628-1635.

(52) Nguyen, W. N.; Nguyen, W. H.; Bailie, C. D.; Unger, E. L.; McGehee, M. D. Enhancing the Hole-Conductivity of Spiro-OMeTAD without Oxygen or Lithium Salts by Using $Spiro(TFSI)_2$ in Perovskite and Dye Sensitized Solar Cells. *J. Am. Chem. Soc.,* 2014, 136, 10996-11001.

(53) Li, J. C.; Wang, Y.; Ba, D. C. Characterization of Semiconductor Surface Conductivity by Using Microscopic Four-Point Probe Technique. *Phys. Procedia* 2012, 32, 347-355.

(54) Dakhel, A. A. Improving Carriers Mobility in Copper and Iron-Codoped CdO. *Mater. Sci. Semicon. Process.* 2014, 17, 194-198.

(55) Buin, A., Comin, R., Xu, J., Ip, A. H. & Sargent, E. H. Halide-dependent electronic structure of organolead perovskite materials. *Chem. Mat.* doi:10.1021/acs.chemmater.5b01909 (2015).

(56) Van Zeghbroeck B. Principles of semiconductor devices. Colarado University (2004).

(57) Dymshits A, Rotem A, Etgar L. High voltage in hole conductor free organo metal halide perovskite solar cells. *J. Mat. Chem. A* 2, 20776-20781 (2014).

Example 4

Pioneering works on utilizing hybrid perovskites in photovoltaics[1-3] drew the attention of many researchers to this promising class of semiconductors, which possess strong and tunable absorptions and emissions,[4] as well as remarkable charge-carrier diffusion lengths.[5] Combined with the facile and low-cost deposition methods,[6-9] these properties thrust perovskites to the forefront of modern optoelectronic semiconductor devices such as solar cells,[10-17] photodetectors,[18-20] light emitting diodes,[21] lasers,[22] X-ray detectors[23] and ambipolar phototransistors.[24] The optical properties of hybrid perovskites, such as MAPbX$_3$ and FAPbX$_3$ (where MA=CH$_3$NH$_3^+$, and FA=HC(NH$_2$)$_2^+$ and X=Cl$^-$, Br$^-$, I$^-$), show an astonishing sensitivity to their compositions. For instance, in the widely investigated MAPbX$_3$, the substitution of Cl$^-$ with Br$^-$ or I$^-$ results in narrowing of the bandgap from 3.11 to 2.35 or 1.6 eV, respectively.[25,26] Although MAPbI$_3$ is thoroughly exploited as an active/absorber layer in solar cells, its bandgap is still significantly larger than the optimum for a single-junction solar cell (~1.34 eV).[27]

A further narrowing of the perovskite bandgap was demonstrated through the replacement of the small MA (1.8 Å) cation with a larger FA (1.9-2.2 Å) cation, forming FAPbX$_3$; in polycrystalline thin films, the bandgap was reduced from 1.6 eV to 1.48 eV,[28-30] indicating a potentially higher power conversion efficiency (PCE) of FAPbI$_3$-based solar cells. For this reason, FAPbI$_3$ is actively replacing MAPbX$_3$ in the most efficient perovskite solar cells[28-35], with PCE values reaching 20%.[21]

The overwhelming majority of perovskite devices are based upon polycrystalline thin films—a material that suffers immensely from a high density of traps and grain boundaries, which markedly limit the potential performance in devices. Recently, it was reported that hybrid perovskite single crystals display exceptionally low trap densities (~6 orders of magnitude less compared to their polycrystalline films).[5,36] Therefore higher crystallinity is an extremely desired criterion for the further improvement of perovskite-based device performances. However, the synthesis of perovskite crystals through the classical cooling[37] or antisolvent vapor-assisted crystallization[5] techniques is a time-consuming process that requires weeks to prepare high quality crystals. Recently, we reported a rapid inverse temperature crystallization (ITC) method for MAPbX$_3$.[36] This method takes advantage of the retrograde solubility regime—a peculiar regime in which the loss of solubility occurs in a specific solvent or solvents at elevated temperatures.[36,38,39] However, the retrograde solubility of the highly desired FA-based perovskites has thus far not been reported. Retrograde solubility enables a facile and rapid route to grow crystals, and if established in FAPbX$_3$, could allow for a more extensive use of this emerging subclass of hybrid perovskites, not only with regards to fundamental aspects but also in the practical design of optoelectronic devices.

It is the norm that salts possess higher solubilities at elevated temperatures. Remarkably, we observed the formation of perovskite precipitates in specific solvents at elevated temperatures, which is an indication of retrograde solubility. Nevertheless, this abnormal retrograde solubility behavior was noted for few salts.[40] To confidently validate the retrograde solubility behavior of the hybrid perovskites, we tested their solubilities in various solvents at different temperatures, and determined that γ-butyrolactone (GBL) is generally a suitable solvent for I-based perovskites, whereas the more polar N,N-dimethylformamide (DMF) is the proper solvent for the Br-based ones. The effect of the temperature on the solubility of methylammonium and formamidinium lead halides is shown in FIG. 4.1A-D. The negative slopes of the curves clearly confirmed the retrograde solubility behavior of the perovskites in the mentioned solvents.

Importantly, individual precursors (PbX$_2$ or MAX) in the corresponding solvents did not show retrograde solubility behavior. These two observations—retrograde solubility being tied to the whole perovskite and retrograde solubility dependence on solvent—indicate that the energetics of precursor-solvent complexes is likely to be responsible for this phenomenon. These complexes disassociate at elevated temperature, commencing crystallization.

FIG. 4.1A shows the temperature-dependent solubility of the most widely used hybrid perovskite—MAPbI$_3$ in GBL. Interestingly, the solubility of MAPbI$_3$ in GBL increased with a corresponding increase in the temperature from 20° C. to 60° C.; however, further heating resulted in the loss of solubility. The presence of both positive and negative slopes on the solubility curve indicates that there are two competing processes occurring in the solution during heating—the formation of complexes and their dissociation. At T<60° C., the complexes formation prevails, while at T>60° C., the complexes dissociation dominates over their formation. Remarkably, the solubility of MAPbI$_3$ decreased by more than a factor of two with heating from 60° C. to 130° C. Recently retrograde solubility enabled us to design a facile and rapid route to grow high-quality bulk MAPbI$_3$ single crystals,[36] and establishing this phenomenon in FAPbI$_3$ will allow more extensive use of this emerging subclass of perovskite crystals.

Through the choice of suitable solvent, we found that a single GBL solvent can also be used to commence the retrograde solubility of FAPbI$_3$ (FIG. 4.1B); its solubility drops by more than three times with heating from 20° C. to 130° C. Further, we optimized the conditions to grow FAPbI$_3$ by ITC. Using 1 M solution of FAPbI$_3$ in GBL at 100° C. frequently resulted in formation of needle-like yellow crystals, which gradually transforms to black crystals with mosaic morphology and many cracks. Due to stability of black phase at elevated temperatures,[30-32] we reasoned that higher temperature of crystallization could result in directly forming of black crystals. Therefore we used 0.8 M solution to increase the onset of crystallization temperature to 115° C., and successfully grew crack- and grain boundary-free (FIGS. 4.4A-D) black crystal in 3 h (FIG. 4.2A). Powder XRD of freshly prepared crystals perfectly matches with previously reported cubic phase α-FAPbI$_3$ (FIG. 4.2B).[41] As reported,[30-32] due to the instability of the black polymorph, it transformed to the yellow phase δ-FAPbI$_3$ (FIG. 4.5A-B) in air in 24 h and a humidity of 55-57%.

We didn't observe the retrograde solubility behavior of I-based perovskites in more polar solvent—DMF or DMSO. We speculate that the lead iodide complexes with DMF or DMSO[42] seem to be stronger compared to the GBL, which do not decompose in solution at elevated temperatures without evaporation of solvents.

In contrast, retrograde solubility behavior of Br-based perovskites was observed only in DMF-based solvents (FIG. 4.1C-D). FIG. 4.1C shows that the solubility of MAPbBr$_3$ in DMF decreased significantly—almost by a factor of three, when it was heated from 20° C. to 100° C. Previously, we used a single solvent (DMF) for the ITC of MAPbBr$_3$.[36] DMF can also be used as a sole solvent for FAPbBr$_3$ synthesis by ITC; however, despite it forms a highly saturated solution in DMF at room temperature (~3.12 M), it produces only small crystals at 120° C. The solubility of FAPbBr$_3$ in DMF decreased only 1.7 times with heating from 20° C. to 100° C. (FIG. 4.6). Therefore, to increase the yield of crystallization and to avoid over-consumption of the precursors, we reasoned that the dilution of the DMF polarity through mixing with the less polar GBL could increase the negative slope of the solubility curve. We found that the retrograde solubility behavior of FAPbBr$_3$ can be initiated in a 1:1 v/v of DMF:GBL, while the solubility decreased by more than three times through an increase in the temperature from 20° C. to 100° C. For ITC of FAPbBr$_3$, we used 1 M solution in 1:1 v/v DMF:GBL with crystallization onset at 55° C. to grow crack-free crystals (see ESI for details). Powder X-ray diffraction (XRD) of the FAPbBr$_3$ ground crystals matched with the reported cubic phase of FAPbBr$_3$ (FIG. 4.2C-D).[43]

The yield of the crystallization—the ratio of the mass of the crystals to the precursors—can be estimated from the solubility curves (FIGS. 4.1A-D). These curves also demonstrated that there are several ways to increase the yield: (1) the initial use of a higher precursors concentrations (FIG. 4.7 validates this concept); and (2) the utilization of a higher crystallization temperature (FIG. 4.8). In classical cooling and antisolvent vapor-assisted crystallization techniques, non-equimolar precursors (for instance, the ratio of MAI: PbI$_2$ is 3:1 for the antisolvent technique)[5] or the presence of foreign additives (for example hydro-iodide acid in the classical cooling technique)[37] renders the leftover solution unusable. In contrast, the overconsumption of solvents and precursors is minimized in the ITC method because the depleted solution can be repeatedly used for crystallization by dissolving more precursors, due to the utilization of equimolar amounts of the precursors and the reduced requirement of the solvents.

Given the emergence of FAPbX$_3$ as the perovskite of choice in solar cells, it is important to elucidate the optical bandgaps of their crystals, which have thus far not been reported. Having the macroscopic crystals, we studied the absorption of the FAPbX$_3$ crystals (FIG. 4.3). Very intriguingly, we observed that α-FAPbI$_3$ crystal absorbs the light efficiently up to 900 nm, which is 80 nm broader than its polycrystalline counterpart (FIG. 4.9). A Tauc plot shows that the bandgap of α-FAPbI$_3$ is 1.4 eV; this value is 70 meV narrower than previous reports for this material.[30,44] Analogously, the absorption edge of FAPbBr$_3$ was found to be located at 580 nm, corresponding to a bandgap of 2.13 eV, 130 meV narrower than that of the FAPbBr$_3$ polycrystalline thin film (FIG. 4.9).[43] Narrowing of bandgap in MAPbX$_3$ single crystals compared to its polycrystalline films was also observed before, which was attributed to lower trap densities due to a higher-dimensional structurally coherent units that are more tight in the single crystal compared to their polycrystalline counterparts.[5,19,36] Hence, single crystals provide the ideal platform to extract the real bandgap. For the best of our knowledge, this is the first demonstration of 1.4 eV bandgap of α-FAPbI$_3$. Our findings indicate that devices based upon α-FAPbI$_3$ crystals may deliver higher efficiencies than their polycrystalline thin films owing to their broader absorption of solar spectrum.

In summary, we demonstrated the temperature-dependent solubility of hybrid organolead halide perovskites. We showed that the retrograde behavior and ITC is not limited to MAPbX$_3$ perovskites but could be generalized, by solvent selection, to FAPbX$_3$. Grown crystals of FAPbI$_3$ exhibited a 1.4 eV bandgap, which was significantly lower than that of their polycrystalline counterpart. These findings provide an additional impetus to improve the crystallinity of FAPbI$_3$ for further enhancements in solar cell efficiencies.

Experimental Procedure:
Chemicals and Reagents
Lead bromide (≥98%), lead iodide (99.999% trace metal basis), DMF (anhydrous, 99.8%) and GBL (≥99%) were purchased from Sigma Aldrich. MAX and FAX were purchased from Dyesol Limited (Australia). All salts and solvents were used as received, without any further purification.
Synthesis of FAPBX$_3$ Single Crystals
Formamidinium Lead Iodide:
0.8 M solution of FAPbI$_3$ was prepared in GBL and filtered using PTFE filters with a 0.2-μm pore size. 2 ml of the filtrate was placed in a 4-ml vial, and the vial was placed in an oil bath, at 80° C. Then temperature was gradually increased to 115° C. and kept for 3 h. To further increase the crystal size, the setup was kept at 117° C. for 1 h, and at 120° C. for another hour. The size of the crystal can be further increased through the gradual increase of temperature (FIGS. 4.7 and 4.8).
Formamidinium Lead Bromide:
1 M solution of FAPbBr$_3$ was prepared in DMF:GBL (1:1 v/v) and filtered using PTFE filters with a 0.2-μm pore size. 2 ml of the filtrate was placed in a 4-ml vial, and the vial was placed in an oil bath, at 40° C. Then temperature was gradually increased to 55° C. and kept for 3 h. To further increase the crystal size, the setup was kept at 57° C. for 1 h, and 60° C. for another hour. The size of the crystal can be further increased through the gradual increase of temperature.
All procedures were conducted under ambient conditions and a humidity of 55-57%.
Solubility Test
FAPbI$_3$ powder was obtained through grinding crystals prepared by inverse temperature crystallization discussed above. 3 ml of GBL was heated to required temperature while stirring and we started adding small amount of perovskite powder, 0.05 g by 0.05 g. Saturation conditions were assumed when the amount of solute did not completely dissolve within 30 minutes after being dropped into the solution. This process was repeated at different temperatures. The error bar is ±0.05 g.
The same solubility test was performed for MAPbI$_3$.
In the case of bromide-based perovskites, the analogous procedure was performed, except DMF for MAPbBr$_3$, and DMF/GBL (1:0, 1:1 v/v) for FAPbBr$_3$ were used as solvents.
Measurement and Characterization
Powder X-ray diffraction was performed with a Bruker AXS D8 diffractometer using Cu-Kα radiation. The steady-state absorptions were recorded utilizing a Cary 6000i spectrophotometer with an integrating sphere. Scanning electron microscopy was performed on Quanta 600.

Further Description of Selected Figures

FIG. 4.8 shows FAPbBr$_3$ grown at 70° C. (left), 80° C. (center) and 90° C. (right) for 3 h. The bigger size crystal can be grown through increasing the temperature of crystallization. Note that the crystals are mosaic due to fast heating of solution. In order to get well-shaped crystals, the conditions described in the Synthesis section should be used.

FIG. 4.9A shows absorption of FAPbBr$_3$ polycrystalline film. FIG. 4.9B shows absorption of α-FAPbI$_3$ polycrystalline film. Insets are the picture of the film and Tauc plot to extract the bandgap. Polycrystalline films were prepared in accordance to the reported method (G. E. Eperon, S. D. Stranks, C. Menelaou, M. B. Johnston, L. M. Herz and H. J. Snaith, *Energ. Environ. Sc.*, 2014, 7, 982-988). Briefly, 0.88M FAPbX$_3$ in DMF was spin-coated at 2000 rpm for 40 s on a cleaned glass and annealed at 170° C. for 25 min in a nitrogen-filled glove-box. FAPbI$_3$ polycrystalline film first forms yellow phase, which gradually transforms to black phase during the annealing.

REFERENCES, EXAMPLE 4

1. A. Kojima, K. Teshima, Y. Shirai and T. Miyasaka, *J. Am. Chem. Soc.*, 2009, 131, 6050-6051.
2. J. H. Im, C. R. Lee, J. W. Lee, S. W. Park and N. G. Park, *Nanoscale*, 2011, 3, 4088-4093.
3. H. Yum, J. E. Moser, M. Gratzel and N. G. Park, *Sci. rep.*, 2012, 2, 591.
4. M. Zhang, H. Yu, M. Lyu, Q. Wang, J.-H. Yun and L. Wang, *Chem. Commun.*, 2014, 50, 11727-11730.
5. D. Shi, V. Adinolfi, R. Comin, M. Yuan, E. Alarousu, A. Buin, Y. Chen, S. Hoogland, A. Rothenberger, K. Katsiev, Y. Losovyj, X. Zhang, P. A. Dowben, O. F. Mohammed, E. H. Sargent and O. M. Bakr, *Science*, 2015, 347, 519-522.
6. N. Yantara, D. Sabba, Y. Fang, J. M. Kadro, T. Moehl, P. P. Boix, S. G. Mhaisalkar, M. Gratzel and C. Gratzel, *Chem. Commun.*, 2015, 51, 4603-4606.
7. G. Longo, L. Gil-Escrig, M. J. Degen, M. Sessolo and H. J. Bolink, *Chem. Commun.*, 2015, 51, 7376-7378.
8. X. Cui, K. Jiang, J.-H. Huang, X. Zhou, M. Su, S.-G. Li, Q.-Q. Zhang, L.-M. Yang and Y. Song, *Chem. Commun.*, 2014, 51, 1457-1460.
9. B. R. Sutherland, S. Hoogland, M. M. Adachi, P. Kanjanaboos, C. T. O. Wong, J. J. McDowell, J. Xu, O. Voznyy, Z. Ning, A. J. Houtepen and E. H. Sargent, *Adv. Mater.*, 2014, 27, 53-58.
10. M. Ibrahim Dar, M. Abdi-Jalebi, N. Arora, T. Moehl, M. Gratzel and M. K. Nazeeruddin, *Adv. Mater.*, 2015, DOI: 10.1002/adma.201503124.
11. W. Nie, H. Tsai, R. Asadpour, J.-C. Blancon, A. J. Neukirch, G. Gupta, J. J. Crochet, M. Chhowalla, S. Tretiak, M. A. Alam, H.-L. Wang and A. D. Motet, *Science*, 2015, 347, 522-525.
12. C. Eames, J. M. Frost, P. R. Barnes, B. C. O'Regan, A. Walsh and M. S. Islam, *Nat. Commun.*, 2015, 6, 7497.
13. N. J. Jeon, J. H. Noh, Y. C. Kim, W. S. Yang, S. Ryu and S. I. Seok, *Nat. Mater.*, 2014, 13, 897-903.
14. M. M. Lee, J. Teuscher, T. Miyasaka, T. N. Murakami and H. J. Snaith, *Science*, 2012, 338, 643-647.
15. D. Liu, J. Yang and T. L. Kelly, *J. Am. Chem. Soc.*, 2014, 136, 17116-17122.
16. J. Xu, A. Buin, A. H. Ip, W. Li, O. Voznyy, R. Comin, M. Yuan, S. Jeon, Z. Ning, J. J. McDowell, P. Kanjanaboos, J.-P. Sun, X. Lan, L. N. Quan, D. H. Kim, I. G. Hill, P. Maksymovych and E. H. Sargent, *Nat. Commun.*, 2015, 6, 7081.
17. A. H. Ip, L. N. Quan, M. M. Adachi, J. J. McDowell, J. Xu, D. H. Kim and E. H. Sargent, *Appl. Phys. Lett.*, 2015, 106, 143902.
18. B. R. Sutherland, A. K. Johnston, A. H. Ip, J. Xu, V. Adinolfi, P. Kanjanaboos and E. H. Sargent, *ACS Photonics*, 2015, 2, 1117-1123.
19. G. Maculan, A. D. Sheikh, A. L. Abdelhady, M. I. Saidaminov, M. A. Haque, B. Murali, E. Alarousu, O. F. Mohammed, T. Wu and O. M. Bakr, *J. Phys. Chem. Lett.*, 2015, 6, 3781-3786.
20. M. I. Saidaminov, V. Adinolfi, R. Comin, A. L. Abdelhady, W. Peng, I. Dursun, M. Yuan, S. Hoogland. E. H. Sargent and O. M. Bakr., *Nat. Commun.*, 2015, 6, 8724.
21. Z. K. Tan, R. S. Moghaddam, M. L. Lai, P. Docampo, R. Higler, F. Deschler, M. Price, A. Sadhanala, L. M. Pazos, D. Credgington, F. Hanusch, T. Bein, H. J. Snaith and R. H. Friend, *Nat. Nanotechnol.*, 2014, 9, 687-692.
22. H. Zhu, Y. Fu, F. Meng, X. Wu, Z. Gong, Q. Ding, M. V. Gustafsson, M. T. Trinh, S. Jin and X. Y. Zhu, *Nat. Mater.*, 2015, 14, 636-642.
23. S. Yakunin, M. Sytnyk, D. Kriegner, S. Shrestha, M. Richter, G. J. Matt, H. Azimi, C. J. Brabec, J. Stangl, M. V. Kovalenko and W. Heiss, *Nat. Photon*, 2015, 9, 444-449.
24. F. Li, Ch. Ma, H. Wang, W. Hu, W. Yu, A. D. Sheikh, T. Wu. *Nat. Commun.*, 2015, 6, 8238.
25. T. Baikie, N. S. Barrow, Y. Fang, P. J. Keenan, P. R. Slater, R. O. Piltz, M. Gutmann, S. G. Mhaisalkar and T. J. White, *J. Mater. Chem. A*, 2015, 3, 9298-9307.
26. J. Burschka, N. Pellet, S. J. Moon, R. Humphry-Baker, P. Gao, M. K. Nazeeruddin and M. Gratzel, *Nature*, 2013, 499, 316-319.
27. W. Shockley and H. J. Queisser, *J. Appl. Phys.*, 1961, 32, 510-519.
28. W. S. Yang, J. H. Noh, N. J. Jeon, Y. C. Kim, S. Ryu, J. Seo and S. I. Seok, *Science*, 2015, 348, 1234-1237.
29. J.-W. Lee, D.-J. Seol, A.-N. Cho and N.-G. Park, *Adv. Mater.*, 2014, 26, 4991-4998.
30. N. J. Jeon, J. H. Noh, W. S. Yang, Y. C. Kim, S. Ryu, J. Seo and S. I. Seok, *Nature*, 2015, 517, 476-480.
31. N. Pellet, P. Gao, G. Gregori, T. Y. Yang, M. K. Nazeeruddin, J. Maier and M. Gratzel, *Angew. Chem.*, 2014, 53, 3151-3157.
32. G. E. Eperon, S. D. Stranks, C. Menelaou, M. B. Johnston, L. M. Herz and H. J. Snaith, *Energ. Environ. Sc.*, 2014, 7, 982-988.
33. S. Wozny, M. Yang, A. M. Nardes, C. C. Mercado, S. Ferrere, M. O. Reese, W. Zhou and K. Zhu, *Chemistry of Materials*, 2015, DOI: 10.1021/acs.chemmater.5b01691.
34. S. Aharon, A. Dymshits, A. Rotem and L. Etgar, *J. Mater. Chem. A*, 2015, 3, 9171-9178.
35. M. Hu, L. Liu, A. Mei, Y. Yang, T. Liu and H. Han, *J. Mater. Chem. A*, 2014, 2, 17115-17121.
36. M. I. Saidaminov, A. L. Abdelhady, B. Murali, E. Alarousu, V. M. Burlakov, W. Peng, I. Dursun, L. Wang, Y. He, G. Maculan, A. Goriely, T. Wu, O. F. Mohammed and O. M. Bakr, *Nat. Commun.*, 2015, 6, 7586.
37. Y. Dang, Y. Liu, Y. Sun, D. Yuan, X. Liu, W. Lu, G. Liu, H. Xia and X. Tao, *Cryst Eng Comm.*, 2015, 17, 665-670.
38. T. Zhang, M. Yang, E. E. Benson, Z. Li, J. van de Lagemaat, J. M. Luther, Y. Yan, K. Zhu and Y. Zhao, *Chem. Commun.*, 2015, 51, 7820-7823.
39. J. M. Kadro, K. Nonomura, D. Gachet, M. Grätzel and A. Hagfeldt, *Sci. Rep.*, 2015, 5, 11654.
40. O. Söhnel and P. Novotný, Densities of Aqueous Solutions of Inorganic Substances, Elsevier, Amsterdam, 1985.
41. M. T. Weller, O. J. Weber, J. M. Frost and A. Walsh, *J. Phys. Chem. Let.* 2015, 6, 3209-3212.
42. J. S. Manser, B. Reid and P. V. Kamat, *J. Phys. Chem. C*, 2015, 119, 17065-17073.
43. F. C. Hanusch, E. Wiesenmayer, E. Mankel, A. Binek, P. Angloher, C. Fraunhofer, N. Giesbrecht, J. M. Feckl, W. Jaegermann, D. Johrendt, T. Bein and P. Docampo, *J. Phys. Chem. Lett.*, 2014, 5, 2791-2795.
44. T. M. Koh, K. Fu, Y. Fang, S. Chen, T. C. Sum, N. Mathews, S. G. Mhaisalkar, P. P. Boix and T. Baikie, *J. Phys. Chem. C*, 2014, 118, 16458-16462.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "about 'x' to about 'y'".

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

What is claimed is:

1. A single-phase crystal having a doped $AMX_3$ structure, wherein the dopant is a trivalent cation, wherein the crystal has a charge carrier lifetime that exceeds the charge carrier lifetime of a polycrystalline thin film comprising a corresponding $AMX_3$ structure and is made by:
   (1) dissolving a mixture of the trivalent cation, $MX_2$ and AX in a solvent, wherein A is selected from the group consisting of organic cations and inorganic cations, or a combination thereof, M is a divalent cation selected from the group consisting of Pb, Sn, Cu, Ni, Co, Fe, Mn, Pd, Cd, Ge, Cs, and Eu, and X is a halide; and
   (2) heating the mixture in the solvent to a temperature sufficient to form the doped $AMX_3$ crystal, wherein the temperature corresponds to the inverse temperature solubility for dissolved $AMX_3$.

2. The single-phase crystal of claim 1, wherein A is alkyl-ammonium, formamidinum (FA), 5-ammoniumvaleric acid, or Cesium.

3. The single-phase crystal of claim 1, wherein the doped $AMX_3$ structure comprises a perovskite selected from—the group consisting of $MAPbI_3$, $MAPbBr_3$, $FAPbBr_3$, $FAPbI_3$, $MAPbCl_3$, $FAPbCl_3$, $CsPbI_3$, $CsPbCl_3$, $CsPbBr_3$, $FASnI_3$, $FASnBr_3$, $FASnCl_3$, $MASnI_3$, $MASnBr_3$, and $MASnCl_3$, wherein MA is methylammonium and FA is formamidinum.

4. The single-phase crystal of claim 1, wherein the solvent is selected from the group consisting of N,N-dimethylformamide (DMF), dimethylsulfoxide (DMSO), gamma-butyrolactone (GBL), dichlorobenzene (DCB), and toluene, or a combination thereof.

5. The single-phase crystal of claim 1, wherein the doped $AMX_3$ structure is a bismuth-doped $MAPbBr_3$ perovskite structure and the solvent is DMF, DMSO, or a combination thereof.

6. The single-phase crystal of claim 1, wherein the $AMX_3$ structure is a bismuth-doped $MAPbI_3$ perovskite structure and the solvent is GBL, DMF, or a combination thereof.

7. The single-phase crystal of claim 1, wherein equimolar amounts of $MX_2$ and AX are dissolved in the solvent.

8. The single-phase crystal of claim 1, having a thickness of less than 3 mm.

9. The single-phase crystal of claim 8, having a length, width or diameter of about 1 mm to 10 mm.

10. An optoelectronic device comprising the single-phase crystal of claim 1, wherein the device is selected from the group consisting of solar cells, solar panels, light emitting diodes, photodetectors, x-ray detectors, and ambipolar photototransistors.

11. The optoelectronic device of claim 10, wherein the device is a photodetector comprising a top electrode deposited on a side of the crystal and a bottom electrode deposited on a side of the crystal opposing the top electrode.

12. The optoelectronic device of claim 11, wherein at least one of top electrode and bottom electrode comprises gold.

13. The optoelectronic device of claim 11, wherein the top electrode comprises platinum and the bottom electrode comprises titanium.

14. The optoelectronic device of claim 11, wherein the doped $AMX_3$ structure of the crystal is a bismuth-doped $MAPbBr_3$, bismuth-doped $MAPbI_3$, or bismuth-doped $MAPbCl_3$ perovskite structure.

15. The single-phase crystal of claim 1, wherein the trivalent cation is $Au^{3+}$, $Bi^{3+}$, or $In^{3+}$.

16. The single-phase crystal of claim 1, wherein M is Pb and the mixture comprises the trivalent cation dopant at an atomic % of 0.0001-5.

17. A single-phase crystal having a doped $AMX_3$ structure, wherein the dopant is a trivalent cation, wherein A is selected from the group consisting of organic cations and inorganic cations, or a combination thereof, M is a divalent cation selected from the group consisting of Pb, Sn, Cu, Ni, Co, Fe, Mn, Pd, Cd, Ge, Cs, and Eu, and X is a halide.

18. The single-phase crystal of claim 17, wherein A is alkyl-ammonium, formamidinum (FA), 5-ammoniumvaleric acid, or Cesium.

19. The single-phase crystal of claim 18, wherein the trivalent cation is $Au^{3+}$, $Bi^{3+}$, or $In^{3+}$.

20. The single-phase crystal of claim 19, wherein the trivalent cation is $Bi^{3+}$, A is methylammonium, M is Pb, X is Br, and wherein the crystal comprises $4 \times 10^{17}$ to $2 \times 10^{19}$ Bi atoms per cubic centimeter.

* * * * *